(12) United States Patent
Sun et al.

(10) Patent No.: US 11,488,647 B2
(45) Date of Patent: Nov. 1, 2022

(54) STACKED MAGNETORESISTIVE STRUCTURES AND METHODS THEREFOR

(71) Applicant: Everspin Technologies, Inc., Chandler, AZ (US)

(72) Inventors: Jijun Sun, Chandler, AZ (US); Frederick Mancoff, Chandler, AZ (US); Jason Janesky, Gilbert, AZ (US); Kevin Conley, Los Gatos, CA (US); Lu Hui, Chandler, AZ (US); Sumio Ikegawa, Phoenix, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 17/255,915

(22) PCT Filed: Jun. 27, 2019

(86) PCT No.: PCT/US2019/039420
§ 371 (c)(1),
(2) Date: Dec. 23, 2020

(87) PCT Pub. No.: WO2020/006180
PCT Pub. Date: Jan. 2, 2020

(65) Prior Publication Data
US 2021/0375342 A1    Dec. 2, 2021

Related U.S. Application Data

(60) Provisional application No. 62/691,296, filed on Jun. 28, 2018, provisional application No. 62/691,334, filed on Jun. 28, 2018.

(51) Int. Cl.
*G11C 11/16* (2006.01)
*H01L 27/22* (2006.01)
(Continued)

(52) U.S. Cl.
CPC ........ *G11C 11/161* (2013.01); *G11C 11/1673* (2013.01); *G11C 11/1675* (2013.01);
(Continued)

(58) Field of Classification Search
CPC .............. G11C 11/161; G11C 11/1673; G11C 11/1675; G11C 2211/5615;
(Continued)

(56) References Cited

U.S. PATENT DOCUMENTS 6,937,497 B1 * 8/2005 Ju ........................... G11C 11/16
365/171
8,686,484 B2 * 4/2014 Whig ..................... H01L 43/12
257/295

(Continued)

OTHER PUBLICATIONS

International Search Report and Written Opinion of International Searching Authority, dated Sep. 27, 2019 14 pages.

*Primary Examiner* — Michael T Tran
(74) *Attorney, Agent, or Firm* — Bookoff McAndrews, PLLC

(57) ABSTRACT

Aspects of the present disclosure are directed to magnetic tunnel junction (MTJ) structures comprising multiple MTJ bits connected in series. For example, a magnetic tunnel junction (MTJ) stack according to the present disclosure may include at least a first MTJ bit and a second MTJ bit stacked above the first MTJ bit, and a resistance state of the MTJ stack may be read by passing a single read current through both the first MTJ bit and the second MTJ bit.

16 Claims, 32 Drawing Sheets

(51) Int. Cl.
*H01L 43/02* (2006.01)
*H01L 43/12* (2006.01)

(52) U.S. Cl.
CPC ............ *H01L 27/224* (2013.01); *H01L 43/02* (2013.01); *H01L 43/12* (2013.01)

(58) Field of Classification Search
CPC ......... G11C 2211/5622; G11C 11/5607; H01L 27/224; H01L 43/02; H01L 43/12
USPC .................................................. 365/158, 173
See application file for complete search history.

(56) References Cited

U.S. PATENT DOCUMENTS

| | | | |
|---|---|---|---|
| 8,747,680 B1 | 6/2014 | Deshpande et al. | |
| 8,923,041 B2 | 12/2014 | Andre et al. | |
| 9,023,216 B2 | 5/2015 | Kochergin et al. | |
| 9,111,622 B2 | 8/2015 | Subramanian et al. | |
| 9,136,464 B1 | 9/2015 | Whig et al. | |
| 9,293,182 B2 | 3/2016 | Houssameddine | |
| 9,419,208 B2 | 8/2016 | Whig et al. | |
| 9,472,256 B1 | 10/2016 | Andre | |
| 9,590,010 B1* | 3/2017 | Gottwald | H01L 27/228 |
| 9,761,793 B1* | 9/2017 | Kim | H01L 43/08 |
| 10,270,027 B1* | 4/2019 | Gajek | G11C 11/161 |
| 2006/0176734 A1* | 8/2006 | Braun | H01L 43/12 |
| | | | 365/171 |
| 2006/0202244 A1* | 9/2006 | Ju | H01L 27/228 |
| | | | 257/E27.005 |
| 2007/0171694 A1* | 7/2007 | Huai | G11C 11/1673 |
| | | | 257/E43.004 |
| 2007/0183187 A1* | 8/2007 | Guo | H01F 41/302 |
| | | | 365/158 |
| 2008/0246104 A1* | 10/2008 | Ranjan | H01L 43/10 |
| | | | 257/E29.323 |
| 2009/0218645 A1* | 9/2009 | Ranjan | G11C 11/5607 |
| | | | 257/E29.323 |
| 2009/0257274 A1 | 10/2009 | Itagaki et al. | |
| 2010/0072524 A1* | 3/2010 | Huai | B82Y 25/00 |
| | | | 257/295 |
| 2013/0182498 A1 | 7/2013 | Aoki | |
| 2014/0050019 A1 | 2/2014 | Lee et al. | |
| 2016/0163964 A1* | 6/2016 | Whig | G11C 11/161 |
| | | | 257/421 |
| 2016/0379698 A1* | 12/2016 | Saida | H01F 10/3286 |
| | | | 365/158 |
| 2018/0122825 A1* | 5/2018 | Lupino | G11C 11/16 |
| 2018/0158498 A1 | 6/2018 | Aggarwal et al. | |
| 2018/0358542 A1* | 12/2018 | Mihajlovic | G11C 11/1659 |
| 2019/0051815 A1* | 2/2019 | Kakinuma | H01F 10/3254 |
| 2019/0131519 A1 | 5/2019 | Ikegawa et al. | |
| 2019/0140167 A1 | 5/2019 | Aggarwal et al. | |
| 2019/0157549 A1 | 5/2019 | Sun | |
| 2019/0165253 A1* | 5/2019 | Sun | H01L 27/228 |
| 2019/0173004 A1 | 6/2019 | Deshpande et al. | |
| 2019/0207091 A1* | 7/2019 | Kardasz | H01L 27/222 |
| 2019/0259810 A1* | 8/2019 | Jacob | H01L 43/02 |
| 2019/0304526 A1* | 10/2019 | Honjo | G11C 11/1659 |
| 2020/0075072 A1* | 3/2020 | Nagase | G11C 11/1673 |
| 2021/0110857 A1* | 4/2021 | Endoh | H01L 27/228 |
| 2021/0384415 A1* | 12/2021 | Sun | H01L 43/08 |
| 2021/0390997 A1* | 12/2021 | Kim | G11C 11/1697 |
| 2022/0045267 A1* | 2/2022 | Guo | H01L 27/222 |

* cited by examiner

STATE 4 (AP, AP) TO
STATE 3 (P, AP)

STATE 3 (P, AP) TO
STATE 2 (AP, P)

STATE 4 (AP, AP) TO
STATE 2 (AP, P)

FIG. 18A
FIG. 18B
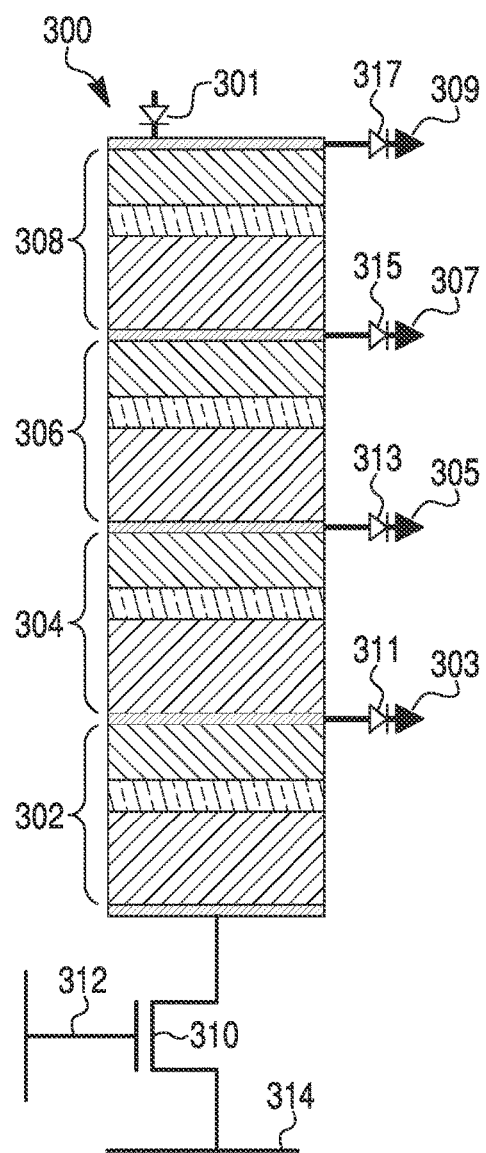
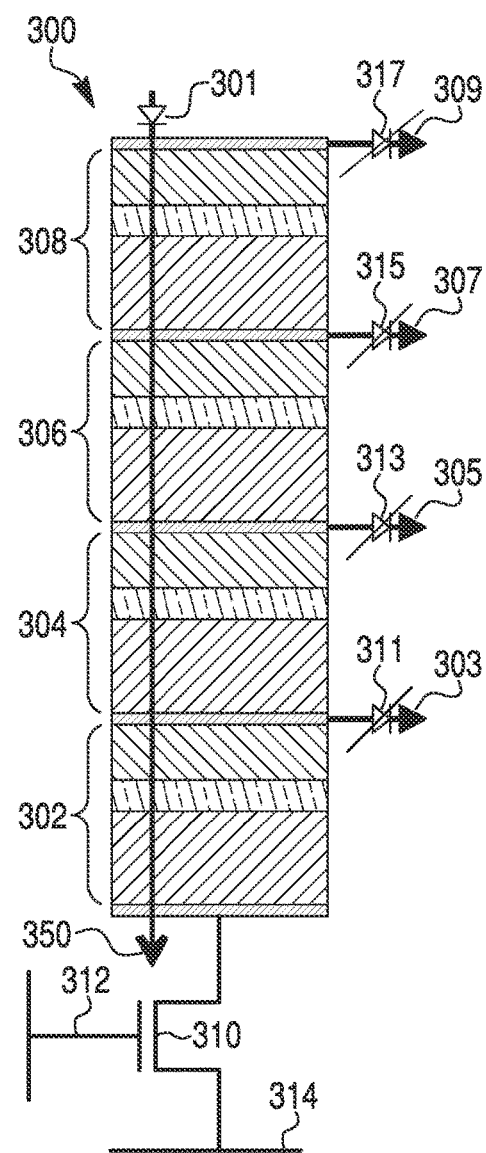

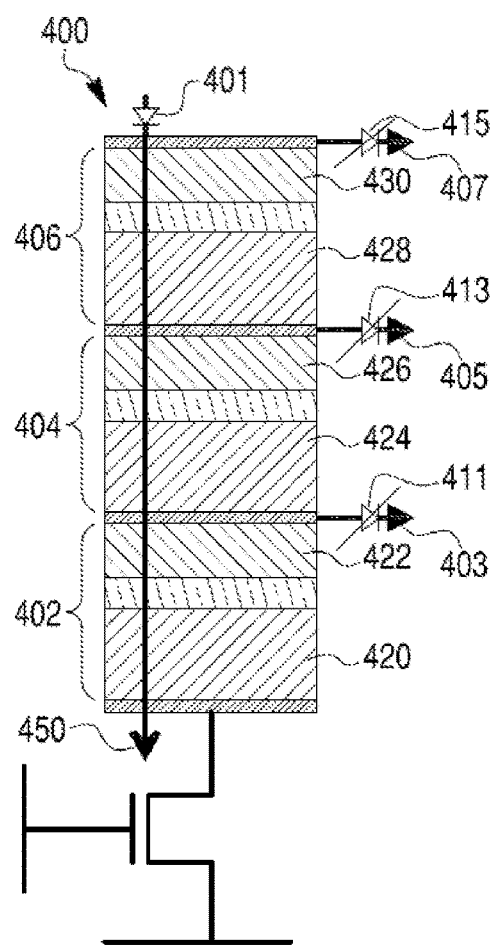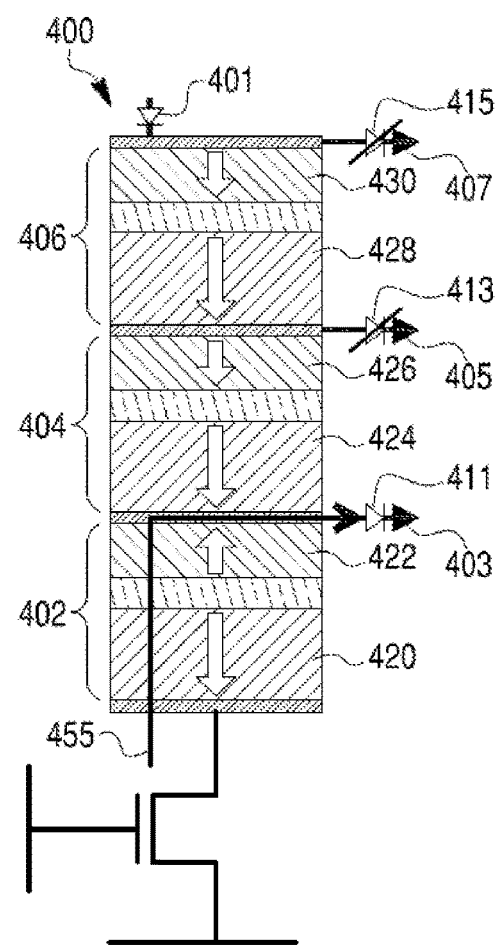

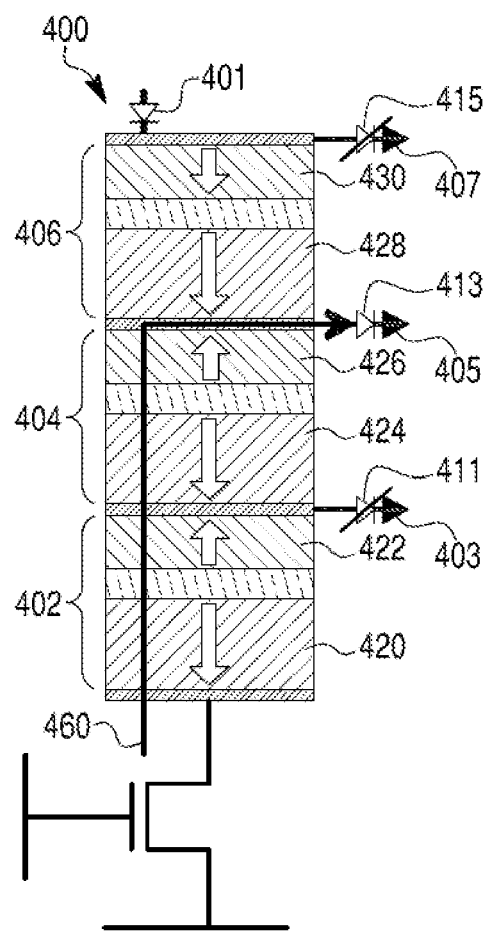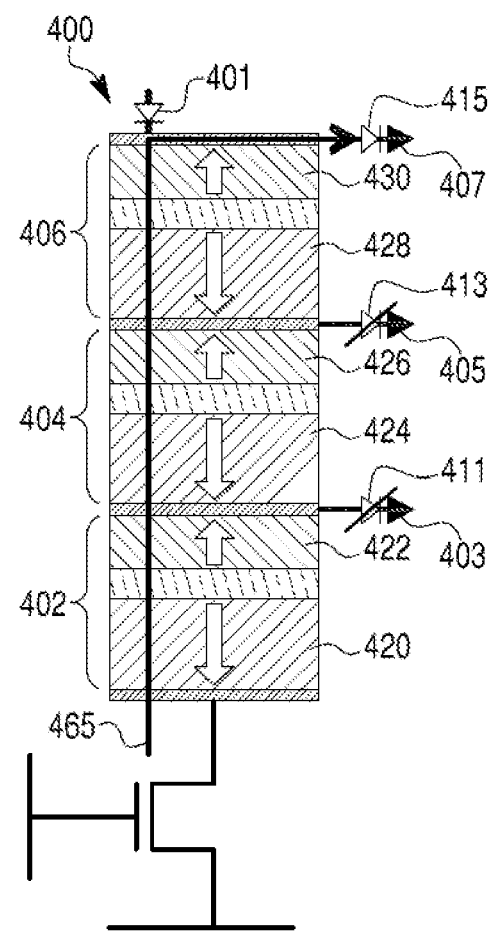

STACKED MAGNETORESISTIVE STRUCTURES AND METHODS THEREFOR

CROSS-REFERENCE TO RELATED APPLICATIONS

This patent application is the U.S. National Phase Entry under 35 U.S.C. § 371 of International Application No. PCT/US2019/039420, filed on Jun. 27, 2019. The International Application No. PCT/US2019/039420 claims priority to U.S. Provisional Patent Application No. 62/691,296, filed on Jun. 28, 2018, and U.S. Provisional Application No. 62/691,334, filed on Jun. 28, 2018, both of which are incorporated by reference herein in their entireties.

TECHNICAL FIELD

The present disclosure relates to, among other things, magnetoresistive stacks and structures, devices including the disclosed magnetoresistive stacks and structures, and methods for fabricating and using the disclosed magnetoresistive stacks and structures.

INTRODUCTION

There are many inventions described and illustrated herein, as well as many aspects and embodiments of those inventions. In one aspect, the present disclosure relates to magnetoresistive devices (e.g., a magnetoresistive memory device, a magnetoresistive sensor/transducer device, etc.) and methods of manufacturing and using the described magnetoresistive devices. An exemplary magnetoresistive bit (e.g., used in a magnetic tunnel junction (MTJ) magnetoresistive device) of the present disclosure includes a stack or structure that includes multiple layers or regions of material stacked one above the other. When used in a memory device (e.g., a magnetoresistive random access memory (MRAM)), the magnetoresistive bit includes at least one non-magnetic layer (e.g., an electrically non-conductive dielectric layer, or an electrically conductive yet non-magnetic layer) disposed between a "fixed" magnetic region and a "free" magnetic region. In some aspects, each of the "fixed" magnetic region and the "free" magnetic region may include one or more layers of ferromagnetic materials.

When used in a magnetoresistive memory device, information is stored in the magnetoresistive bit by switching, programming, and/or controlling the direction of magnetization vectors in the magnetic layer(s) of the "free" magnetic region. In contrast, the magnetization vectors in the magnetic layers of the "fixed" magnetic region are magnetically fixed in a predetermined direction. The direction of the magnetization vectors in the "free" magnetic region may be switched and/or programmed (e.g., through spin transfer torque (or STT) or through spin orbit torque (SOT)) by the application of a write signal (e.g., one or more current pulses) through the magnetoresistive bit. When the magnetization vectors of the "free" magnetic region are in the same direction as the magnetization vectors of the "fixed" magnetic region (e.g., a parallel orientation of magnetization vectors), the magnetoresistive bit has a first resistance (e.g., a relatively lower resistance, RMin). Conversely, when the magnetization vectors of the "free" magnetic region are opposite the direction of the magnetization vectors of the "fixed" magnetic region (e.g., an antiparallel orientation of magnetization vectors), the magnetoresistive bit has a second resistance (e.g., a relatively higher resistance, RMax).

The information stored in the magnetoresistive bit is determined or read by detecting the magnetic state of the magnetoresistive bit by passing a read current through the magnetoresistive bit to determine its resistance (e.g., (RMin or RMax).

Typical magnetoresistive devices include many magnetoresistive bits. For example, a magnetoresistive memory device (such as an MRAM) may include numerous magnetoresistive bits arranged in a planar array (e.g., in a two-dimensional array of columns and rows). By measuring the resistance of each bit, the data (e.g., the data state) stored in the memory array can be read. Typically, increasing the density of the magnetoresistive bits in a magnetoresistive device is desirable (e.g., to store more information in a reduced area). In some embodiments, the magnetoresistive devices of the current disclosure have a relatively higher density of magnetoresistive bits. The scope of the current disclosure, however, is defined by the attached claims, and not by any characteristics of the resulting device or method.

SUMMARY

Aspects of the present disclosure may be directed to, e.g., a magnetic tunnel junction (MTJ) stack, including a first MTJ bit, and a second MTJ bit stacked above the first MTJ bit, where a resistance state of the MTJ stack is configured to be read by passing a single read current through both the first MTJ bit and the second MTJ bit. In some embodiments, the first MTJ bit has a critical current different from a critical current of the second MTJ bit. In some embodiments, the MTJ stack further includes at least one additional MTJ bit stacked above the second MTJ bit, and each MTJ bit has a critical current different from a critical current of each other MTJ bit. In some embodiments, at least one of the first MTJ bit or the second MTJ bit has a dual spin filter configuration. In further embodiments, the first MTJ bit has a dual spin filter configuration, and the first MTJ bit has a lower critical current than a critical current of the second MTJ bit. In some embodiments, the MTJ stack includes a nonmagnetic region disposed between the first MTJ bit and the second MTJ bit. In some embodiments, a write current of the second MTJ bit is lower than a critical current of the first MTJ bit.

Additional aspects of the present disclosure are directed to an MTJ stack, including a plurality of vertically stacked MTJ bits configured to be read by a single read current, and each MTJ bit is separated from an adjacent MTJ bit by a nonmagnetic conductive region coupled to a diode. In some embodiments, each MTJ bit is approximately identical to each other MTJ bit. In some embodiments, a write current for each MTJ bit is approximately equal to a write current for each other MTJ bit. In some embodiments, the plurality of MTJ bits includes n MTJ bits, and wherein the MTJ stack has n+1 resistance states. In some embodiments, the plurality of vertically stacked MTJ bits includes at least three MTJ bits, and during a read operation, every diode but one is set to a high bias state. In some embodiments, during a write operation, a write current is configured to pass through a diode in a low bias state and at least one MTJ bit.

Additional aspects of the present disclosure are directed to a method of writing a resistance state to an MTJ stack including a plurality of stacked MTJ bits, the method including directing a current pattern through every MTJ bit in the MTJ stack, where the current pattern is configured to switch the MTJ stack from an initial resistance state to a desired resistance state. In some embodiments, the method further includes detecting the initial resistance state of the MTJ stack by applying a read current to the MTJ stack. In some embodiments, a write current for each MTJ bit has a magnitude different from a write current for each other MTJ bit, and the current pattern is configured to switch a resistance state of one MTJ bit without switching all MTJ bits. In some embodiments, the current pattern is configured to switch the MTJ stack to a desired resistance state regardless of the initial resistance state. In some embodiments, the current pattern is configured to switch a resistance state of one MTJ bit from antiparallel to parallel, and then from parallel to antiparallel. In some embodiments, a first MTJ bit of the plurality of stacked MTJ bits has a lower write current than a second MTJ bit of the plurality of stacked MTJ bits, and the current pattern is configured to switch a resistance state of the first MTJ bit after switching a resistance state of the second MTJ bit. In some embodiments, the MTJ stack includes at least three MTJ bits, and the method further includes detecting the initial resistance state of the MTJ stack by applying a read current to the MTJ stack, and selecting the current pattern based on the detected initial resistance state.

Additional aspects of the present disclosure are directed to a method of writing a resistance state to a magnetic tunnel junction (MTJ) stack including a plurality of stacked MTJ bits, the method including directing a first current through every MTJ bit in the MTJ stack to write an initial resistance state of the MTJ stack, and directing a second current through at least one MTJ bit in the MTJ stack to write the desired resistance state of the MTJ stack. In some embodiments, a write current for each MTJ bit in the MTJ stack is approximately equal to a write current for each other MTJ bit in the MTJ stack. In some embodiments, the second current passes through at least one diode in a low bias state. In some embodiments, the MTJ stack includes an electrode between each of the plurality of MTJ bits, and each electrode is coupled to a diode. In some embodiments, the method further includes switching a diode from a high bias state to a low bias state before directing a second current through at least one MTJ bit in the MTJ stack.

Additional aspects of the present disclosure are directed to a method of fabricating a magnetic tunnel junction (MTJ) device, the method including forming a first MTJ region by depositing a first plurality of layers over a substrate, and forming a second MTJ region above the first MTJ region by depositing a second plurality of layers over the first plurality of layers. In some embodiments, the method further includes forming a nonmagnetic region between the first MTJ region and the second MTJ region. In some embodiments, the method further includes forming a third MTJ region above the second MTJ region by depositing a third plurality of layers over the second plurality of layers. In some embodiments, the first plurality of layers is identical to the second plurality of layers. In some embodiments, the method further includes forming a conductive region between the first MTJ region and the second MTJ region; and coupling a bit line to the conductive region.

BRIEF DESCRIPTION OF THE DRAWINGS

Embodiments of the present disclosure may be implemented in connection with aspects illustrated in the attached drawings. These drawings show different aspects of the present inventions and, where appropriate, reference numerals illustrating like structures, components, materials and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure and/or manner of construction of the various embodiments described herein. For ease of illustration, the figures depict the different regions along the thickness of the illustrated stacks as a layer having well-defined boundaries with straight edges and/or sharp corners (e.g., depicted using lines). However, one skilled in the art would understand that, in reality, at an interface between adjacent regions or layers, the materials of these regions may alloy together, or migrate into one or the other material, and make their boundaries and corners ill-defined or diffuse. That is, although multiple layers with distinct interfaces are illustrated in the figures, in some cases, over time and/or exposure to high temperatures, materials of some of the layers may migrate into or interact with materials of other layers to present a more diffuse interface between these layers. Further, although the figures illustrate each region or layer as having a relatively uniform thickness across its width, one of ordinary skill in the art would recognize that, in reality, the different regions may have a non-uniform thickness (e.g., the thickness of a layer may vary along the width of the layer), and/or the thickness of one region or layer may differ relative to the thickness of another (e.g., adjacent) region or layer. Moreover, while certain regions/layers and features are illustrated with straight 90-degree edges, in reality, such regions/layers may be more "rounded" and/or gradually sloping.

There are many embodiments described and illustrated herein. The present disclosure is neither limited to any single aspect nor embodiment thereof, nor to any combinations and/or permutations of such aspects and/or embodiments. It should be noted that, even if it is not specifically mentioned, aspects described with reference to one embodiment may also be applicable to, and may be used with, other embodiments. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended to reflect or indicate the embodiment(s) is/are "example" embodiment(s). Further, even though the figures and this written disclosure appear to describe the disclosed structures in a particular order of construction (e.g., from bottom to top), it is understood that the depicted structures stacks may have a different order (e.g., the opposite order (i.e., from top to bottom)). For example, a "fixed" magnetic region may be formed on or above a "free" magnetic region or layer, which in turn may be formed on or above an insertion layer of the present disclosure.

In the figures and description, details of well-known features (e.g., interconnects, etc.) and manufacturing techniques (e.g., deposition techniques, etching techniques, etc.) may be omitted for the sake of brevity (and to avoid obscuring other features and details). Elements in the figures are not necessarily drawn to scale. The dimensions of some features may be exaggerated relative to other features to improve understanding of the exemplary embodiments. Cross-sectional views are simplifications provided to help illustrate the relative positioning of various regions/layers and to describe various processing steps. One skilled in the art would appreciate that the cross-sectional views are not drawn to scale and should not be viewed as representing proportional relationships between different regions/layers.

Figure 1:
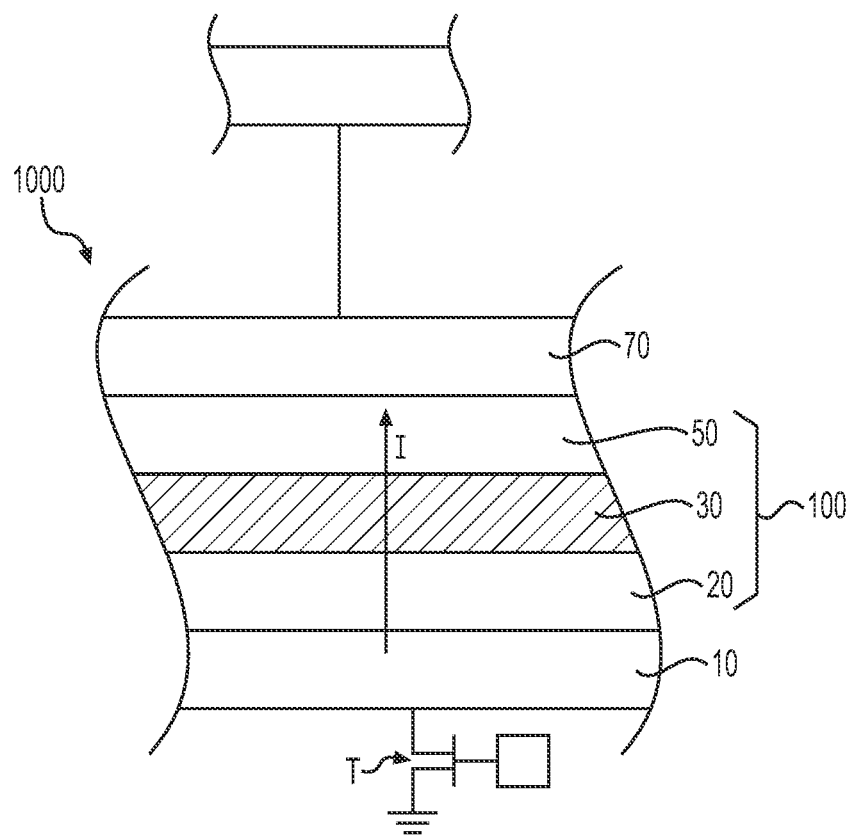
Figure 2:
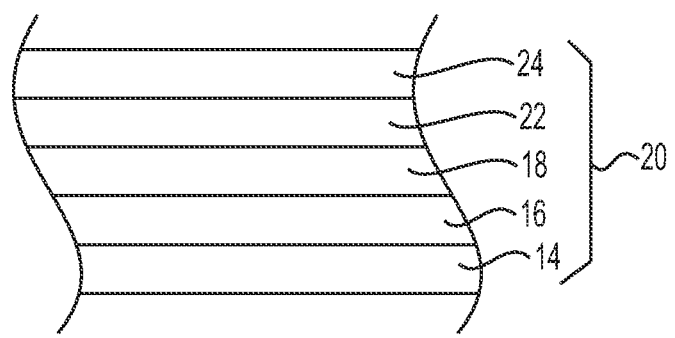
Figure 3:
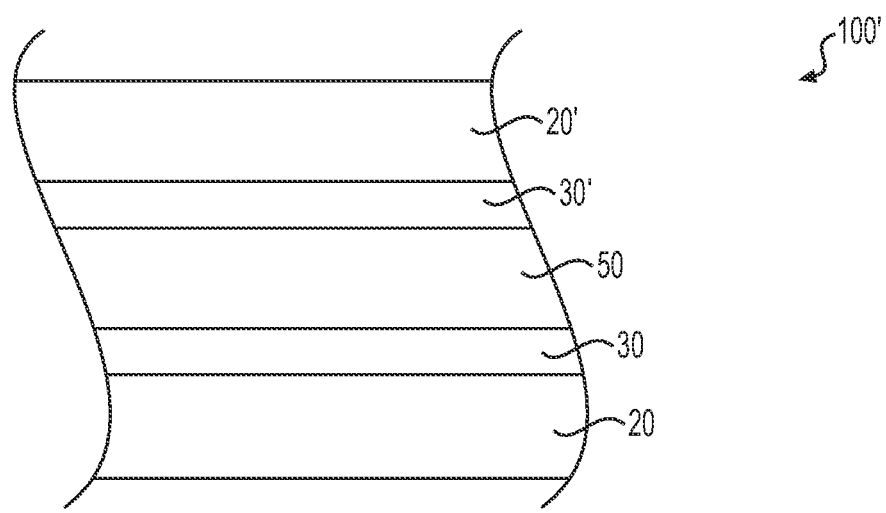
Figure 4A:
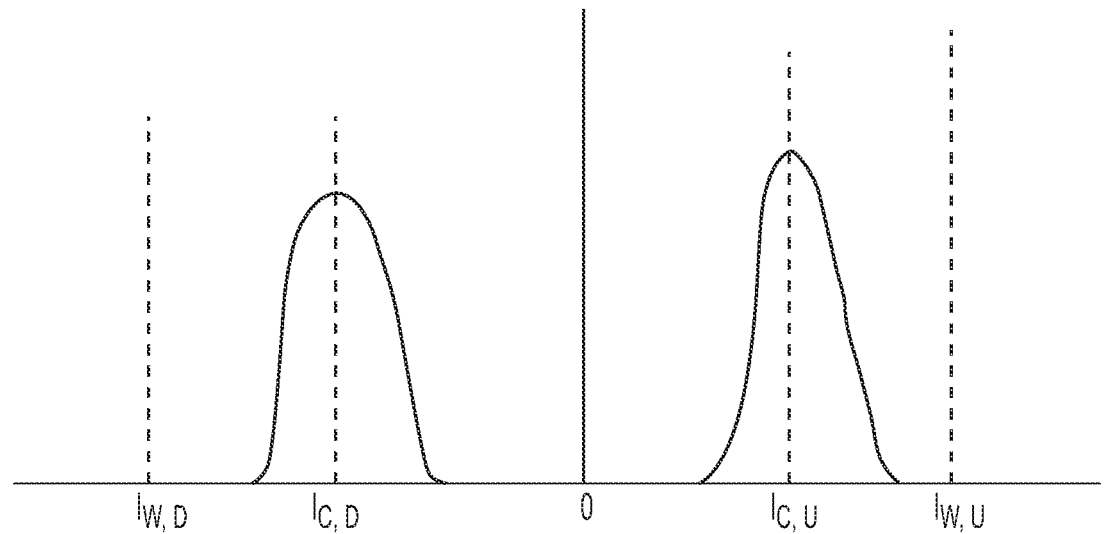
Figure 4B:
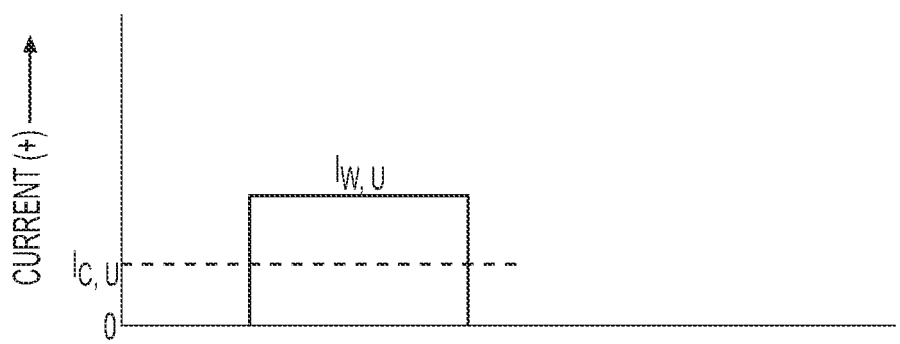
Figure 4C:
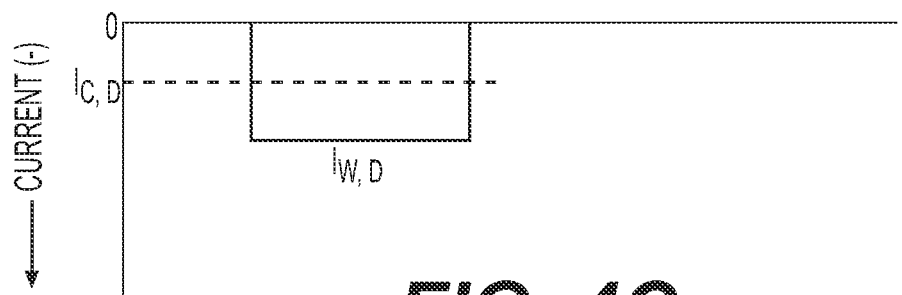
Figure 5A:
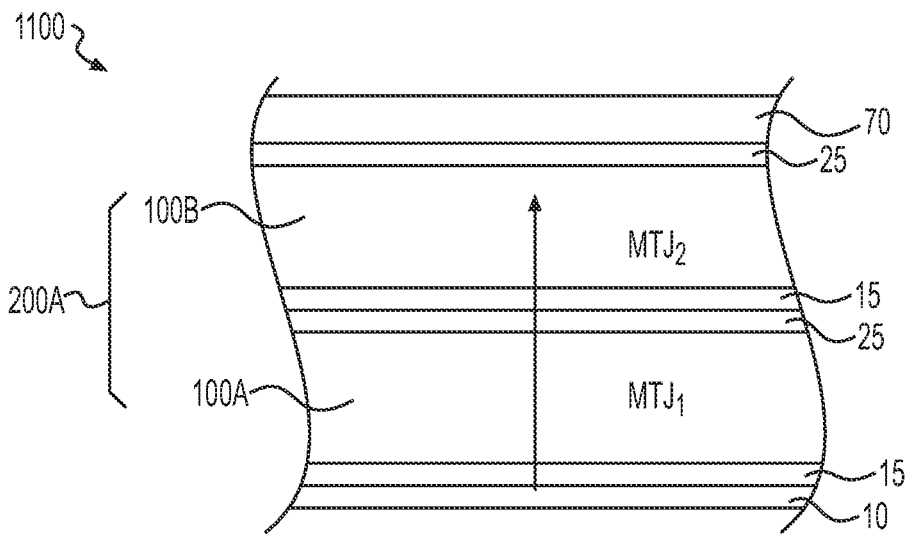
Figure 5B:
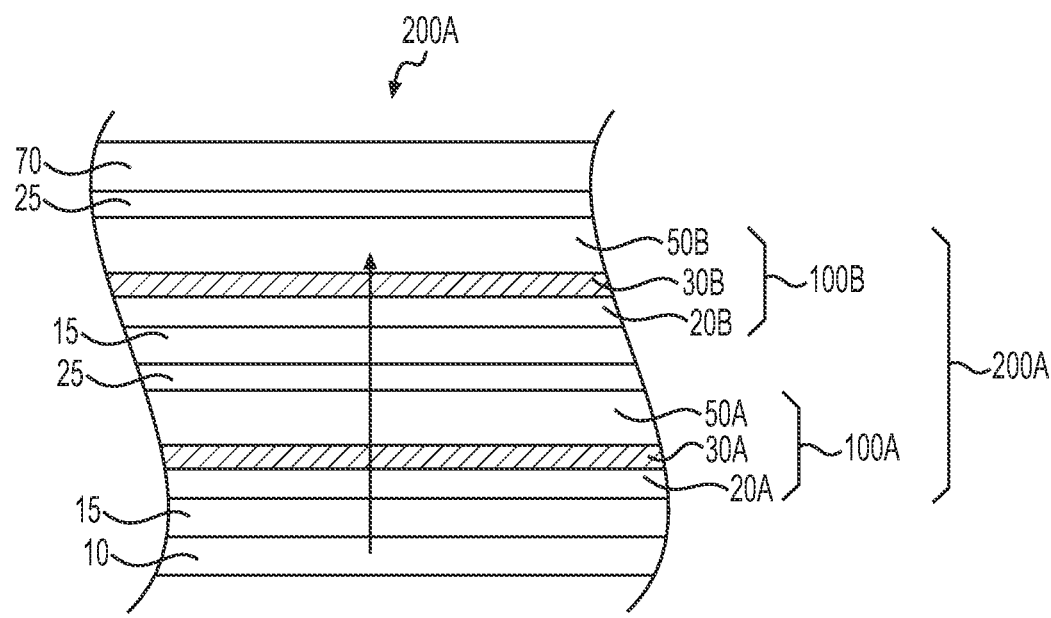
Figure 6A:
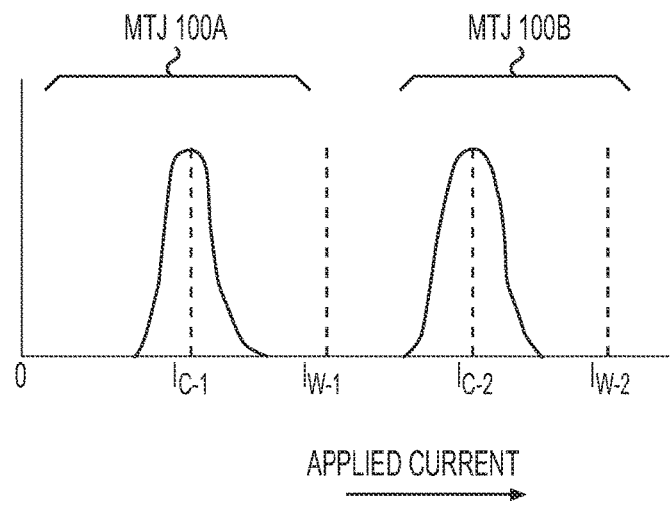
Figure 6B:
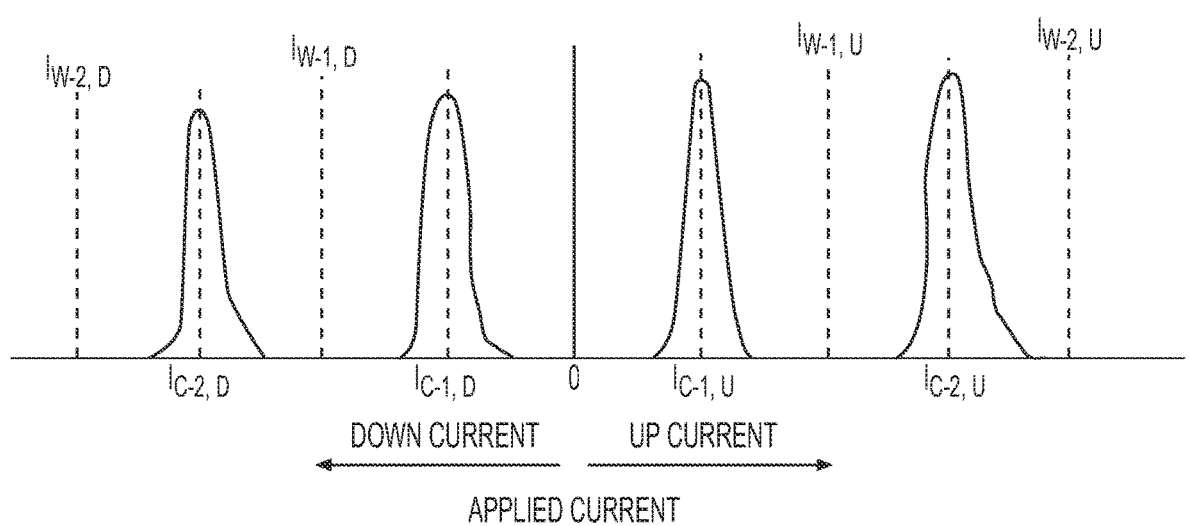
Figure 8A:
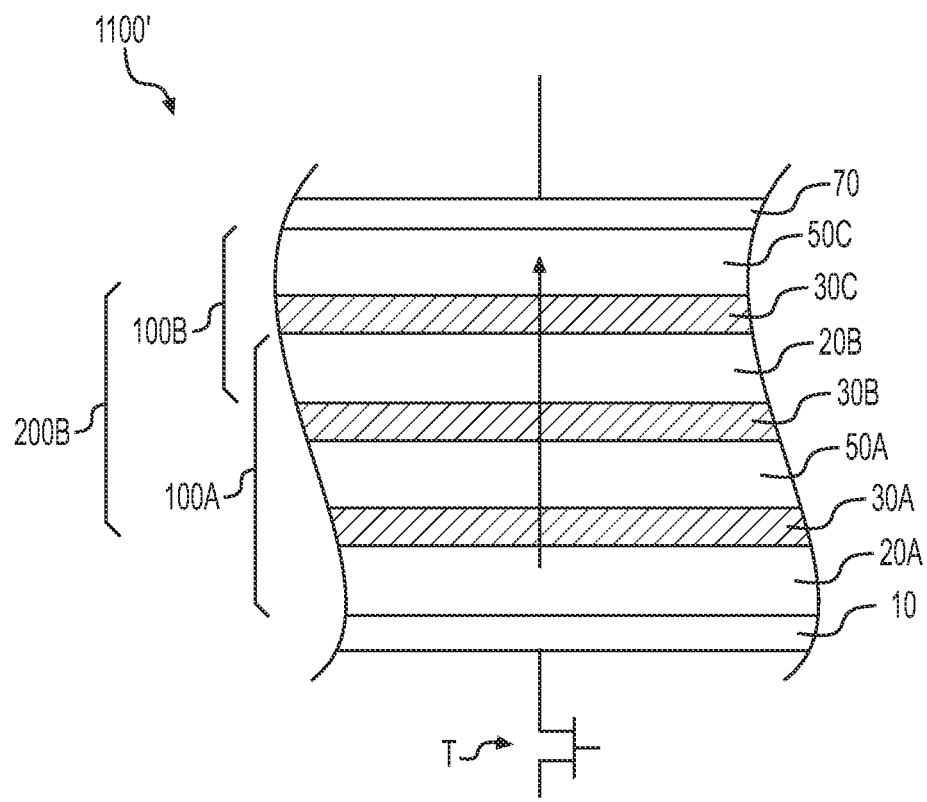
Figure 8B:
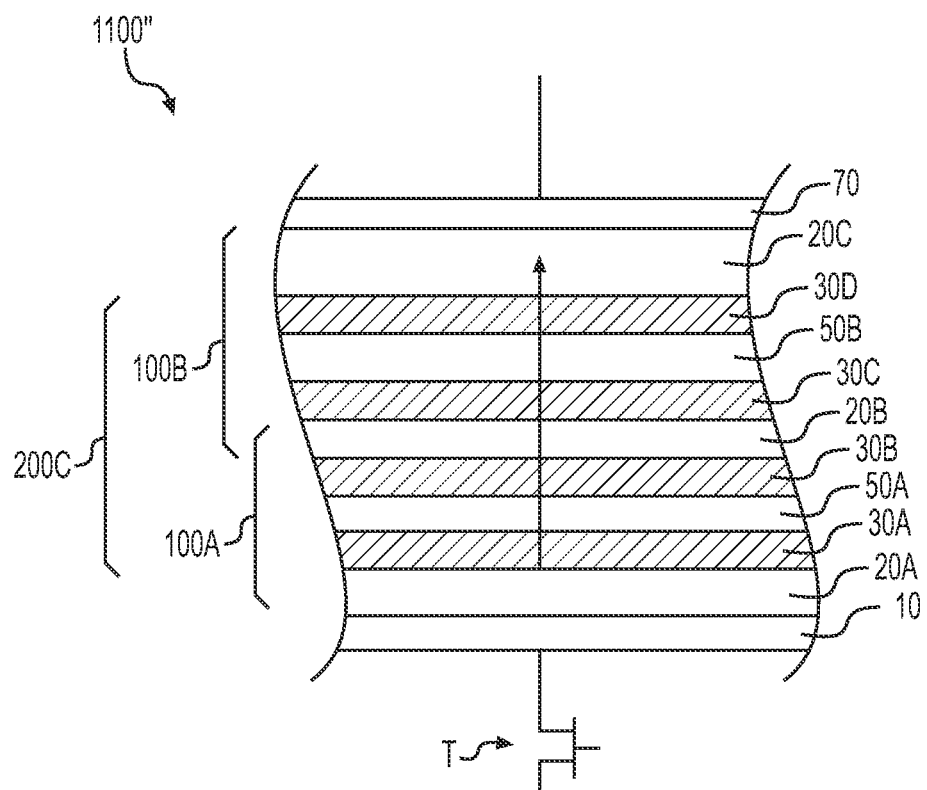
Figure 9A:
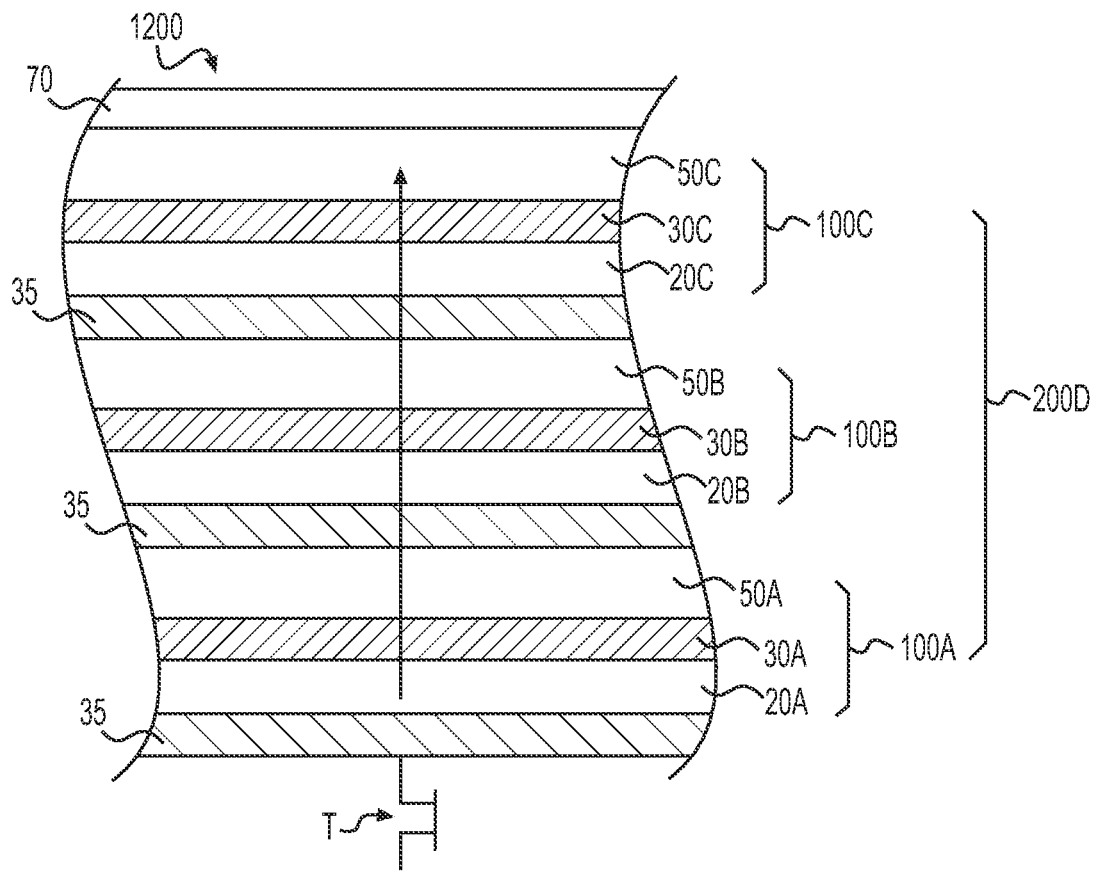
Figure 9B:
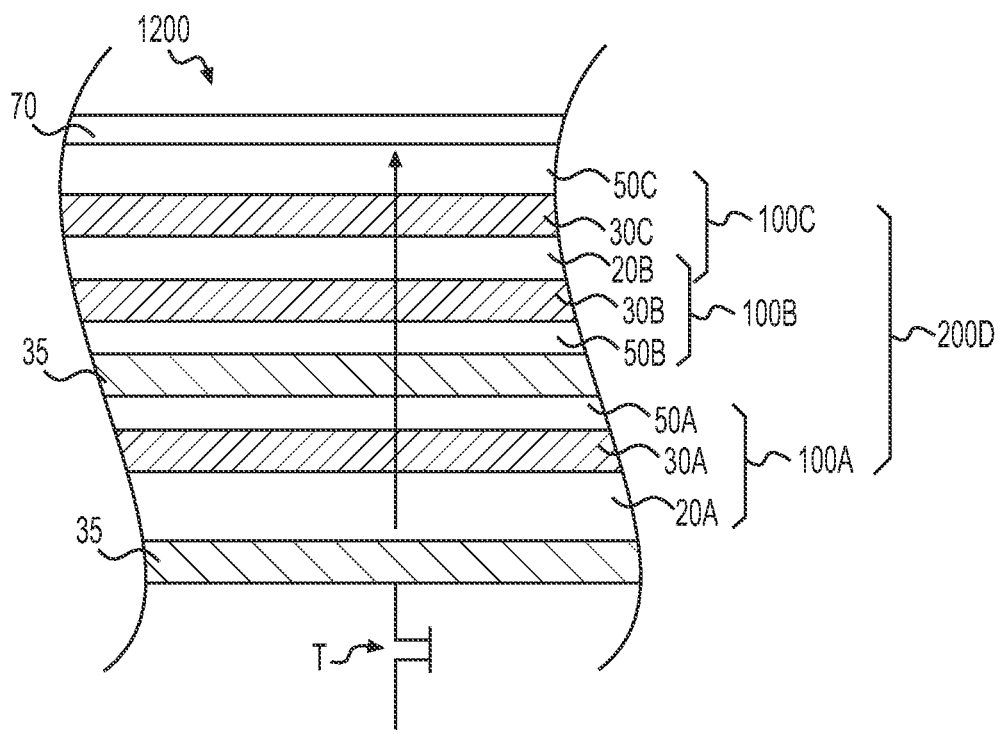
Figure 9C:
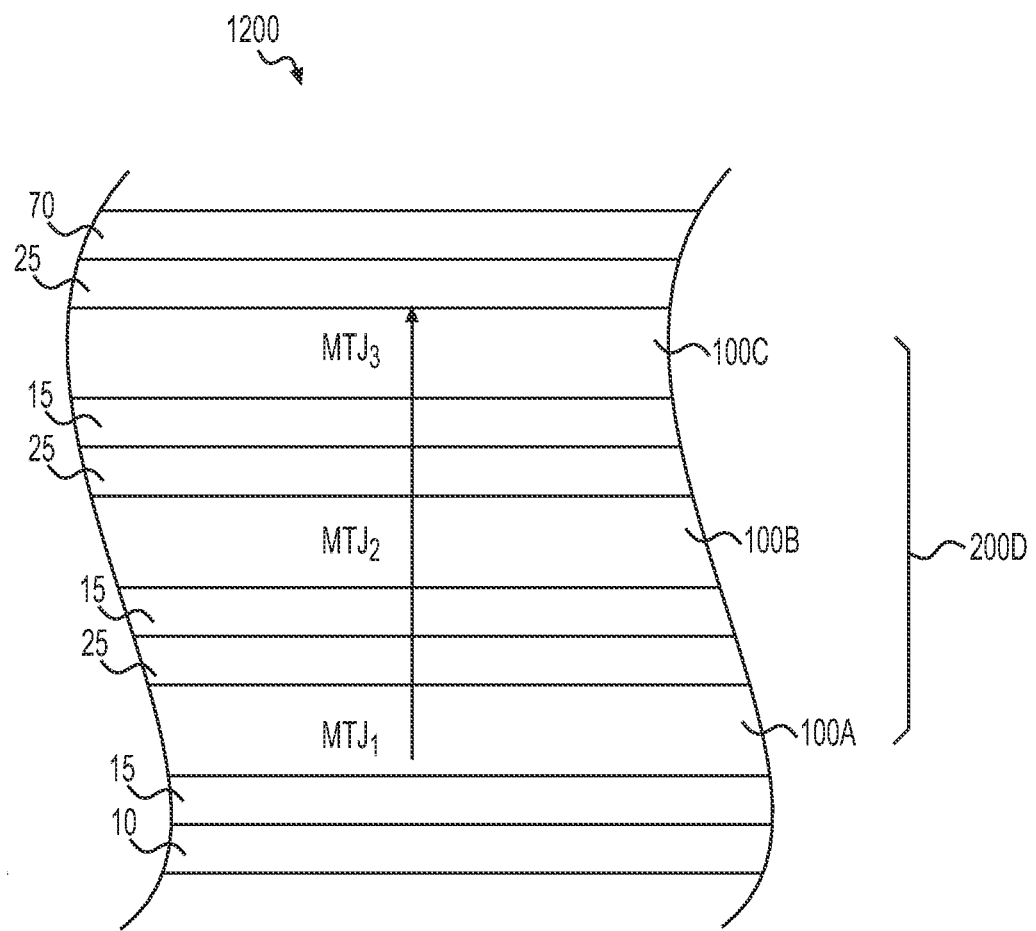
Figure 10:
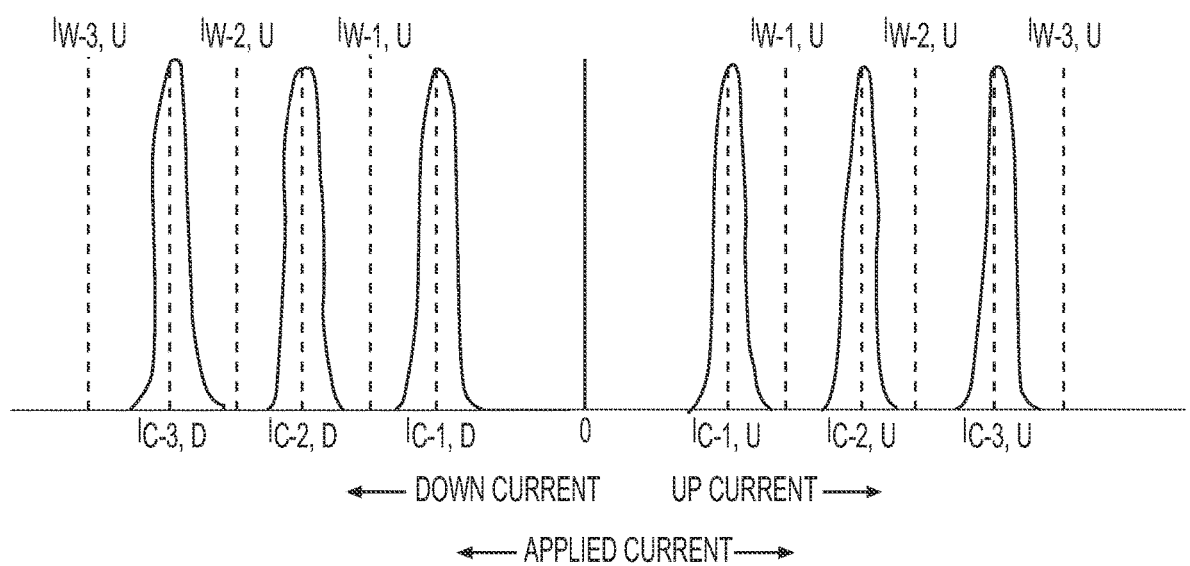
Figure 12A:
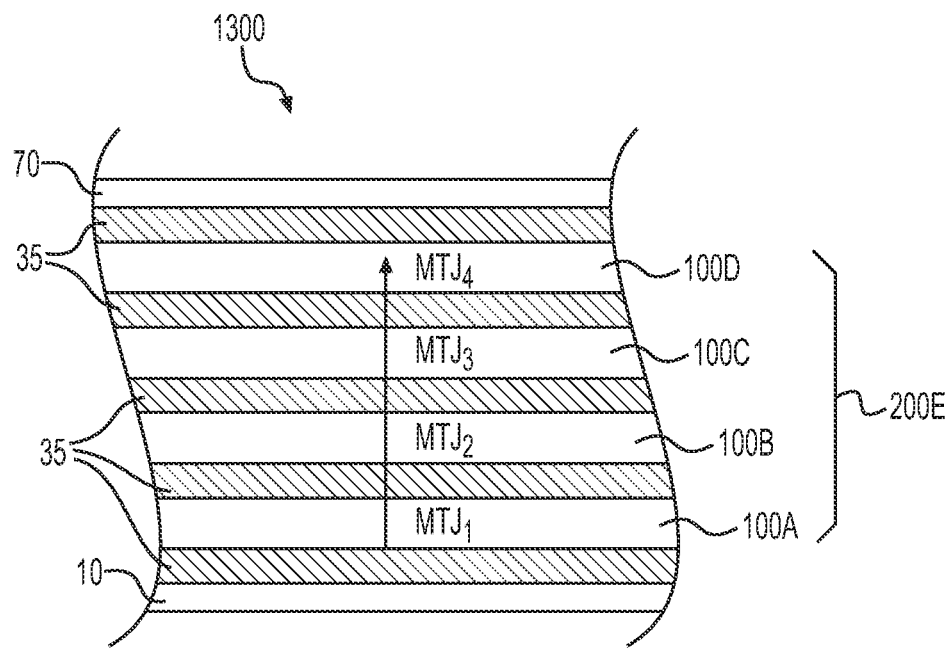
Figure 12B:
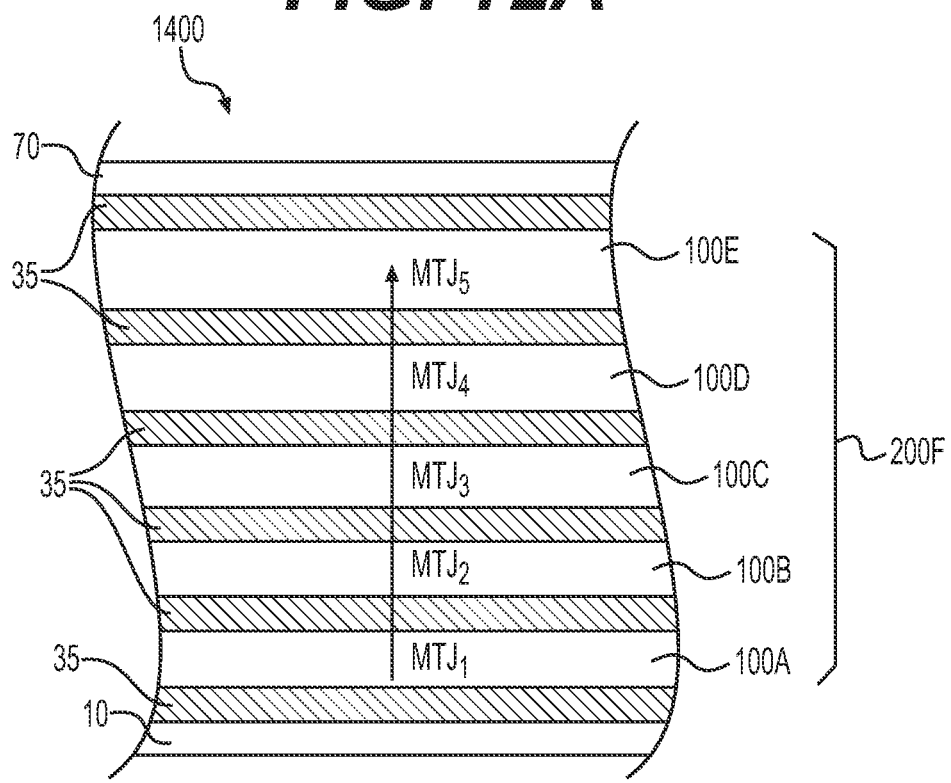
Figure 13:
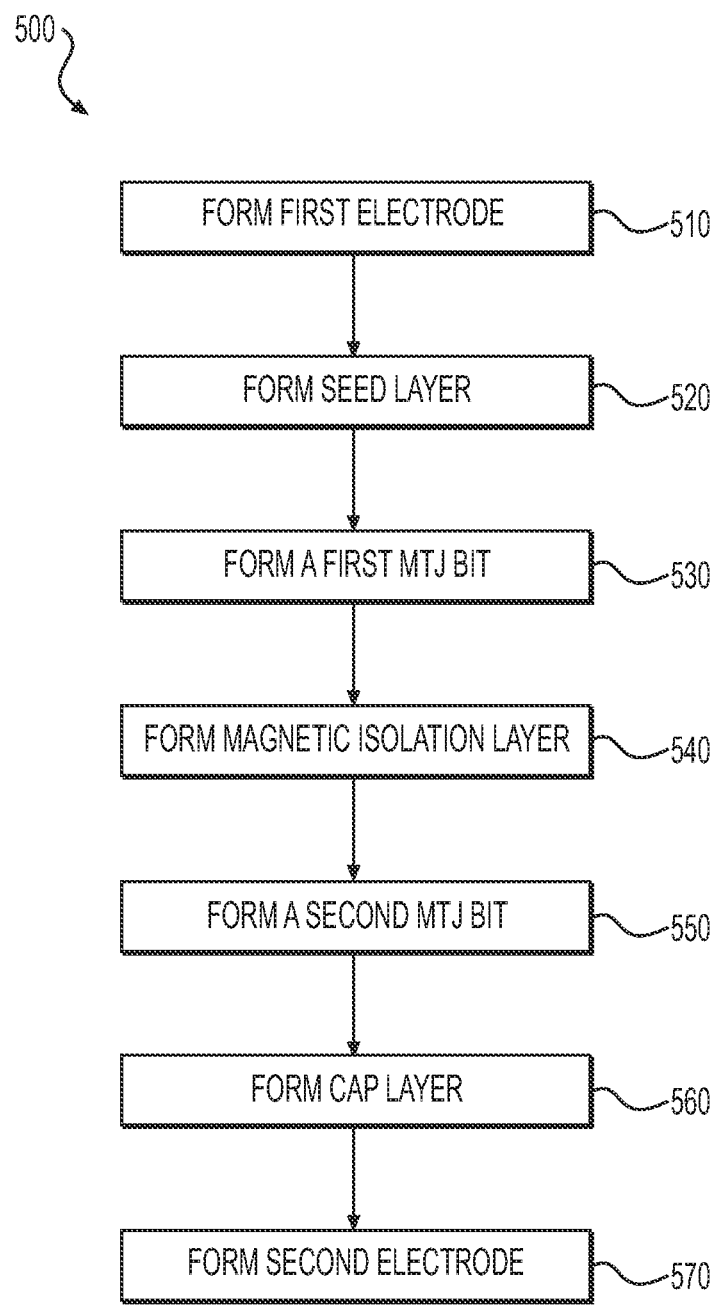
Figure 14:
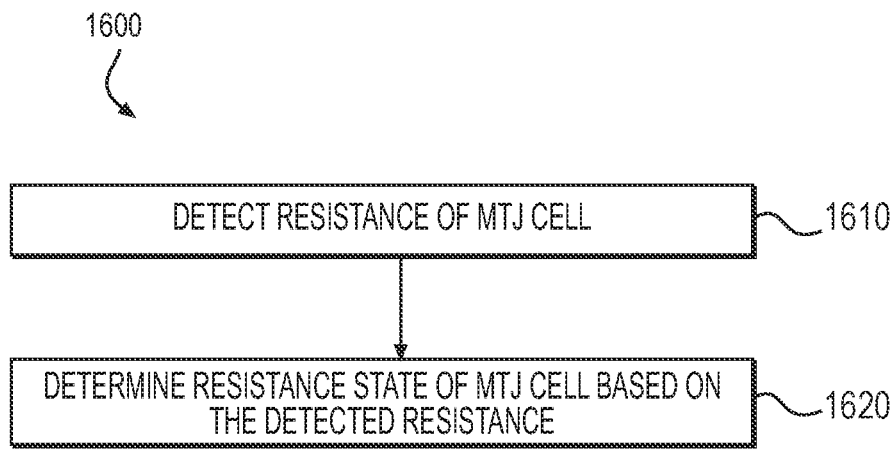
Figure 15:
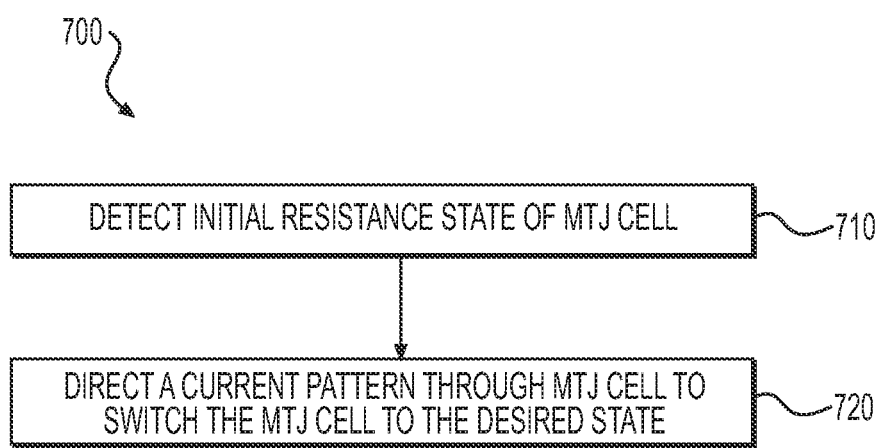
Figure 16:
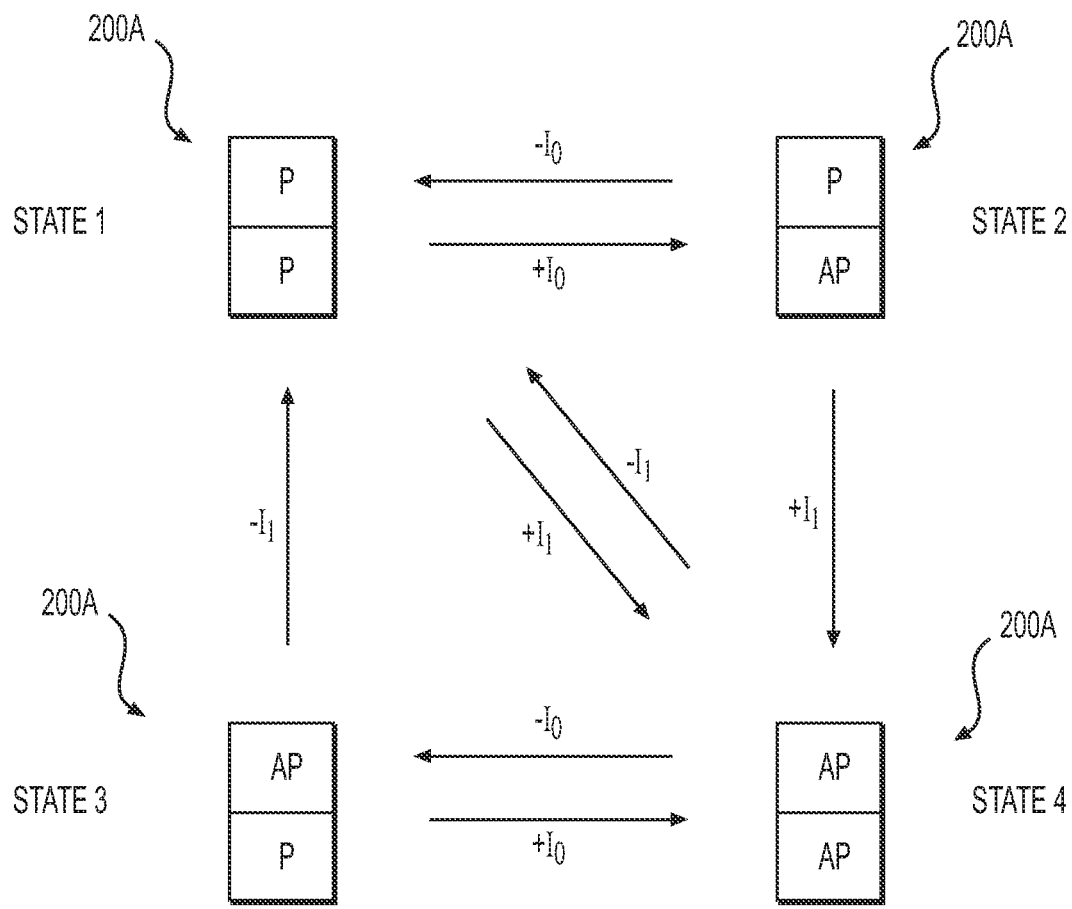
Figure 20:
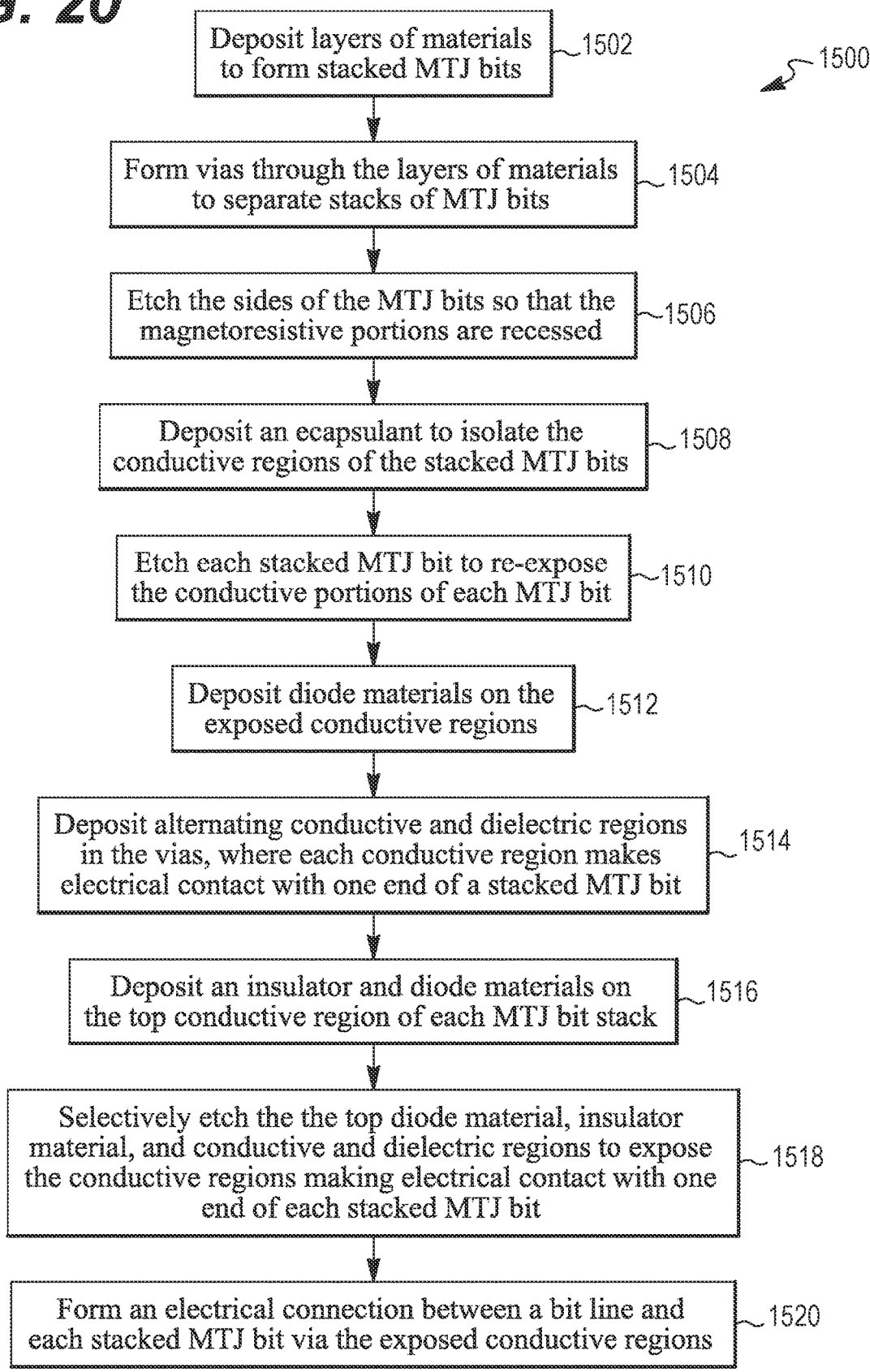
Figure 21A:
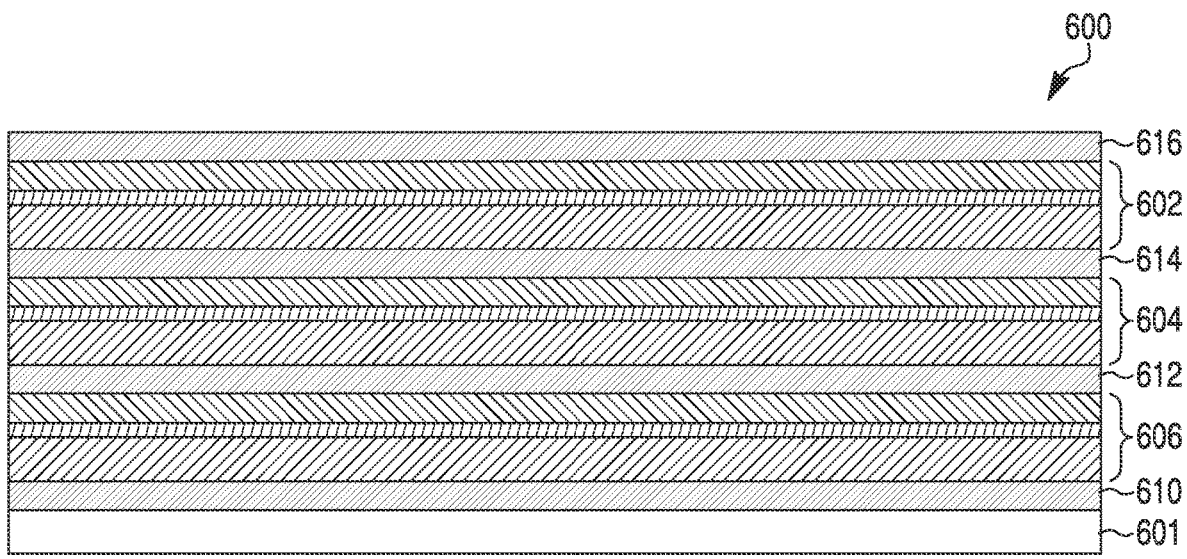
Figure 21B:
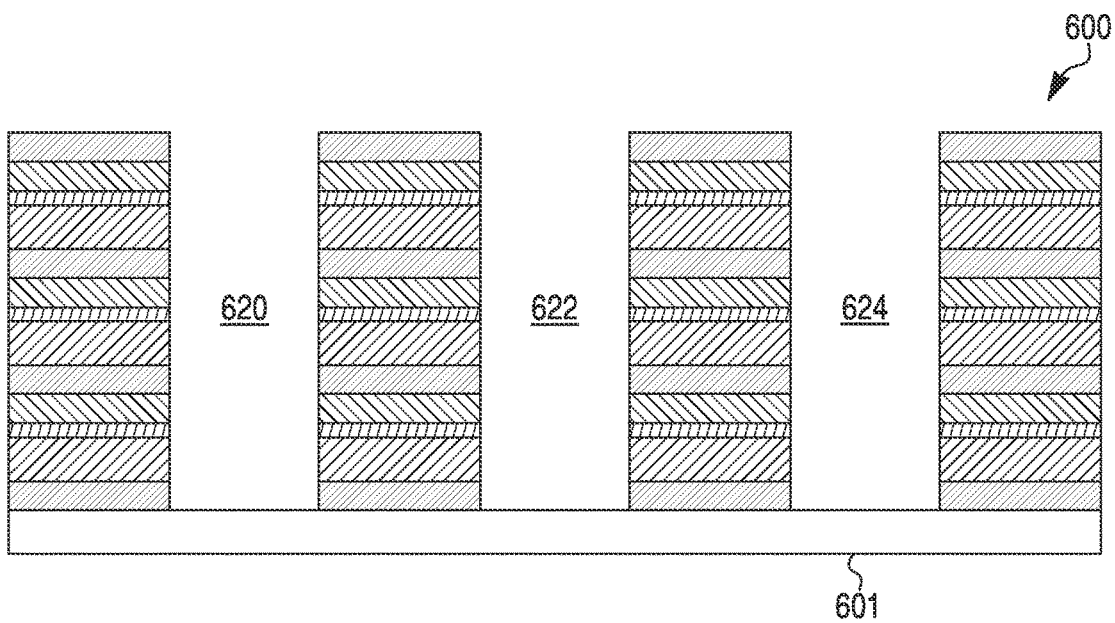
Figure 21C:
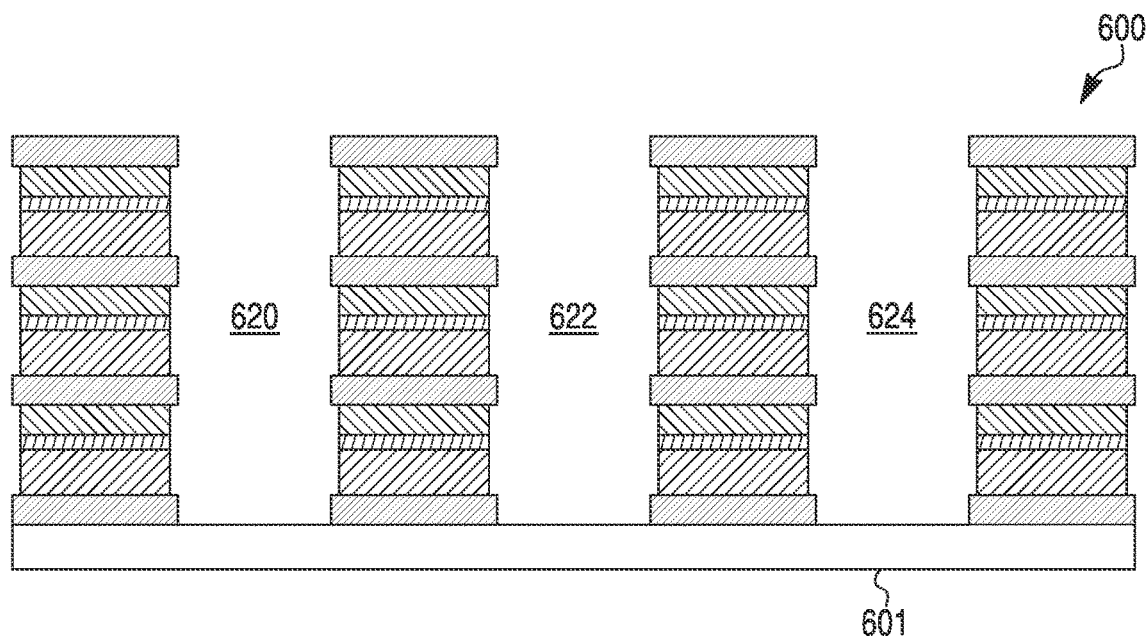
Figure 21D:
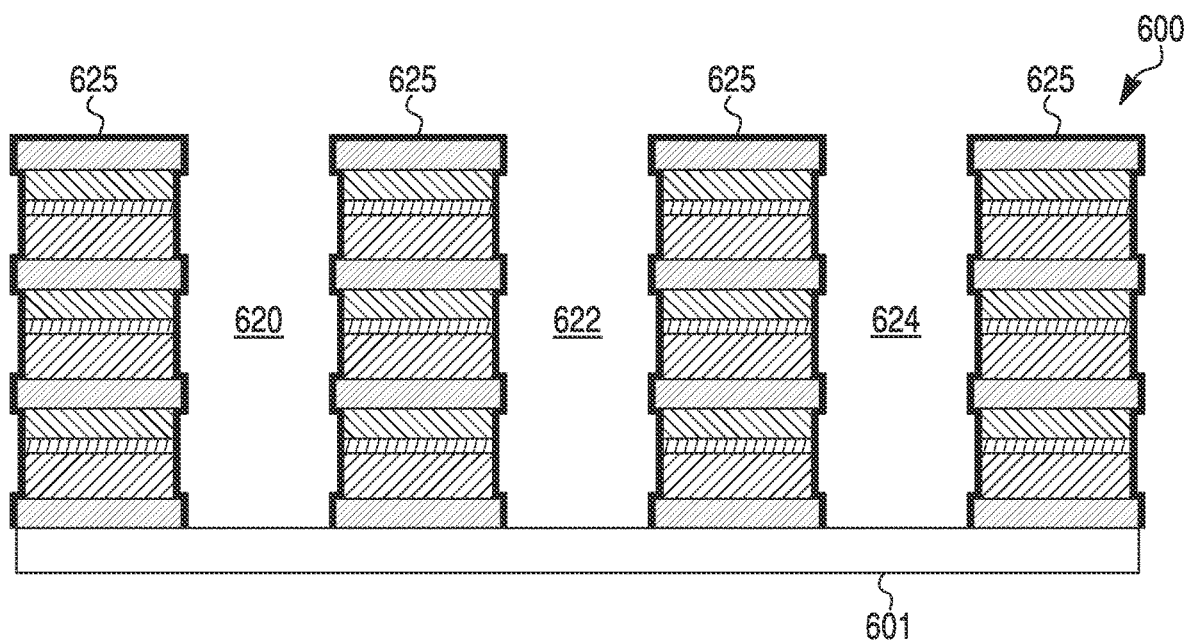
Figure 21E:
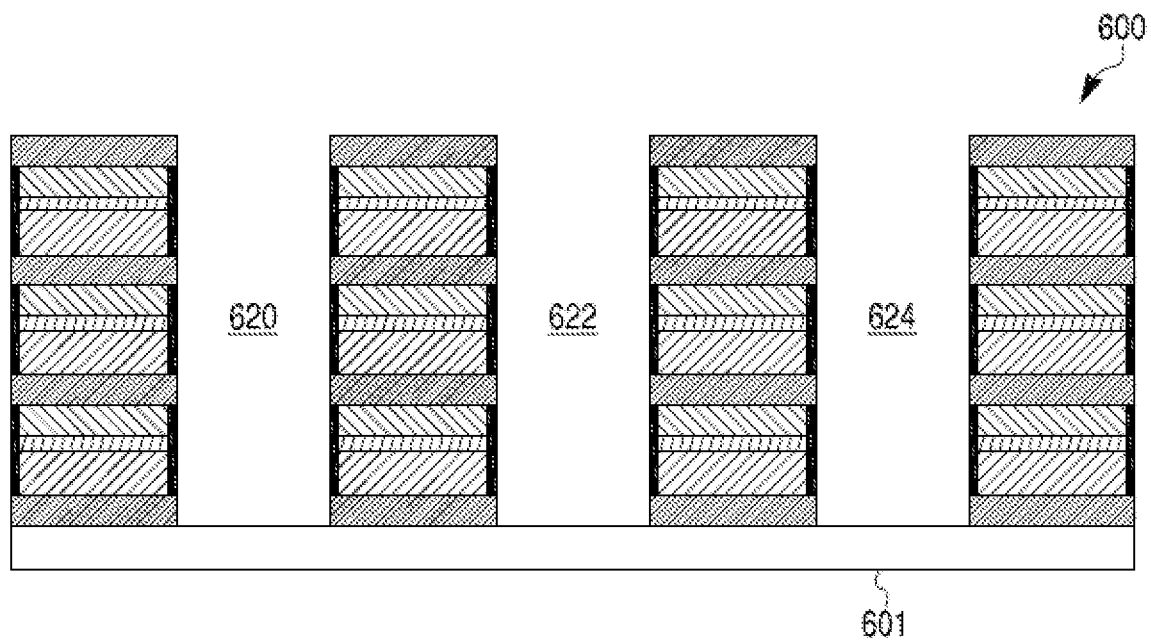
Figure 21F:
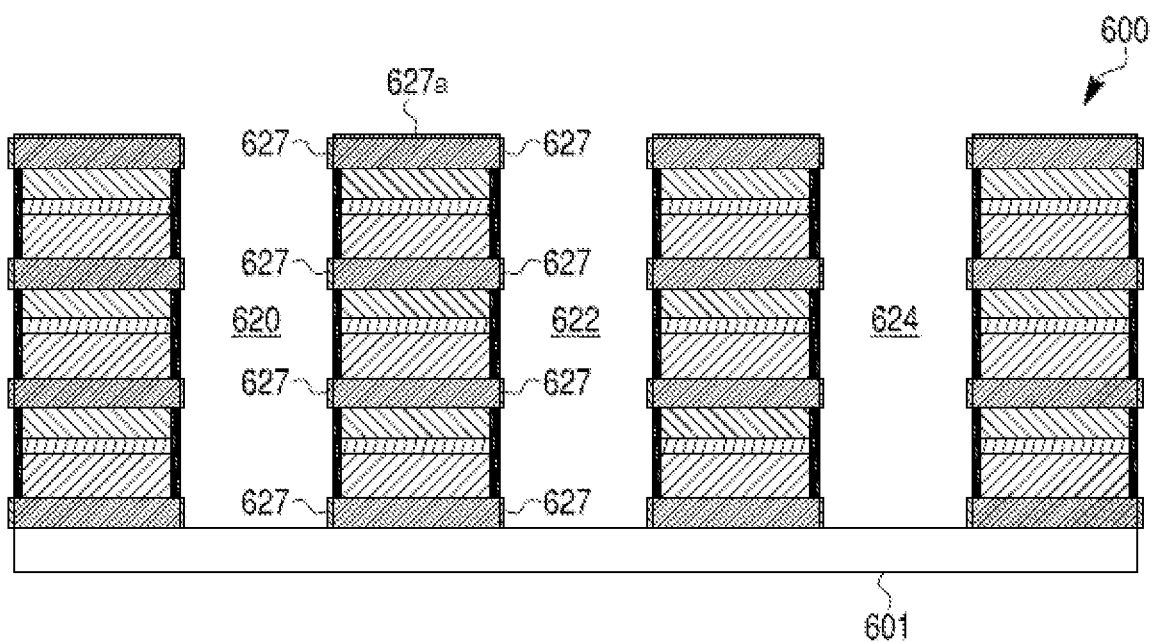
Figure 21G:
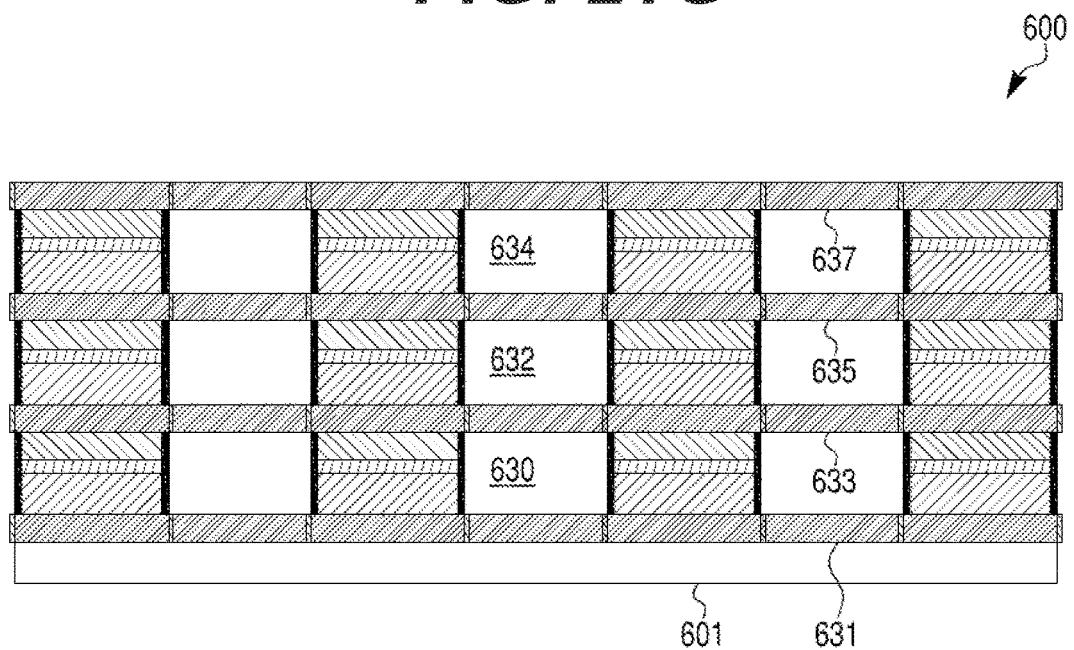
Figure 21H:
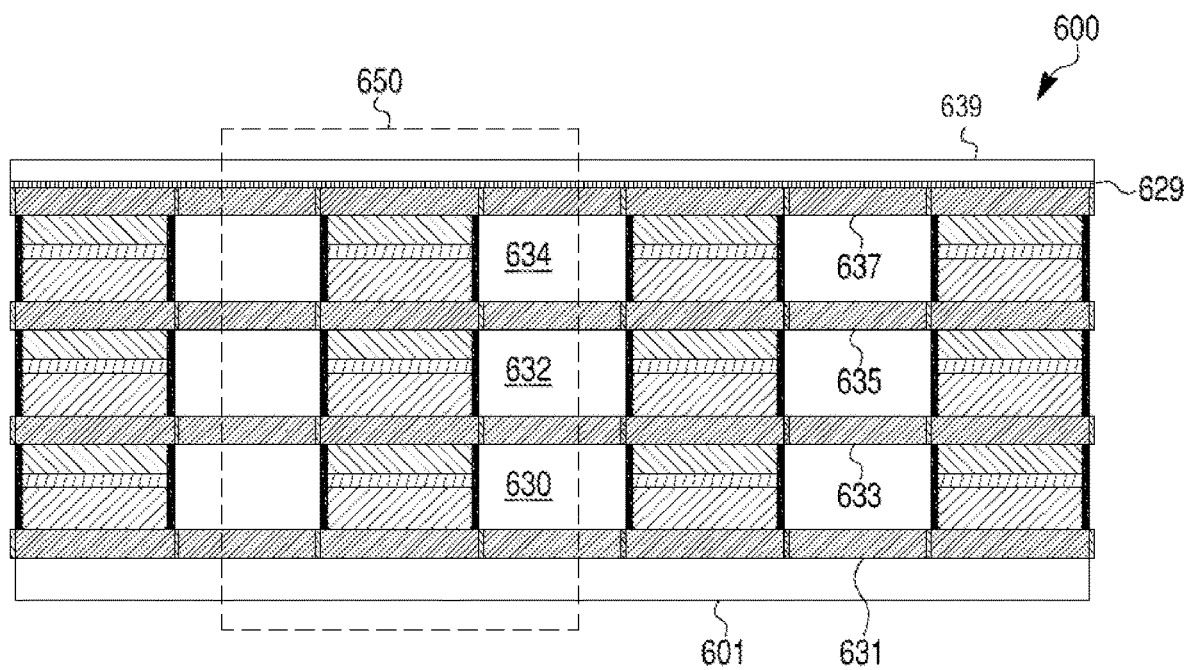
Figure 21I:
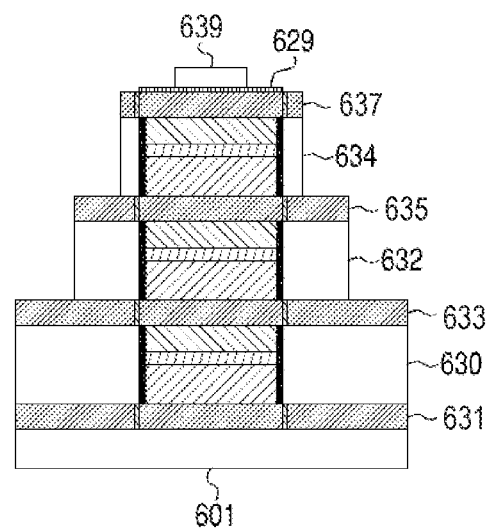
Figure 21J:
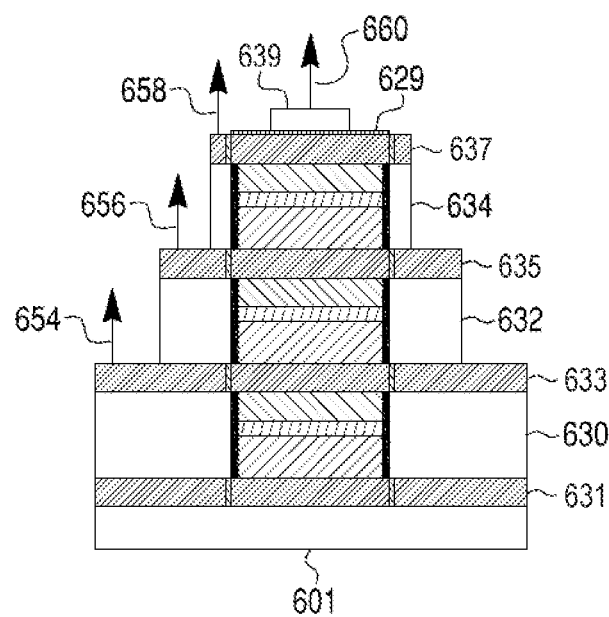
Figure 22:
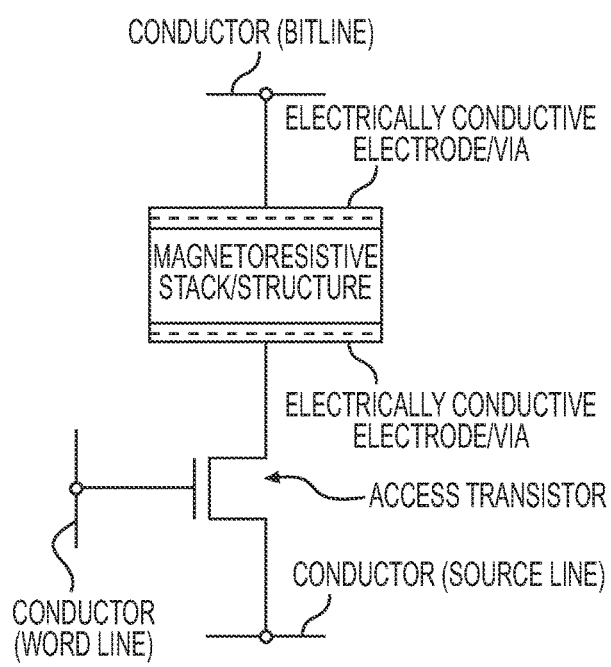
Figure 23A:
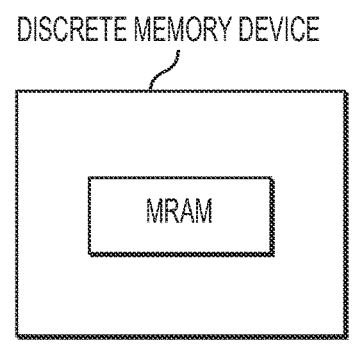
Figure 23B:
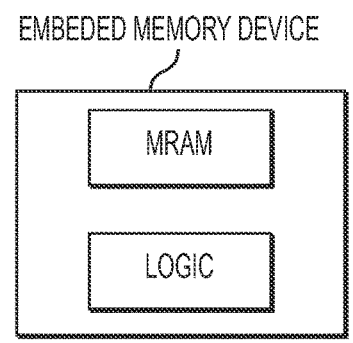

FIG. 1 is a cross-sectional view depicting various regions of an exemplary magnetoresistive cell of an exemplary magnetoresistive device in one embodiment;

FIG. 2 is a cross-sectional view of an exemplary fixed region of the exemplary magnetoresistive cell of FIG. 1;

FIG. 3 is a cross-sectional view of an exemplary magnetoresistive cell of an exemplary magnetoresistive device in another embodiment;

FIG. 4A is a schematic illustration of electrical parameters of the exemplary magnetoresistive cell of FIG. 1;

FIGS. 4B-4C are schematic illustration of exemplary current patterns associated with the exemplary magnetoresistive cell of FIG. 1;

FIG. 5A is a cross-sectional view of an exemplary magnetoresistive cell of an exemplary magnetoresistive device in another embodiment;

FIG. 5B is a cross-sectional view of an exemplary magnetoresistive cell of another exemplary magnetoresistive device;

FIGS. 6A-6B are schematic illustrations of electrical parameters of the exemplary magnetoresistive cell of FIG. 5A;

FIGS. 7A-7L are schematic illustrations of exemplary current patterns associated with the exemplary magnetoresistive cell of FIG. 5A;

FIGS. 8A-8B are cross-sectional views of exemplary magnetoresistive cells of exemplary magnetoresistive devices in some embodiments of the present disclosure;

FIGS. 9A-9C are cross-sectional views of exemplary magnetoresistive cells of exemplary magnetoresistive devices in some embodiments of the present disclosure;

FIG. 10 is a schematic illustration of electrical parameters of the exemplary magnetoresistive cell of FIG. 9C;

FIGS. 11A-11H are schematic illustrations of exemplary current patterns associated with the exemplary magnetoresistive cell of FIG. 9C;

FIGS. 12A-12B are cross-sectional views of exemplary magnetoresistive cells of exemplary magnetoresistive devices in some embodiments of the present disclosure;

FIG. 13 is a simplified flow chart illustrating an exemplary method of fabricating the exemplary magnetoresistive device of FIG. 5A;

FIG. 14 is a simplified flow chart illustrating an exemplary method for "reading" a magnetoresistive cell of the exemplary magnetoresistive device of, e.g., FIG. 5A;

FIG. 15 is a simplified flow chart illustrating an exemplary method for "writing" to a magnetoresistive cell of the exemplary magnetoresistive device of, e.g., FIG. 5A;

FIG. 16 is an illustration of the switching currents for an exemplary MTJ cell after a pre-read;

FIGS. 17A-17D are cross-sectional schematic illustrations of further exemplary magnetoresistive bits according to the present disclosure;

FIGS. 18A and 18B are cross-sectional schematic illustrations of an exemplary magnetoresistive memory cell, having a plurality of magnetoresistive bits, electrically connected to an access transistor;

FIGS. 19A-19D are further cross-sectional schematic illustrations of an exemplary magnetoresistive memory cell having a plurality of magnetoresistive bits, being programmed to various resistance states;

FIG. 20 is a flow chart illustrating an exemplary fabrication process of an exemplary magnetoresistive structure of the present disclosure;

FIGS. 21A-21J illustrate cross-sectional views of various stages of manufacture of exemplary magnetoresistive structures; and FIG. 22 is a schematic diagram of an exemplary magnetoresistive memory stack/structure electrically connected to an access transistor in a magnetoresistive memory cell configuration;

FIGS. 23A-23B are schematic block diagrams of integrated circuits including a discrete memory device and an embedded memory device, each including an MRAM (which, in one embodiment is representative of one or more arrays of MRAM having a plurality of magnetoresistive memory stacks according to aspects of certain embodiments of the present disclosure);

Again, there are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

DETAILED DESCRIPTION

It should be noted that all numeric values disclosed herein (including all disclosed thickness values, limits, and ranges) may have a variation of ±10% (unless a different variation is specified) from the disclosed numeric value. For example, a layer disclosed as being "t" units thick can vary in thickness from (t−0.1t) to (t+0.1t) units. Further, all relative terms such as "about," "substantially," "approximately," etc. are used to indicate a possible variation of ±10% (unless noted otherwise or another variation is specified). Moreover, in the claims, values, limits, and/or ranges of the thickness and atomic composition of, for example, the described layers/regions, mean the value, limit, and/or range ±10%.

It should be noted that the description set forth herein is merely illustrative in nature and is not intended to limit the embodiments of the subject matter, or the application and uses of such embodiments. Any implementation described herein as exemplary is not to be construed as preferred or advantageous over other implementations. Rather, the term "exemplary" is used in the sense of example or "illustrative," rather than "ideal." The terms "comprise," "include," "have," "with," and any variations thereof are used synonymously to denote or describe a non-exclusive inclusion. As such, a device or a method that uses such terms does not include only those elements or steps, but may include other elements and steps not expressly listed or inherent to such device and method. Further, the terms "first," "second," and the like, herein do not denote any order, quantity, or importance, but rather are used to distinguish one element from another. Similarly, terms of relative orientation, such as "top," "bottom," etc. are used with reference to the orientation of the structure illustrated in the figures being described. Moreover, the terms "a" and "an" herein do not denote a limitation of quantity, but rather denote the presence of at least one of the referenced item.

In this disclosure, the term "region" is used generally to refer to one or more layers. That is, a region (as used herein) may include a single layer (deposit, film, coating, etc.) of material or multiple layers of materials stacked one on top of another (i.e., a multi-layer structure). Further, although in the description below, the different regions and/or layers in the disclosed magnetoresistive stacks are referred to by specific names (e.g., capping region, reference region, transition region, etc.), this is only for ease of description and not intended as a functional description of the layer. Moreover, although the description below and the figures appear to depict a certain orientation of the layers relative to each other, those of ordinary skill in the art will understand that such descriptions and depictions are only exemplary. For example, though the "free" region is depicted as being "above" an intermediate region, in some aspects the entire magnetoresistive stack may be flipped such that the intermediate region is "above" the "free" region.

In one exemplary aspect, a magnetoresistive device of the present disclosure may be implemented as a spin-torque magnetoresistive random access memory ("MRAM") element ("memory element"). In such aspects, the magnetoresistive bits of the device may include an intermediate region positioned (or sandwiched) between two ferromagnetic regions to form a magnetic tunnel junction (MTJ) device or an MTJ-type device. In such a device, the intermediate region may be a tunnel barrier and include an insulating material, such as, e.g., a dielectric material. In this disclosure, the magnetoresistive bits of an MTJ device are referred to as MTJ bits. In other embodiments, the intermediate region may be a conductive material, e.g., copper, gold, or alloys thereof. In these other embodiments, where the magnetoresistive bits include a conductive material in between two ferromagnetic regions, the magnetoresistive device may form a giant magnetoresistance (GMR) or GMR-type device. Although aspects of the current disclosure are described below with reference to an MTJ device (having MTJ bits), this is not a limitation. In general, aspects of the current disclosure are generally applicable to any type of magnetoresistive device.

In an exemplary MTJ bit, of the two ferromagnetic regions disposed on either side of the intermediate region, one ferromagnetic region may be a magnetically "fixed" (or pinned) region, and the other ferromagnetic region may be a magnetically "free" region. The term "free" is intended to refer to ferromagnetic regions having a magnetic moment that may shift or move significantly in response to applied magnetic fields or spin-polarized currents used to switch the magnetic moment vector. On the other hand, the words "fixed" and "pinned" are used to refer to ferromagnetic regions having a magnetic moment vector that does not move substantially in response to such applied magnetic fields or spin-polarized currents. As is known in the art, an electrical resistance of an MTJ bit may change based on whether the magnetization direction (e.g., the direction of the magnetic moment) of the "free" region adjacent to the non-magnetic layer is in a parallel alignment (P) or in an antiparallel (AP) alignment with the magnetization direction (e.g., the direction of the magnetic moment) of the "fixed" region adjacent to the non-magnetic layer. Typically, if the two regions have the same magnetization alignment (i.e., parallel or P alignment), the MTJ bit has a relatively low(er) electrical resistance (RMin). This relatively lower resistance may be considered as a digital "0." In contrast, if the alignment is antiparallel (AP), the MTJ bit has a relatively high(er) electrical resistance (RMax), which may be considered to be a digital "1."

Switching the magnetization direction of the "free" region of an MTJ bit may be accomplished by driving an electrical current pulse through the MTJ bit. The polarity of the current pulse determines the final magnetization state (i.e., P or AP) of the "free" region. For example, directing tunneling current of sufficient magnitude in one direction (e.g., from the "fixed" region towards the "free" region) may change the magnetization state of the "free" region to be antiparallel (i.e., AP) with the magnetization state of the "fixed" region. And, directing the tunneling current in the opposite direction (e.g., from the "free" region towards the "fixed" region) may change the magnetization state of the "free" region to be parallel (i.e., P) with the magnetization state of the "fixed" region. The mean current required to switch the magnetic state of the "free" region may be referred to as the critical current (Ic). The critical current is indicative of the current required to switch the magnetization state of the MTJ bit (from P to AP or vice versa), or to "write" data in, the MTJ bit. Typically, to write data, a write current (IW) having a magnitude greater than (or equal to) Ic is directed through the MTJ bit to change the MTJ bit from P to AP (or AP to P based on the polarity of the current).

In an exemplary MTJ device, the MTJ bits may be formed between a top electrode/via/line and a bottom electrode/via/line, which permit access to the bit by allowing for electrical connectivity to circuitry and other elements of the magnetoresistive device (e.g., access transistors, bit line, word line, logic circuitry, etc.). Between the electrodes/vias/lines are multiple regions, including at least one "fixed" magnetic region (referred to hereinafter as a fixed region) and at least one "free" magnetic region (referred to hereinafter as a free region) with one or more intermediate region(s), such as, e.g., a dielectric layer (that form(s) a tunnel barrier) between the fixed and the free regions. Each of the fixed and the free regions may include, among other things, a plurality of ferromagnetic layers. In some embodiments, the top electrode may be eliminated, and a bit line (or an interconnect in electrical contact with the bit line) may be formed on top of the stack. Similarly, in some embodiments, the bottom electrode may be eliminated and the MTJ bit may be formed directly on a word line (or an interconnect structure in electrical contact with the word line) of the device.

FIG. 1 is a cross-sectional view a portion of an exemplary MTJ device 1000 of the current disclosure, illustrating an exemplary MTJ bit 100 of device 1000. MTJ bit 100 may be coupled or otherwise connected to an access transistor T and to various conductors (e.g., source line conductor, word line conductor, bit line conductor, etc.) which may carry one or more control signals and provide access to MTJ bit 100 (e.g., to read and write MTJ bit 100 as will be described later). MTJ device 1000 may be used in any suitable application, including, e.g., in a memory configuration.

As illustrated in FIG. 1, MTJ bit 100 includes an intermediate region 30 (which in an MTJ device includes a dielectric material and functions as a tunnel barrier) positioned between a fixed region 20 and a free region 50. In some embodiments, as illustrated in FIG. 1, MTJ bit 100 may be formed between a first electrode 10 (e.g., a bottom electrode) and a second electrode 70 (e.g., a top electrode). First and second electrodes 10, 70 may comprise an electrically conductive material, and may be part of (or be in physical contact with) electrically conductive interconnects (e.g., vias, traces, lines, etc.) of MTJ device 1000. Although any electrically conductive material may be used for first and second electrodes 10, 70, in some embodiments, a metal such as tantalum (Ta), titanium (Ti), tungsten (W), or a composite or alloy of these elements (e.g., tantalum-nitride alloy) may be used. In some embodiments, first and/or second electrodes 10, 70 may be eliminated, and MTJ bit 100 may be in direct contact with a metallization structure (e.g., line, via, etc.) of MTJ device 1000. Although not illustrated in FIG. 1, in some embodiments, first electrode 10 may include a seed layer at its interface with the overlying region (e.g., fixed region 20). During fabrication, the seed layer may assist in the formation of the overlying region on electrode 10. The seed layer may include one or more of nickel (Ni), chromium (Cr), cobalt (Co), iron (Fe), ruthenium (Ru), platinum (Pt), tantalum (Ta), and alloys thereof (for example, an alloy including nickel (Ni) and/or chromium (Cr)). In some embodiments, the seed layer may be eliminated, and the top surface of electrode 10 itself may act as the seed layer.

With continuing reference to FIG. 1, fixed region 20 may be formed on (or above) first electrode 10. It should be noted that the structure of fixed region 20 illustrated in FIG. 1 is only exemplary. Fixed region 20 may include alloys that include cobalt (Co) and iron (Fe) and other materials (preferably cobalt (Co), iron (Fe), and boron (B)). Typically, the composition of materials (e.g., cobalt (Co), iron (Fe), and boron (B)) in fixed region 20 may be selected to achieve good temperature compensation. The configuration of fixed region 20 shown in FIG. 1 is only exemplary, and as known to those of ordinary skill in the art, many other configurations of are possible. In general, fixed region 20 may include a single layer or multiple layers stacked one on top of another. In some embodiments, fixed region 20 also may include one or more non-magnetic material layers. For example, ruthenium (Ru), rhodium (Rh), platinum (Pt), palladium (Pd), rhenium (Re), iridium (Ir), copper (Cu), aluminum (Al), tantalum (Ta), titanium (Ti), niobium (Nb), vanadium (V), zirconium (Zr), one or more alloys of these elements, and in certain embodiments, tungsten (W) and molybdenum (Mo). In some embodiments, fixed region 20 may include a multi-layer structure of cobalt (Co) and platinum (Pt), cobalt (Co) and palladium (Pd), or cobalt (Co) and nickel (Ni) (with or without other alloying elements).

FIG. 2 illustrates an exemplary embodiment of fixed region 20. Fixed region 20 may be a fixed, unpinned synthetic antiferromagnetic (SAF) region disposed on or above electrode 10. The fixed, unpinned synthetic antiferromagnetic (SAF) region may include at least two magnetic regions 14, 18 (e.g., ferromagnetic layer 1 and ferromagnetic layer 2) separated by a coupling region 16. Ferromagnetic regions 14, 18 may include one or more of the ferromagnetic elements nickel (Ni), iron (Fe), and cobalt (Co), including alloys or engineered materials with one or more of the elements palladium (Pd), platinum (Pt), nickel (Ni), and alloys thereof, and the coupling region 16 may be an antiferromagnetic (AF) coupling region that includes non-ferromagnetic materials such as, for example, iridium (Ir), ruthenium (Ru), rhenium (Re), or rhodium (Rh). In some embodiments, one or both of ferromagnetic regions 14, 18 may comprise a magnetic multi-layer structure that includes a plurality of layers of a first ferromagnetic material (e.g., cobalt (Co)) and a second ferromagnetic material (e.g., nickel (Ni)) or a paramagnetic material (e.g., platinum (Pt)). In some embodiments, ferromagnetic regions 14, 18 may also include, for example, alloys or engineered materials with one or more of palladium (Pd), platinum (Pt), magnesium (Mg), manganese (Mn), and chromium (Cr). Additionally, or alternatively, in some embodiments, fixed region 20 may include one or more synthetic ferromagnetic structures (SyF). Since SyFs are known to those skilled in the art, they are not described in greater detail herein. In some embodiments, fixed region 20 may have a thickness in the range of approximately 8 Å and approximately 300 Å, approximately 15 Å and approximately 110 Å, greater than or equal to 8 Å, greater than or equal to 15 Å, less than or equal to 300 Å, or less than or equal to 110 Å.

In some embodiments, as shown in FIG. 2, fixed region 20 may also include one or more additional layers, such as, for example, a transition region 22 and a reference region 24 disposed at the interface between fixed region 20 and the overlying region (e.g., region 30). Transition and/or reference regions 22, 24 may include one or more layers of material that, among other things, facilitate/improve growth of the overlying intermediate region 30 during fabrication. In one embodiment, reference region 24 may comprise one or more (e.g., all) of cobalt (Co), iron (Fe), and boron (B) (for example, in an alloy—such as an amorphous alloy (e.g., CoFeB or CoFeBTa or CoFeTa)). And, transition region 22 may include a non-ferromagnetic transition metal such as tantalum (Ta), titanium (Ti), tungsten (W), ruthenium (Ru), niobium (Nb), zirconium (Zr), hafnium (Hf), and/or molybdenum (Mo). In general, transition region 22 and reference region 24 may have any thickness. In some embodiments, a thickness (t) of reference region 24 may be approximately 6-13 Å, preferably approximately 8-12 Å, and more preferably approximately 9-9.5 Å, and the thickness of transition region 22 may be approximately 1-8 Å, preferably approximately 1.5-5 Å, and more preferably approximately 2.5-3.5 Å. It should be noted that, in some embodiments, both transition region 22 and reference region 24 may be provided in fixed region 20 of MTJ bit 100. In some embodiments, one or both of transition region 22 and reference region 24 may be eliminated.

It should be noted that although FIG. 2 (and FIG. 1) shows the different regions of the stack as distinct layers, this is only a simplification. For example, although the different regions of the fixed region of FIG. 2 (and the MTJ bit 100 of FIG. 1) may be sequentially and individually formed (e.g., deposited, deposited, and oxidized, etc.) during fabrication, as would be recognized by those of ordinary skill in the art, the materials that make up the various regions may alloy with (e.g., intermix with, diffuse into, etc.) the materials of adjacent regions during subsequent processing (e.g., high temperature processing operations, such as annealing, etc.). Therefore, a person skilled in the art would recognize that, although the different regions of fixed region 20 of FIG. 2 (and of MTJ device 100 of FIG. 1) may appear as separate regions with distinct interfaces immediately after formation of these regions, after subsequent processing operations, the materials of the different regions may alloy together to form a single alloyed fixed region 20 having a higher concentration of different materials at interfaces between different regions. Thus, in some cases, it may be difficult to distinguish the different regions of the fixed region 20 (and other regions) in a finished MTJ bit 100 and MTJ device 1000.

With renewed reference to FIG. 1, a free region 50, or storage region, may be provided "above" fixed region 20 with an intermediate region 30 formed between fixed and free regions 20, 50. The relative orientation of fixed and free regions 20, 50 depicted in FIG. 1 is only exemplary. Those of ordinary skill will readily recognize that free region 50 may also be provided below fixed region 20 in the illustration of FIG. 1. As explained previously, the type of intermediate region 30 formed depends upon the type of device being fabricated. In a magnetic tunnel junction bit, intermediate region 30 may include a dielectric material that functions as a tunnel barrier of MTJ bit 100. Intermediate region 30 may be formed on (or above) a surface of fixed region 20, and free region 50 may be formed on (or above) a surface of intermediate region 30. In general, intermediate region 30 may be formed on or above fixed region 20 using any technique now known (e.g., deposition, sputtering, evaporation, etc.) or later developed. In some embodiments, intermediate region 30 may include an oxide material, such as, for example, Magnesium Oxide (MgOx) or Aluminum Oxide (AlOx (e.g., $Al_2O_3$)), and may be formed by multiple steps of material deposition and oxidation. In general, intermediate region 30 may have any thickness. In some embodiments, intermediate region 30 may have a thickness of approximately 8.5-14.1 Å, preferably approximately 9.6-13.0 Å, and more preferably approximately 9.8-12.5 Å. In some embodiments, intermediate region 30 may have a thickness of approximately 3-14 Å, or approximately 5-12 Å, or approximately 6-10 Å. Although not illustrated in FIG. 1, in some embodiments, a dusting of an interfacial material (e.g., iron (Fe), cobalt-iron-alloy (CoFe) etc.) may also be provided at the interface between free region 50 and intermediate region 30. This interfacial material may result in a high perpendicular magnetic anisotropy (PMA) of the resulting MTJ bit 100.

Free region 50 may include any ferromagnetic alloy. In some embodiments, the ferromagnetic alloy of free region 50 may comprise cobalt (Co), iron (Fe), and boron (B) (referred to as CoFeB). It should be noted that the configuration of free region 50 illustrated in FIG. 1 is only exemplary, and many other configurations are possible. Notwithstanding the specific configuration of free region 50, as explained previously, a magnetic vector (or moment) in free region 50 may be moved or switched by applied magnetic fields or spin torque switching currents.

With renewed reference to FIG. 1, fixed and free regions 20, 50 of MTJ bit 100 may have any suitable configuration (illustrated in FIG. 2 or another suitable configuration). It should also be noted that the configuration/structure of MTJ bit 100 illustrated in FIG. 1 is merely exemplary and not a requirement of the current disclosure. MTJ bit 100 may include, for example, any in-plane or out-of-plane magnetic anisotropy magnetoresistive stack (e.g., a perpendicular magnetic anisotropy magnetoresistive stack). FIG. 3 illustrates another configuration of an MTJ bit 100' that may be used in MTJ device 1000 of FIG. 1. In MTJ bit 100' of FIG. 3, a free region 50 may be formed between two fixed regions 20, 20' and two intermediate regions 30, 30'. Both fixed regions 20, 20' may have the same structure and/or materials or a different structure and/or materials. For example, one fixed region 20 may have a structure similar to that illustrated in FIG. 2 and the other fixed region 20 may have a structure similar to that shown in FIG. 1 (or another suitable structure). Similarly, both intermediate regions 30, 30' may have the same or different structures, for example, different thickness for different RA. The structure of MTJ bit 100' of FIG. 3 (where a free region 50 is formed between two fixed regions 20 and 20') is referred to as a dual spin filter (DSF) structure. In a DSF structure of FIG. 3, the ferromagnetic regions next to intermediate regions 30 and 30' in fixed region 20 and 20' have their magnetization orientations aligned in opposite directions. As explained previously, the configuration of the MTJ bits (and the free and fixed regions) described above are merely exemplary. U.S. Pat. Nos. 8,686,484; 8,747,680; 9,023,216; 9,136,464; and 9,419,208, and U.S. Patent Application Publication Nos. 2018/0158498; 2019/0165253; 2019/0173004; 2019/0131519; 2019/0140167; and 2019/0157549 describe exemplary MTJ bits that may also be used in MTJ device 1000 of FIG. 1. Each of these references is incorporated by reference in its entirety herein.

Irrespective of the specific configuration of MTJ bit 100 or 100', as discussed previously, the orientation of the magnetic moment in fixed region 20 is fixed, and the orientation of the magnetic moment in free region 50 may be switched to be parallel (P), or to be antiparallel (AP), to the direction of magnetic moments in fixed region 20. In some MTJ devices, MTJ bit 100 may be switched (from P to AP and vice versa) using magnetic fields generated by current-carrying lines adjacent to MTJ bit 100. However, when MTJ device 1000 is a spin torque transfer (STT) device, MTJ bit 100 is switched by forcing a current I (see arrow in FIG. 1) directly through MTJ bit 100. In the DSF structure of MTJ bit 100' in FIG. 3, the orientation of the magnetic moment in free region 50 is always parallel to one of the orientations of the magnetic moment of the two fixed regions 20 and 20' and antiparallel to another. The low resistance state (P state) or high resistance state (AP state) is determined by that the orientation of the magnetic moment of free region 50 is switched to be parallel (P) or to be antiparallel to the direction of one of magnetic moment in fixed regions 20 and 20', which is next to intermediate layer 30 or 30' having high RA in case of similar MR or high MR in case of similar RA.

The spin-torque effect is known to those skilled in the art. Briefly, a current (I) becomes spin-polarized after it passes through the first magnetic layer (i.e., fixed region 20 for the direction of current I shown in FIG. 1) in a magnet/non-magnet/magnet trilayer structure (e.g., fixed region 20/intermediate region 30/free region 50 structure of FIG. 1), where fixed region 20 is substantially fixed in its magnetic orientation by any one of a number of methods known in the art. The direction of the current I represents the direction of the flow of the electrons. The spin-polarized current crosses the nonmagnetic intermediate region 30 and then, through conservation of spin angular momentum, exerts a spin torque on free region 50. This spin torque switches the magnetic orientation of free region 50 to be parallel (P) to the magnetic orientation of fixed region 20. If a current of the opposite polarity (e.g., in a direction opposite to the direction of the arrow in FIG. 1) is applied, the current passes first through free region 50 and applies a spin torque on fixed region 20. However, since the magnetization of fixed region 20 is fixed, its magnetization does not switch. A fraction of the electrons will then reflect off fixed region 20 and travel back across intermediate region 30 and interact with free region 50. In this case, the spin torque acts to switch the magnetic orientation of free region 50 to be antiparallel (AP) to the magnetic orientation of fixed region 20. Spin-torque switching occurs only when the magnitude of current I exceeds the critical current IC of MTJ bit 100. In a typical MTJ device 1000, the spin-torque switching current I (called write current IW) used by the circuit is chosen to be somewhat above the average IC of the multiple MTJ bits 100 in device 1000 so that all MTJ bits 100 will switch reliably when current IW is applied. During reading of data from MTJ bit 100, a small current (e.g., read current) flows through MTJ bit 100 and the resistance of MTJ bit 100 (e.g., RMin, RMax, etc.) is detected.

There are a number of techniques used in the art to determine whether the resistance of MTJ bit 100 detected using a read current is RMin or RMax (i.e., at a high or a low resistance state). In some embodiments, the detected resistance of MTJ bit 100 is compared with a reference resistance to determine whether MTJ bit 100 is at RMin or RMax. For example, the detected resistance may be compared with the resistance of a reference MTJ bit (or the average resistance of multiple reference MTJ bits) maintained at a high resistance state (RMax)Ref, and with the resistance of a reference MTJ bit maintained at a low resistance state (RMin)Ref. And, based on the comparison, it may be determined whether MTJ bit 100 is at RMin or RMax. In some embodiments, a mid-point reference technique may be used to determine whether MTJ bit 100 is at RMin or RMax. For example, the average resistance (e.g., (RMax Ref+RMin Ref)/2) of a reference MTJ bit (or multiple reference MTJ bits) maintained at its high resistance state (RMax)Ref and a reference MTJ bit (or multiple reference MTJ bits) maintained at its low resistance state (RMin)Ref may be obtained, and compared with the detected resistance of MTJ bit 100. And, based on whether the detected resistance is above or below (RMax Ref+RMin Ref)/2, it may be determined whether MTJ bit 100 is at RMin or RMax. In some embodiments, a self-reference technique may be used to determine whether MTJ bit 100 is at RMin or RMax. For example, after detecting the resistance of MTJ bit 100 using a read current, MTJ bit 100 may be rewritten (or reset using a write current) so that it is now in a known magnetic state (e.g., P or AP). The resistance of the rewritten MTJ bit 100 is then "read" again and compared with the originally detected resistance. The originally detected resistance of MTJ bit 100 is then determined based on whether the detected resistance of MTJ bit 100 changed after the reset operation. For example, if after an initial read step, MTJ bit 100 is reset to a low resistance state RMin (i.e., P magnetic state) and the detected resistance after the reset is the same (or substantially the same) at the originally detected resistance, then the originally detected resistance is RMin. It should be noted that the above-discussed MTJ bit resistance determination techniques are only exemplary, and any now-known or future-developed technique may be used to determine the resistance of, or otherwise read, MTJ bit 100. Since techniques (including self-reference, mid-point reference, etc.) to determine the resistance state of an MTJ bit (such as MTJ bit 100) are known in the art, they are not discussed in detail herein. For example, U.S. Pat. Nos. 8,923,041; 9,111,622; 9,293,182; and 9,472,256, each of which is incorporated by reference in its entirety herein, disclose exemplary techniques to determine the resistance states of MTJ bits.

FIG. 4A illustrates the relationship between critical current IC and write current IW when switching MTJ bit 100 (of FIG. 1) to a state where the magnetic orientation of free region 50 is antiparallel to the magnetic orientation of the fixed region 20 (or the AP state), and to a state where the magnetic orientation of free region 50 is parallel to the magnetic orientation of the fixed region 20 (or the P state). Note that, in the discussion below, reference to directions such as "up" and "down" are with reference to the configuration of MTJ bit 100 illustrated in FIG. 1. That is, a description of the "up" direction refers to the direction of the arrow in FIG. 1 and "down" refers to the opposite direction. FIG. 4A shows histograms of the distribution of different IC,D and IC,U values for different bits in the MRAM array. To switch MTJ bit 100 to the AP state, a write current IW, U (write current in the "up" direction), having a greater magnitude than the largest critical current IC, U (critical current in the "up" direction) in the distribution of IC,U values is applied to the MTJ bit 100. And, to switch MTJ bit 100 to the P state, a write current IW, D (write current in the "down" direction), having a greater magnitude than the largest critical current IC, D (critical current in the "down" direction) in the distribution of IC, D values is applied to the MTJ bit 100.

FIGS. 4B and 4C illustrate exemplary current patterns that may be used (e.g., generated by a program) to switch MTJ bit 100 to the AP state and P state, respectively, in an exemplary embodiment. As illustrated in FIG. 4B, a current IW, U, having a magnitude greater than IC, U (the critical current of MTJ bit 100 in the up direction), will switch MTJ bit 100 to the AP state. And a current IW, D of the opposite polarity and having a magnitude greater than IC, D (the critical current of MTJ bit 100 in the down direction) will switch MTJ bit 100 to the P state. When MTJ bit 100 is in the AP state, its resistance will be RMax (high resistance state) and when MTJ bit 100 is in the P state, its resistance will be RMin (low resistance state). The difference between the high resistance state and the low resistance state of MTJ BIT 100 (i.e., RMax−RMin) is referred to herein as ΔR.

Although IC, U and IC, D are shown as having similar magnitudes in FIGS. 4A-4C, this is not a requirement. In general, IC, U and IC, D have the opposite polarity but may have the same or different magnitudes (in some embodiments, |IC, U| may be greater than |IC, D|). However, for the sake of simplicity, in the discussion below, the magnitudes of IC, U and IC, D are assumed to be substantially the same (i.e., |IC, U|≅|IC, D|). It should also be noted that, for clarity, the difference between IW and IC (i.e., IW, U and IC, U, and IW, D and IC, D) is exaggerated in FIGS. 4A-4C. In general, the electrical parameters (e.g., the magnitude of the critical current IC, RMin, RMax, ΔR, etc.) of an MTJ bit depend on the structure and materials used in the MTJ bit. For example, different stacks or structures (e.g., having differing compositions or configurations) used for free region 50 of MTJ bit 100 may result in differing IC. Similarly IC may be increased (or decreased) by selecting different material sets (and/or tailoring the different interfaces) for free region 50 of MTJ bit 100. Increasing the size or area (e.g., in a plane perpendicular of cross-section illustrated in FIG. 1) of MTJ bit 100 (including free region 50, intermediate region 30 (e.g., tunnel barrier layer) and fixed region 20 of MTJ bit 100) may result in an increase in IC. Since the effect of materials and design parameters on the resulting electrical parameters of MTJ bit 100 are known in the art, they are not discussed in more detail herein.

In MTJ device 1000 of FIG. 1, MTJ bits 100 are arranged side by side in a plane (e.g., with reference to FIG. 1, in a plane perpendicular to the page) so as to form a two-dimensional array of MTJ bits 100. In such a configuration, the density of MTJ bits 100 may be increased by reducing the size of MTJ bits 100 and/or by positioning adjacent MTJ bits 100 closer together (e.g., decreasing the pitch). However, there may be practical limitations (e.g., manufacturability issues, etc.) on the minimum size and pitch of MTJ bits 100. Therefore, in some preferred embodiments of the current disclosure, as described in detail below, multiple MTJ bits may be stacked vertically (e.g., one on top of another) in MTJ device 1000, thereby creating a 3-dimensional array of MTJ bits 100.

FIG. 5A illustrates an exemplary MTJ device 1100 having two MTJ bits 100A, 100B (marked MTJ1 and MTJ2) stacked one on top of another to form an MTJ cell 200A. That is, each MTJ cell 200A of MTJ device 1100 includes a pair of MTJ bits 100A, 100B stacked one on top of another. In general, MTJ bit 100A (MTJ1) and MTJ bit 100B (MTJ2) may be of any type and have any structure. MTJ bits 100A, 100B may be substantially similar in configuration. Alternatively, one or more characteristics (e.g., electrical and/or physical characteristics) of one of MTJ bits 100A, 100B may be different from the other. In some embodiments, as illustrated in FIG. 5B, both MTJ bit 100A and MTJ bit 100B may have the structure as described with reference to MTJ bit 100 of FIG. 1. That is, MTJ bit 100A may have a multi-layer structure comprising a fixed region 20A, an intermediate region 30A, and a free region 50A, and MTJ bit 100B may have a multi-layer structure comprising a fixed region 20B, an intermediate region 30B, and a free region 50B. Each of the different regions (fixed region, intermediate region, free region, etc.) of MTJ bits 100A and 100B may have a configuration (number of layers, thickness, etc.), materials (material composition of different layers, etc.), etc., within the ranges described previously with reference to the corresponding region of MTJ bit 100 (of FIG. 1). For example, in some embodiments, free region 50A may be similar in structure and/or material composition to free region 50 of FIG. 1, and free region 50B of MTJ bit 100B may have a different structure. Since details (e.g., structure, dimensions, materials, etc.) of the different regions (e.g., fixed region, intermediate region, free region, etc.) of MTJ bit 100 were described previously, they are not described again. In the discussion of the different embodiments below, stacked MTJ bits will be represented as illustrated in FIG. 5A (i.e., without illustrating their internal structure and configuration). It should be understood that, in these illustrations, each stacked MTJ bit can have the same or a different structure than another stacked MTJ bit, and that these stacked MTJ bits can have any now-known or future developed structure and configuration. As will be described in greater detail below, those of ordinary skill in the art will understand that MTJ cell 200A may have a greater number of vertically-stacked MTJ bits, e.g., three or more MTJ bits.

In MTJ cell 200A, the stacked MTJ bits 100A and 100B may be separated by a cap layer 25 and a seed layer 15. Cap layer 25 and/or seed layer 15 may at least partially isolate (e.g., magnetically) the vertically-stacked MTJ bits 100A, 100B from each other. In some embodiments, as illustrated in FIGS. 5A and 5B, both cap layer 25 and seed layer 15 may be provided between the stacked MTJ bits 100A and 100B. However, in other embodiments, only one of seed layer 15 or cap layer 25 may be provided between the stacked MTJ bits of an MTJ cell. It is also contemplated that, in some embodiments, additional layers of materials may be provided between the vertically-stacked MTJ bits of an MTJ cell (e.g., MTJ bits 100A, 100B of MTJ cell 200A). In some embodiments, seed layer 15 may include one or more of nickel (Ni), chromium (Cr), nickel-chromium (NiCr) alloy (e.g., about 50% nickel, about 50% chromium), tantalum (Ta), platinum (Pt), ruthenium (Ru, etc., and may have a thickness of about 20-100 Å, preferably about 40-80 Å, or more preferably about 50-70 Å. And, in some embodiments, cap layer 25 may include one or more of tantalum (Ta), titanium (Ti), tungsten (W), etc., and have a thickness of about 50-150 Å, or preferably about 70-120 Å, or more preferably about 90-110 Å. In some embodiments, as shown in FIGS. 5A and 5B, a seed layer 15 may also be provided between MTJ cell 200A and first electrode 10 (i.e., MTJ bit 100A and first electrode 10), and a cap layer 25 may be provided between MTJ cell 200A and second electrode 70 (i.e., MTJ bit 100B and second electrode 70). In some embodiments, one or both of seed layer 15 and cap layer 25 may be provided between MTJ cell 200A and first electrode 10, and MTJ cell 200A and second electrode 70.

FIG. 6A is a simplified schematic illustration of the critical (IC) distribution and write (IW) currents of MTJ bits 100A and 100B of FIG. 5A. With reference to FIG. 6A, MTJ bit 100A (i.e., MTJ1) may have a critical current IC-1 and a write current IW-1 greater than the largest critical current IC-1 in the distribution of IC-1, and MTJ bit 100B (i.e., MTJ2) may have a critical current IC-2 and a write current IW-2 greater than the largest critical current IC-2 in the distribution of IC-2. Furthermore, the write current IW-1 may be smaller than the minimum critical current IC-2 in the distribution of IC-2, so that the MTJ 100B is not programmed while MTJ 100A is programmed by using write current IW-1. FIG. 6A shows the distribution of critical currents for different bits in the MRAM array. In some embodiments, as illustrated in FIG. 6A, the critical current IC-2 of MTJ BIT 100B may be greater than the critical current IC-1 of MTJ BIT 100A (i.e., IC-2>IC-1). As explained previously, the critical current IC-2 of MTJ bit 100B may be increased (over IC-1 of MTJ bit 100A) by selecting a stack, structure, interface, material composition, etc. that results in a higher critical current. For example, the intermediate regions and/or free regions of MTJ bit 100A and 100B may be configured (e.g., by tailoring their structure, composition, thickness, magnetic moments, size, etc.) such that IC-2>IC-1. In some embodiments, the fabrication process of the stacked MTJ bits may in itself result in different critical currents for the upper and lower MTJ bits (e.g., as a result of size differences resulting from sloped side walls) of MTJ cell 200A. It should be noted that FIG. 6A uses a single critical current IC-1 for MTJ bit 100A, and a single critical current IC-2 for MTJ bit 100B, to represent their critical currents in the up direction (direction of the arrow in FIG. 5A) and their critical currents in the down direction (opposite to direction of the arrow in FIG. 5A). However, this is only exemplary (for example, by assuming, IC-1=IC-1, U=|IC, D| (for MTJ bit 100A) and IC-2=IC-2, U=|IC-2, D| (for MTJ bit 100B)).

FIG. 6B illustrates the relationship between the critical currents and the write currents of MTJ bits 100A and 100B of FIG. 5A in both the up and down directions in an exemplary embodiment. With reference to FIG. 6B, IW-1, U is the write current of MTJ bit 100A in the up direction. This (IW-1, U) is the current needed to switch MTJ bit 100A (or MTJ1) to the AP state. And, IC-1,U is the critical current of MTJ bit 100A in the up direction. Similarly, IW-1, D is the current needed to switch MTJ bit 100A to the P state, and IC-1, D is the critical current of MTJ bit 100A in the down direction. Similar to FIG. 6A, FIG. 6B also shows the distribution of critical currents IC-1,U and IC-1, D for different bits in the MRAM array. As illustrated in FIG. 6B, for MTJ bit 100A, IW-1, U is greater than IC-1, U (i.e., IW-1, U>IC-1, U) and |IW-1, D|>|IC-1, D|. Similarly, for MTJ bit 100B, its write current in the up direction, IW-2, U, (the current needed to switch MTJ bit 100B or MTJ2 to the AP state) is greater than its critical current in the up direction, IC-2,U, and IW-2, D (the current needed to switch MTJ bit 100B to the P state) is greater than IC-2,D, the critical current in the down direction. MTJ bits 100A and 100B may be configured such that, IC-2,U>IC-1,U, and |IC-2,D|>|IC-1,D|. In general, the write current IW-1, U (IW-1, D) is smaller than the minimum of critical current IC-2, U(IC-2, D) in the distribution of IC-2, U (IC-2, D) so that MTJ 100B is not programmed while the MTJ 100A is programmed by using write current IW-1, U (IW-1, D). It should be noted that this is only exemplary, and in some embodiments, the critical currents of MTJ1 may be greater than the critical current of MTJ2. In general, in an MTJ cell of the current disclosure comprising multiple vertically stacked MTJ bits, the individual MTJ bits may be configured to have different critical currents.

With renewed reference to FIG. 5A, each of MTJ bits 100A and 100B of MTJ cell 200A has two resistance states corresponding to its state of magnetization (i.e., P and AP state). When MTJ bit 100A is in the P state, its resistance is R1, Min. And, when MTJ bit 100A is in the AP state, its resistance is R1, Max=R1, Min+ΔR1. Similarly, the resistance of MTJ bit 100B in the P and AP states are R2, Min and R2, Max=R2, Min+ΔR2, respectively. To determine the resistance of the stacked MTJ bits 100A and 100B, a read current is directed (in the direction of the arrow in FIG. 5A) through the MTJ cell 200A and the resistance of MTJ cell 200A is measured. Since MTJ cell 200A comprises vertically stacked MTJ bits 100A and 100B electrically connected in series, the electrical resistance of MTJ cell 200A is the sum of the resistances of MTJ bits 100A, 100B. Since each MTJ bit 100A and 100B has two resistance states (based on the magnetization state of MTJ bits 100A, 100B), MTJ cell 200A will have four (i.e., 2²) resistance states. Table I below indicates the relationship between the magnetization state of each MTJ bit 100A, 100B (of FIG. 5A) and the corresponding resistance of the overall MTJ cell 200A.

TABLE I

Relationship between magnetization and resistance states of MTJ cell 200A.

| Resistance | Magnetization state | | |
|---|---|---|---|
| State of MTJ cell 200A | MTJ BIT 100A | MTJ BIT 100B | Resistance of MTJ cell 200A |
| State 1 | P | P | $R_{1,Min} + R_{2,Min}$ |
| State 2 | AP | P | $R_{1,Max} + R_{2,Min} = R_{1,Min} + R_{2,Min} + \Delta R_1$ |
| State 3 | P | AP | $R_{1,Min} + R_{2,Max} = R_{1,Min} + R_{2,Min} + \Delta R_2$ |
| State 4 | AP | AP | $R_{1,Max} + R_{2,Max} = R_{1,Min} + R_{2,Min} + \Delta R_1 + \Delta R_2$ |

With reference to FIG. 5A and Table I, when both MTJ bits 100A and 100B are in their P states, MTJ cell 200A is in resistance state 1. When in this resistance state, a current passing through MTJ cell 200A will register a resistance of R1, Min+R2, Min. Similarly, when MTJ bit 100A is in its AP state and MTJ bit 100B is in its P state, MTJ cell 200A is in resistance state 2 (where R=R1, Min+R2, Min+ΔR1). When MTJ bit 100A is in its P state and MTJ bit 100B is in its AP state, MTJ cell 200A is in resistance state 3 (where R=R1, Min+R2, Min+ΔR2). And, when both MTJ bits 100A and 100B are their AP state, MTJ cell 200A is in resistance state 4 (where R=R1, Min+R2, Min+ΔR1+ΔR2). In some embodiments, the four resistance states of MTJ cell 200A may be distinct and unique resistance values. Compared to an MTJ cell having a single MTJ bit (e.g., MTJ bit 100 of FIG. 1) with two resistance states (RMin and RMax), the exemplary MTJ cell 200A of FIG. 5A that includes a pair of stacked MTJ bits 100A and 100B includes four distinct resistance states. As a person or ordinary skill in the art would recognize, increasing the number of resistance states of the MTJ cells of an MTJ device 1000 will increase the amount of data that can be stored in MTJ device 1000 (e.g., in memory applications).

Although not a requirement, in some embodiments, for ease of distinguishing between the difference resistance states of MTJ cell 200A, MTJ bits 100A and 100B may be configured such that ΔR1 is not equal to ΔR2. In some embodiments, there may be substantial difference (e.g., ΔR2≥about 1.5 ΔR1, ≥about 2 ΔR1, ≥about 2.5 ΔR1, etc.) between ΔR1 and ΔR2. In some embodiments, the difference between ΔR1 and ΔR2 may not be significant. For example, when a technique such as, for example, self-referenced read (or another suitable technique), is used to determine the resistance state of MTJ cell 200A, a substantial difference between ΔR1 and ΔR2 may not be required.

As would be recognized by a person of ordinary skill in the art, data is written or stored in MTJ device 1100 by selectively switching between the different magnetization states of MTJ bits 100A and 100B of each MTJ cell 200A (e.g., to select one of the resistance states 1-4 of Table I). With reference to FIGS. 6A and 6B, to switch MTJ bit 100A to its AP state, a write current IW-1, U is applied to MTJ cell 200A. Since the magnitude of this current is greater than the critical current IC-1, U of MTJ bit 100A, but smaller than the critical current IC-2, U of MTJ bit 100B, only the magnetization state of MTJ bit 100A is switched to AP. That is, the magnetization state of MTJ bit 100B remains unchanged, since the applied current is below the bit's critical current. Similarly, to switch MTJ bit 100A to its P state, a write current IW-1, D is applied to MTJ cell 200A. And, since |IC-2, D|>|IW-1, D|>|IC-1, D|, only MTJ BIT 100A is switched to P and the magnetization state of MTJ bit 100B remains unchanged. To switch the magnetization state of MTJ bit 100B to AP, a write current IW-2, U>IC-2, U is applied to MTJ cell 200A. However, since IW-2, U is also greater than IC-1, U (i.e., the critical current of MTJ bit 100A in the up direction), the magnetization state of MTJ bit 100A also is switched to AP due to the application of this current. Therefore, the magnetization state of MTJ bit 100A should now be switched back to its initial state (if the initial state is not AP). For example, if the initial state of MTJ bit 100A is P, a write current IW-1, D is applied to MTJ cell 200A following the application of IW-2, U to switch MTJ bit 100A back to P. Similarly, to switch MTJ bit 100B to P, a write current IW-2, D>IC-2, D (and >IC-1, D) is first applied to MTJ cell 200A followed by a write current of sufficient magnitude to switch MTJ bit 100A alone back to its initial state (if the initial state is not P).

Figure 7A:
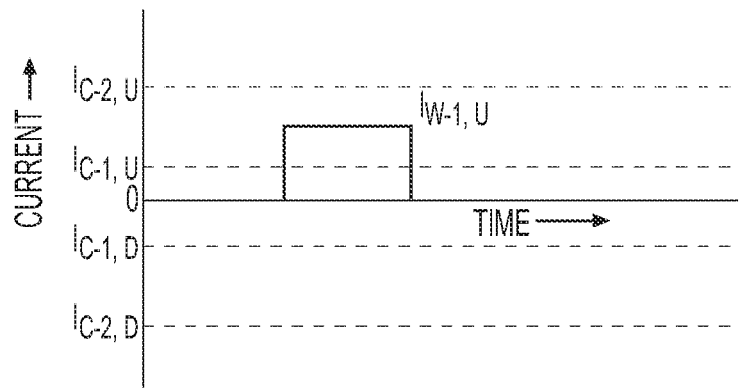
Figure 7B:
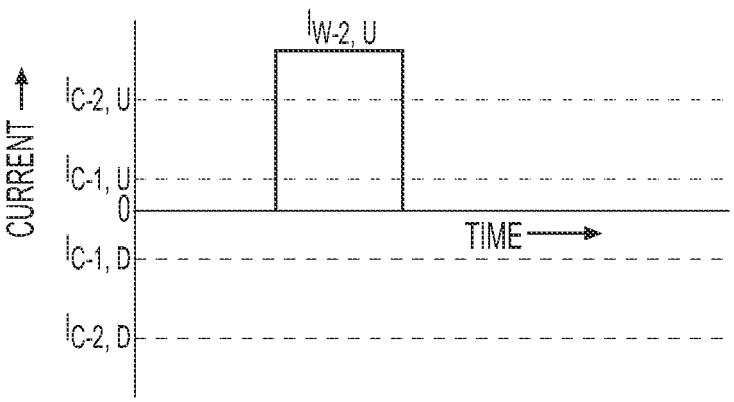
Figure 7C:
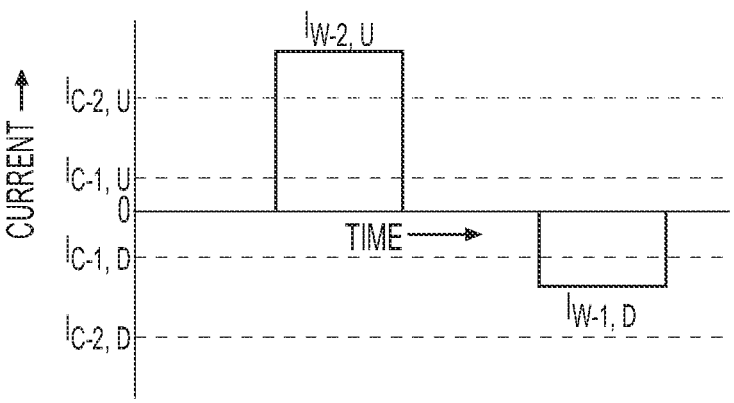

FIGS. 7A-7L are graphs showing exemplary current patterns that may be used to switch MTJ cell 200A between its different resistance states. In these figures, the y-axis represents current and the x-axis represents time (both in arbitrary units). As illustrated in FIG. 7A, for example, to switch MTJ cell 200A from state 3 (where MTJ bit 100A is in the P state and MTJ bit 100B is in the AP state) to state 4 (where both MTJ bits 100A and 100B are in the AP state) (identified in FIG. 7A as state 3 (P, AP) to state 4 (AP, AP)), a current IW-1, U greater in magnitude than the critical current of MTJ bit 100A in the up direction (IC-1, U) is applied to the MTJ cell 200A. Since IW-1, U is less than IC-2, U, the state of MTJ bit 100B remains unchanged (i.e., MTJ bit 100B remains in the AP state). As illustrated in FIG. 7B, to switch MTJ cell 200A from state 2 (MTJ bit 100A in AP and MTJ bit 100B in P) to state 4 (MTJ bits 100A and 100B in AP state), a current IW-2, U>IC-2, U is applied to MTJ cell 200A, so as to change the magnetization state of MTJ bit 100B from P to AP. Since IW-2, U is greater than IC-1, U, this current will also tend to change the magnetization state of MTJ bit 100A to AP. However, since MTJ bit 100A is already in AP state, it remains in this state (i.e., remains unchanged). To switch MTJ cell 200A from state 2 (AP, P) to state 3 (P, AP), a current IW-2, U>IC-2, U is first applied, as shown in FIG. 7C. Since IW-2, U is greater than IC-2, U, this current will change MTJ bit 100B to the AP state. Since IW-2, U is also greater than IC-1, U, it will also tend to change MTJ bit 100A to the AP state. However, since MTJ bit 100A is already in the AP state, MTJ bit 100A will remain unchanged in this state. As shown in FIG. 7C, a subsequent current IW-1, D having a magnitude greater than IC-1, D (but less than IC-2, D) is then applied to change the state of MTJ bit 100A to P state.

Figure 7D:
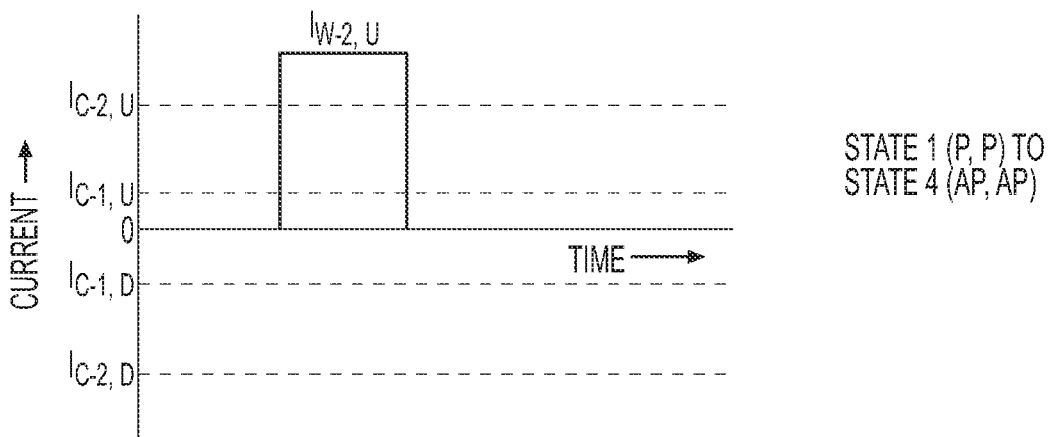
Figure 7E:
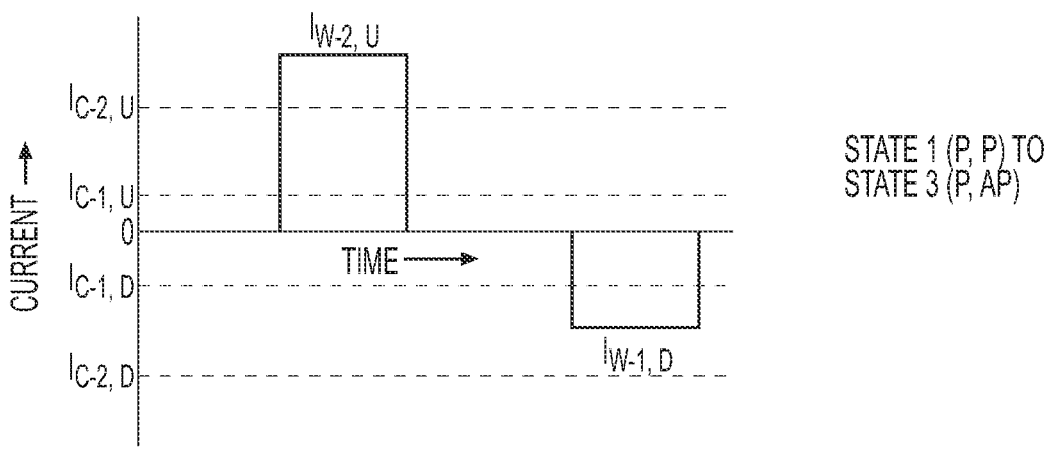
Figure 7F:
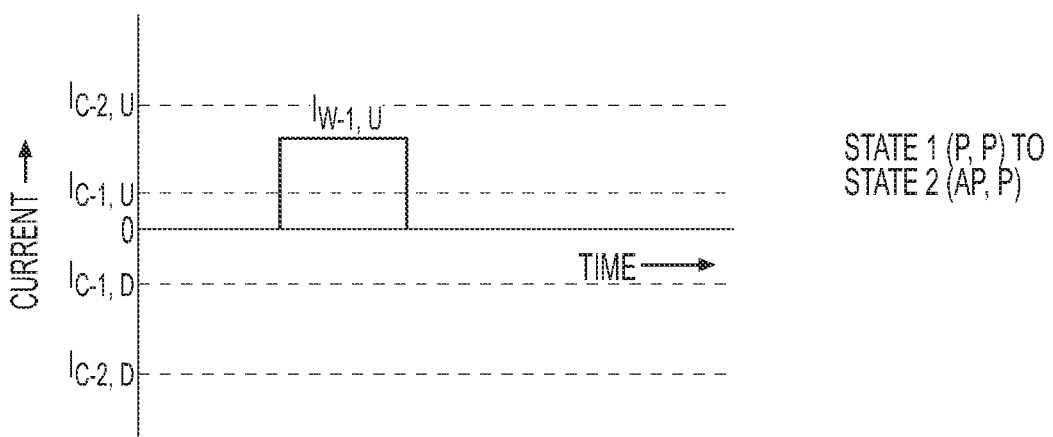
Figure 7G:
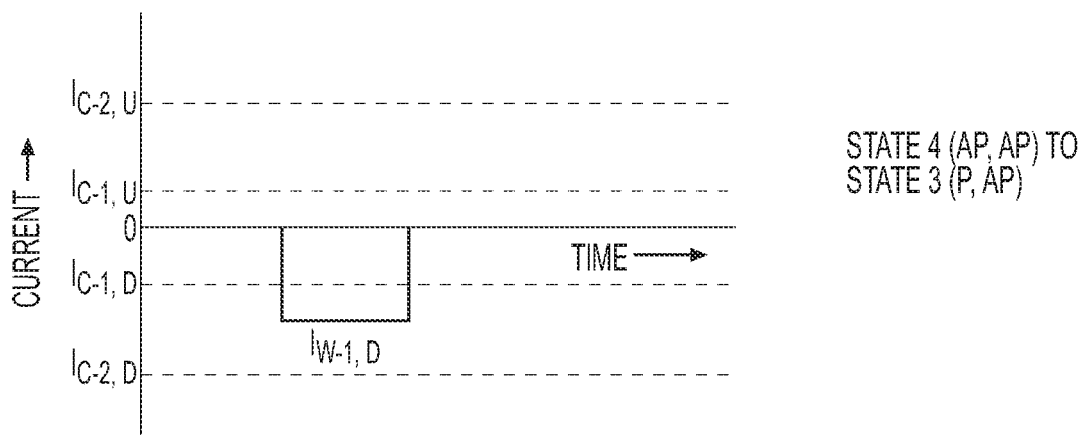
Figure 7H:
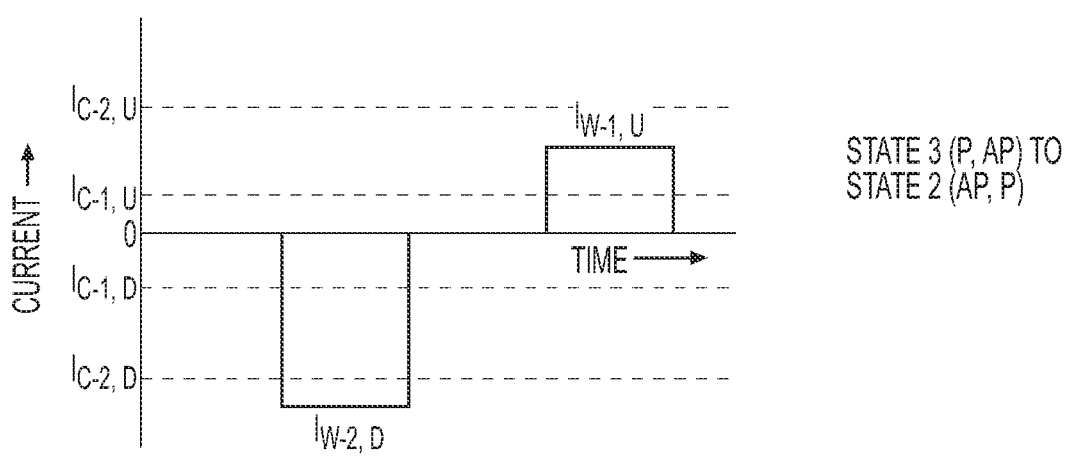
Figure 7I:
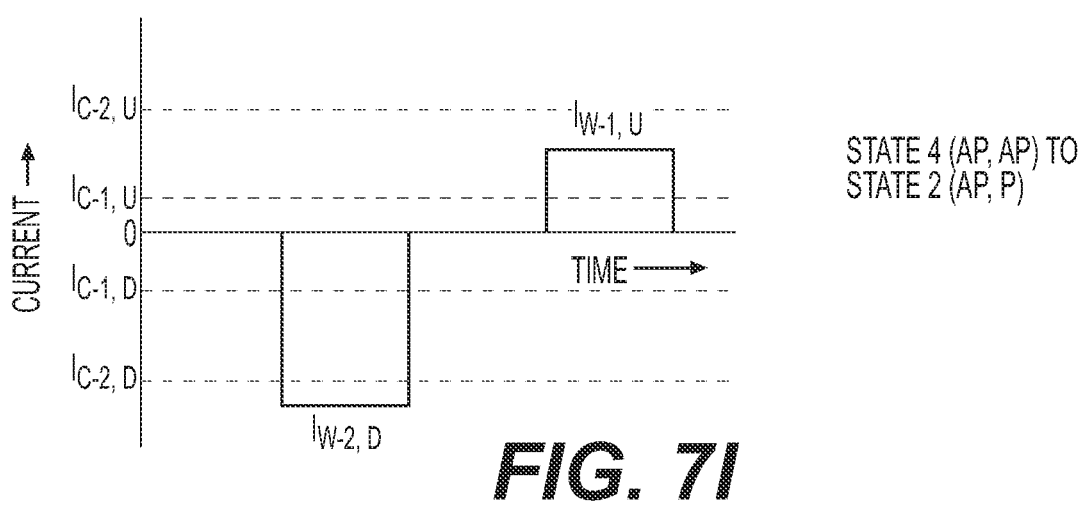

FIG. 7D illustrates the current that may be applied to switch MTJ cell 200A from state 1 (P, P) to state 4 (AP, AP). Since both MTJ bits 100A and 100B are to be changed to the AP state, a current IW-2, U having a magnitude greater than both IC-2, U and IC-1, U may be applied to change the magnetization states of MTJ bits 100A and 100B from P to AP. As shown in FIG. 7E, to switch MTJ cell 200A from state 1 (P, P) to state 3 (P, AP), a current IW-2, U is first applied to switch both MTJ bits 100A and 100B to AP state. A subsequent current $I_{W-1, D}$ is then applied to switch MTJ bit 100A alone back to P. To switch MTJ cell 200A from state 1 (P, P) to state 2 (AP, P), as shown in FIG. 7F, a current $I_{W-1, U}$ is applied to only change MTJ bit 100A to AP. Since this current is smaller than $I_{C-2, U}$, MTJ bit 100B remains unchanged in P state. To switch MTJ cell 200A from state 4 (AP, AP) to state 3 (P, AP), as shown in FIG. 7G, a current $I_{W-1, D}$ is applied to switch MTJ bit 100A to P without affecting MTJ bit 100B. FIG. 7H shows the current pattern to switch MTJ cell 200A from state 3 (P, AP) to state 2 (AP, P). First, a current $I_{W-2, D}$ is applied to switch both MTJ bits 100A and 100B to P state. A current $I_{W-1, U}$ is then applied to switch MTJ bit 100A back to AP state. FIG. 7I shows a current pattern that can be used to switch MTJ cell 200A from state 4 (AP, AP) to state 2 (AP, P). A current $I_{W-2, D}$ may first be applied to switch both MTJ bits 100A and 100B to P state. A current $I_{W-1, U}$ is then applied to switch MTJ bit 100A back to AP state.

Figure 7J:
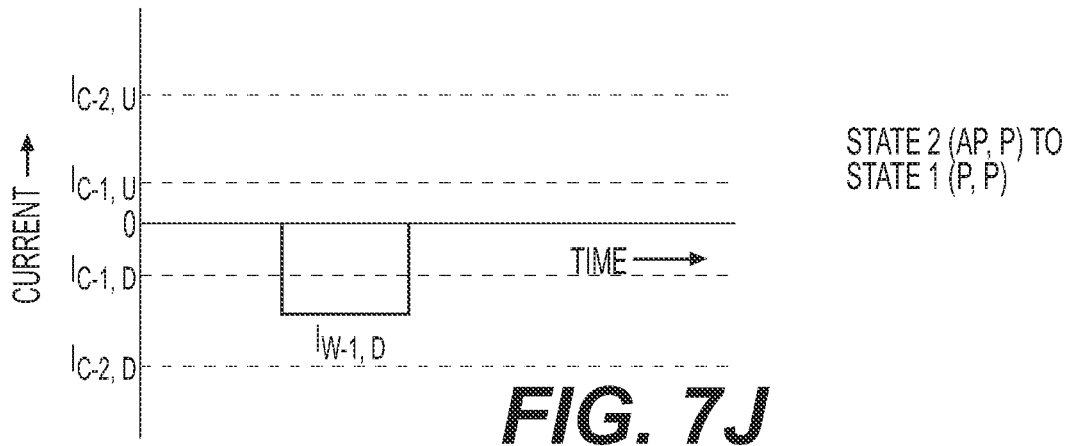
Figure 7K:
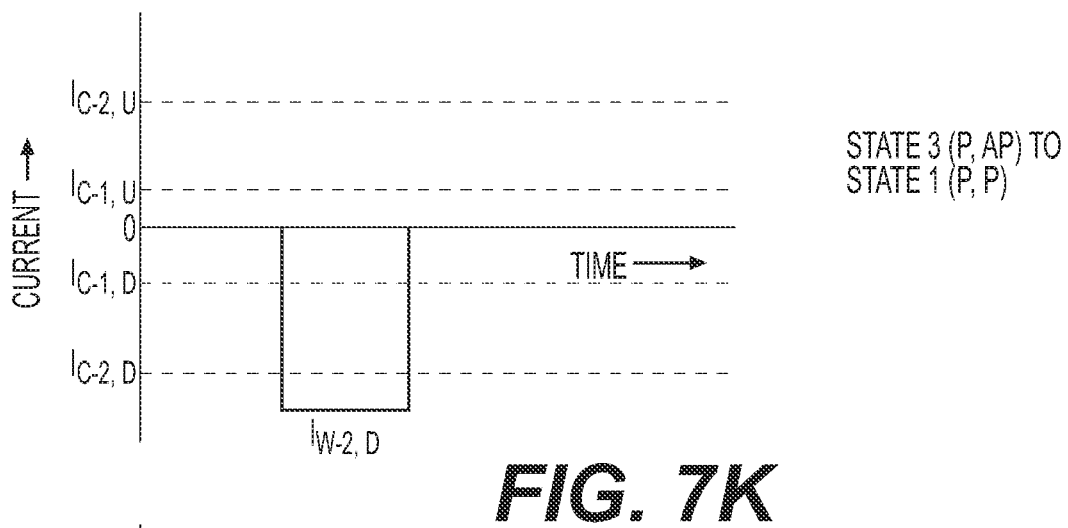
Figure 7L:
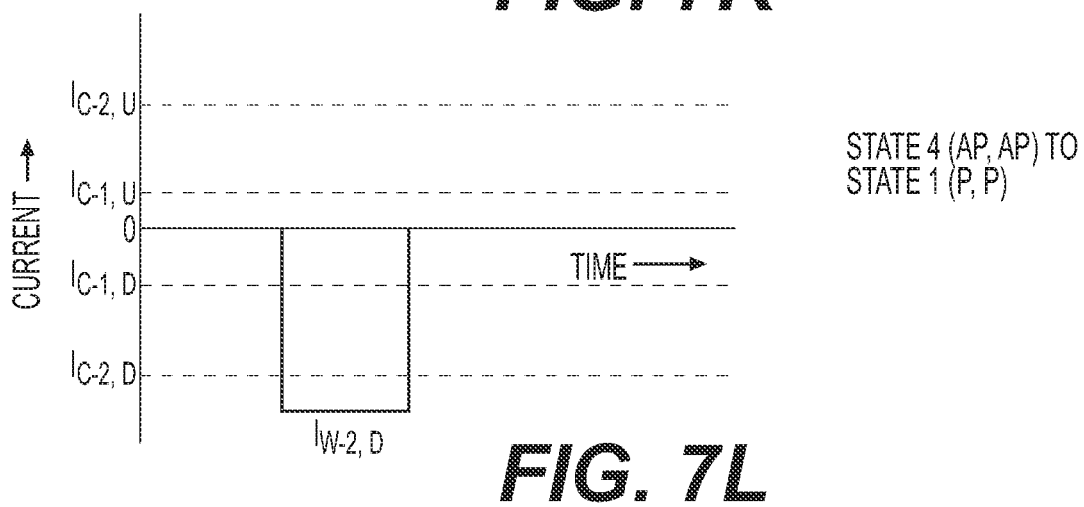

As shown in FIG. 7J, to switch MTJ cell 200A from state 2 (AP, P) to state 1 (P, P), a current $I_{W-1, D}$ is applied to switch MTJ bit 100A to P state without affecting MTJ bit 100B. As shown in FIG. 7K, to switch MTJ cell 200A from state 3 (P, AP) to state 1 (P, P), a current $I_{W-2, D}$ is applied to switch MTJ bit 100B to P state. Since MTJ bit 100A is already in P state, it remains unaffected by this current. And, FIG. 7L shows a current pattern that may be used to switch MTJ cell 200A from state 4 (AP, AP) to state 1 (P, P). A current $I_{W-2, D}$, having a magnitude greater than both $I_{C-1, D}$ and $I_{C-2, D}$ may be applied to change the magnetization states of both MTJ bits 100A and 100B to P.

In general, to switch between the different states using the current patterns or programs of FIGS. 7A-7L, the initial state of MTJ cell 200A needs to be known. If the initial state is not already known, the initial state is first read by passing a read current through MTJ cell 200A as discussed previously (e.g., a pre-read or a self-referencing read). After determining the initial state, the required current pattern is applied to switch MTJ cell 200A to the desired state. As can be seen from FIGS. 7A-7L, six unique current patterns or programs may be used for the 12 possible transitions between the four resistance states of MTJ cell 200A. These six unique current patterns include, for example, a 1st pattern (FIGS. 7A and 7F), a 2nd pattern (FIGS. 7B and 7D), a 3rd pattern (FIGS. 7C and 7E), a 4th pattern (FIGS. 7G and 7J), a 5th pattern (FIGS. 7H and 7I), and a 6th pattern (FIGS. 7K and 7L). That is, the 1st current pattern, illustrated in FIGS. 7A and 7F, may be used to switch MTJ cell 200A from state 3 to state 4, and from state 1 to state 2, etc.

TABLE II

Exemplary current patterns to switch
MTJ cell 200A to different states.

| To Switch to State: | Use Current pattern: | Illustrated in: |
|---|---|---|
| 1 (P, P) | $I_{W-2, D}$ | FIGs. 7K and 7L |
| 2 (AP, P) | $I_{W-2, D}$, $I_{W-1, U}$ | FIGs. 7H and 7I |
| 3 (P, AP) | $I_{W-2, U}$, $I_{W-1, D}$ | FIGs. 7C and 7E |
| 4 (AP, AP) | $I_{W-2, U}$ | FIGs. 7B and 7D |

Some of above-described current patterns may be further combined. For example, a single current pattern may be used to switch MTJ cell 200A to a desired state (e.g., state 1, state 2, state 3, and state 4) without regard to the initial state of MTJ cell 200A. Table II lists the current patterns that may be used to switch MTJ cell 200A to each state irrespective of its initial state. With reference to Table II, applying a current $I_{W-2, D}$ will switch MTJ cell 200A to state 1 (P, P) irrespective of what state the MTJ cell 200A was initially in. As indicated in Table II, such a current pattern is illustrated in FIGS. 7K and 7L. As described with reference to FIGS. 7K and 7L, applying a current $I_{W-2, D}$ will switch MTJ cell 200A from both states 3 (P, AP) and 4 (AP, AP) to state 1 (P, P). If the MTJ cell 200A is initially in state 2 (AP, P), applying current $I_{W-2, D}$ also will switch MTJ bit 100A to its P state because $|I_{W-2, D}|>|I_{C-1, D}|$. Although $|I_{W-2, D}|>|I_{C-2, D}|$, since MTJ bit 100B is already in P state, it will remain unchanged by current $I_{W-2, D}$. Thus, applying a current $I_{W-2, D}$ will switch MTJ cell 200A to state 1 irrespective of what state MTJ cell 200A is in before the application of this current. Similarly, as indicated in row 2 of Table II, a current pattern of $I_{W-2, D}$, $I_{W-1, U}$ (i.e., applying a current $I_{W-2, D}$ followed by current $I_{W-1, U}$) will switch MTJ cell 200A to state 2 from all states. And, a current pattern of $I_{W-2, U}$, $I_{W-1, D}$ will switch MTJ cell 200A to state 3 regardless of initial state, and a current pattern of $I_{W-2, U}$ will switch MTJ cell 200A to state 4 from all initial states (i.e., irrespective of its initial state). Thus, in some embodiments, four current patterns (or programs) may be used to switch (or write) MTJ cell 200A to its four resistance states irrespective of its initial resistance state.

MTJ cell 200A may be switched to a desired state (e.g., states 1-4) using a particular current pattern (e.g., one of FIGS. 7A-7L) if the initial state of MTJ cell 200A is known prior to switching. For example, if it is desired to switch MTJ cell 200A to state 1 (or write MTJ cell 200A to state 1), and it is known that MTJ cell 200A is currently in state 2, a current pattern $I_{W-1, D}$ (as shown in FIG. 7J) may be applied to switch MTJ cell 200A to state 1 from state 2. However, if the initial state of MTJ cell 200A is not known, the initial state will first need to be determined (as state 2), prior to the application of current pattern $I_{W-1, D}$ to switch MTJ cell 200A to state 1. Alternatively, as indicated in row 1 of Table II, a current pattern $I_{W-2, D}$ may be applied to switch MTJ cell 200A to state 1 without determining its initial state. In some applications, applying current pattern $I_{W-2, D}$ to switch MTJ cell 200A to state 1 may have advantages (e.g., algorithm simplicity, speed, etc.) because the initial state of MTJ cell 200A does not have be determined. However, applying current pattern $I_{W-2, D}$ may apply a larger than necessary write current (and bias voltage) ($I_{W-1, D}$) to switch MTJ cell 200A from state 2 to state 1, and therefore over-stress MTJ cell 200A. Repeated over-stressing of MTJ cell 200A may, in some embodiments, decrease the life of MTJ device 1000. Thus, in some embodiments, it may be advantageous to determine the initial state of MTJ cell 200A and then apply only the required amount of write current to switch MTJ cell 200A to the desired state.

As explained previously with reference to FIGS. 5A and 5B, MTJ bits 100A and 100B (of FIG. 5A) can be any type of MTJ bit. In some embodiments, one or both of MTJ bits 100A and 100B may have a dual spin filter configuration. FIG. 8A illustrates an exemplary MTJ device 1100' having an MTJ cell 200B comprising a dual spin filter MTJ bit 100A (e.g., an MTJ bit having a dual spin configuration) positioned below a single MTJ bit 100B (e.g., an MTJ bit not having a dual spin configuration). As explained with reference to FIG. 3, the dual spin filter MTJ bit 100A may be formed by a free region 50A formed between two fixed regions 20A, 20B and two intermediate regions 30A, 30B. And, a single MTJ bit 100B may be formed above the dual spin filter MTJ bit 100A by providing another intermediate region 30C and free region 50C above fixed region 20B. In some embodiments, as illustrated in FIG. 8A, first and second electrodes 10, 70 may also be provided on either side of the MTJ cell 200B to provide electrical connectivity to the bit. As explained with reference to MTJ bit 100 of FIG. 1, these electrodes may enable the MTJ cell 200B to be accessed by an access transistor T (or other suitable select device) of MTJ device 1100'.

As described with reference to MTJ cell 200A of FIG. 5A, MTJ cell 200B of FIG. 8A may be configured such that MTJ bits 100A and 100B have different critical currents. In some embodiments, the critical current of the dual spin filter MTJ bit 100A may be lower than the critical current of MTJ bit 100B. However, in some embodiments, the critical current of MTJ bit 100A may be greater than the critical current of MTJ bit 100B. It should be noted that, although FIG. 8A illustrates the dual spin filter MTJ bit 100A as being positioned below the single MTJ bit 100B, this is only exemplary. In some embodiments, the dual spin filter MTJ bit 100A may be positioned above the single MTJ bit 100B. In some embodiments, as illustrated in FIG. 8B, an exemplary MTJ device 1100'' of the current disclosure may include an MTJ cell 200C with two dual spin filter MTJ bits 100A, 100B stacked one on top of another. With reference to FIG. 8B, dual spin filter MTJ bit 100A may comprise a free region 50A formed between two fixed regions 20A, 20B with intermediate regions 30A, 30B positioned between each fixed and free regions. And, dual spin filter MTJ bit 100B may comprise a free region 50B formed between two fixed regions 20B, 20C with intermediate 30C and 30D positioned between each fixed and free region. Although not a requirement, in some embodiments, a first and second electrode 10, 70 may be provided on either side of MTJ cell 200C to enable transistor T (or any other suitable select device) to access MTJ cell 200C. In some embodiments, one or both the electrodes 10, 70 may be eliminated. Similar to MTJ cell 200B, MTJ cell 200C (of FIG. 8B) may be configured such that MTJ bits 100A and 100B have different critical currents.

MTJ cells 200B (of FIG. 8A) and 200C (of FIG. 8B) may function in the same manner as previously discussed with reference to MTJ cell 200A of FIG. 5A. For example, with reference to FIGS. 8A and 8B, MTJ bit 100A may be configured such that, IW-1, U>IC-1, U (i.e., the current needed to switch MTJ BIT 100A to the AP state is greater than the critical current of MTJ bit 100A in the up direction), and |IW-1, D|>|IC-1,D| (i.e., the current needed to switch MTJ bit 100A to the P state is greater than the critical current of MTJ bit 100A in the down direction. And, MTJ bit 100B may be configured such that IW-2, U>IC-2, U (i.e., the current needed to switch MTJ bit 100B to the AP state is greater than the critical current of MTJ bit 100B in the up direction), and |IW-2, D|>|IC-2, D| (i.e., the current needed to switch MTJ bit 100B to the P state is greater than the critical current of MTJ bit 100B in the down direction). Further, MTJ bits 100A and 100B may be configured such that IC, 1≠IC, 2. In some embodiments, MTJ bits 100A and 100B may be configured such that, IC-2, U>IC-1, U, and |IC-2, D|>|IC-1, D|. As discussed with reference to MTJ cell 200A of FIG. 5A, MTJ bits 200B and 200C of FIGS. 8A and 8B may have four resistance states (see Table I), which may be individually selected using the exemplary current patterns of FIGS. 7A-7L or the patterns of Table II.

FIG. 9A illustrates an exemplary MTJ device 1200 having an MTJ cell 200D with three MTJ bits 100A, 100B, and 100C stacked one on top of another. The stacked MTJ bits 100A, 100B, and 100C may be separated from one another by a nonmagnetic region 35. The nonmagnetic region 35 may be made of any material that is electrically conductive, and in some embodiments, configured to partly magnetically isolate the stacked MTJ bits from each other. In some embodiments, the nonmagnetic region 35 may include one or more of tantalum (Ta), titanium (Ti), tungsten (W), nickel (Ni), chromium (Cr), magnesium (Mg), platinum (Pt), ruthenium (Ru), etc. In some embodiments, the nonmagnetic region 35 may include one or more thin oxide layers next to free regions to improve magnetic properties of the free regions. The thickness of nonmagnetic region 35 may depend upon the material selected for this region and the degree of magnetic isolation desired between the stacked MTJ bits 100A, 100B, and 100C. In some embodiments, a nonmagnetic region 35 may also be provided on one or both sides of MTJ cell 200D (see nonmagnetic region 35 provided on the bottom side of MTJ cell 200D in FIG. 9A). In some embodiments, electrodes may also be provided on one or both sides of MTJ cell 200D (see second electrode 70 provided on the top side of MTJ cell 200D in FIG. 9A).

In general, MTJ bits 100A, 100B, and 100C may be any type of MTJ bit (dual spin filter configuration, single MTJ configuration, etc.) and may have any suitable stack/structure. In some embodiments, as illustrated in FIG. 9A, each MTJ bit 100A, 100B, 100C of MTJ cell 200D may be comprised of a fixed region (20A, 20B, 20C) and a free region (50A, 50B, 50C) separated by an intermediate region (30A, 30B, 30C). In some embodiments, each of these MTJ bits (100A, 100B, 100C) may be similar in structure. However, this is not a requirement. For example, FIG. 9B illustrates an MTJ device 1200 with an MTJ cell 200D having three MTJ bits 100A, 100B, 100C stacked one on top of another. MTJ bit 100 A of FIG. 9B is similar in structure to MTJ bit 100A of FIG. 9A. However, MTJ bits 100B and 100C share a fixed region 20B with two free regions 50B and 50C positioned on either side.

Figure 17A:
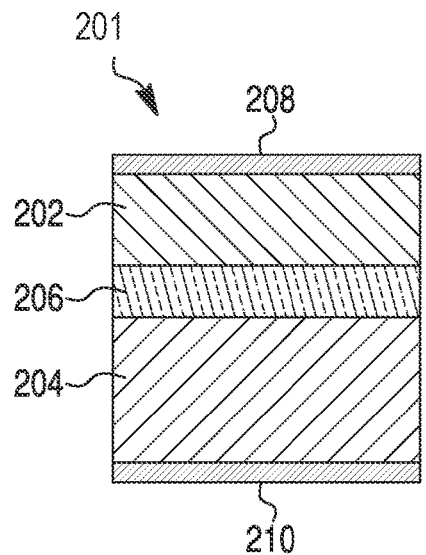
Figure 17B:
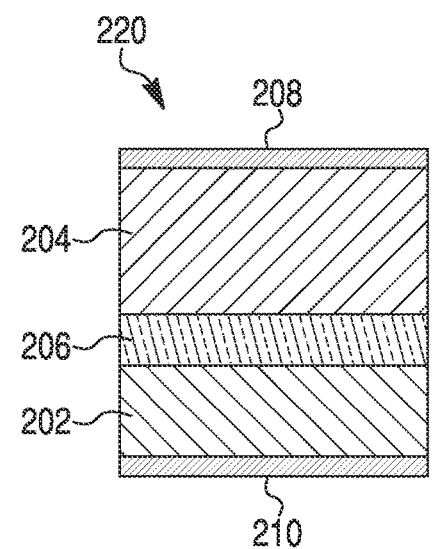
Figure 17C:
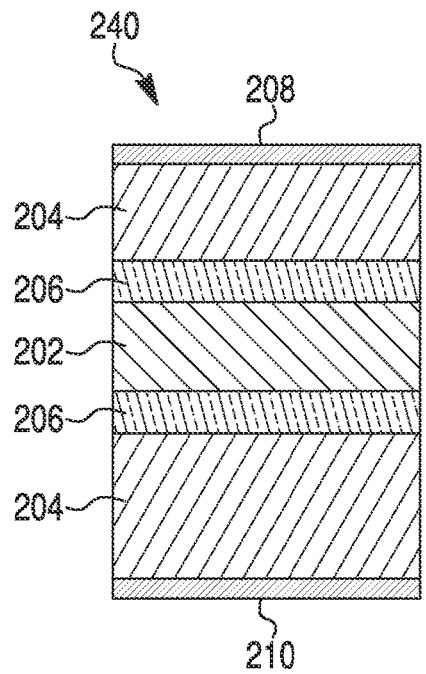
Figure 17D:
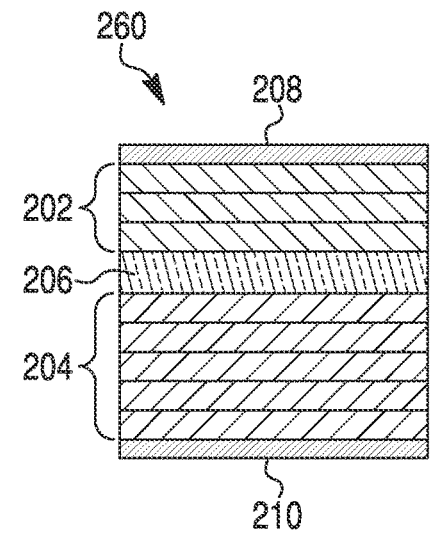

Further MTJ bits are described elsewhere herein (see, e.g., MTJ bits 201, 220, 240, 260 described with respect to FIGS. 17D-17D). These MTJ bits may also be suitable for use in any embodiment of the present disclosure.

FIG. 9C illustrates an MTJ device 1200 with an MTJ cell 200D having three MTJ bits 100A, 100B, 100C stacked one on top of another. Each of MTJ bits 100A, 100B, 100C may have any now-known or future-developed configuration and structure (same or different from each other). Similar to the stacked MTJ bits of MTJ cell 200A of FIG. 5A, the stacked MTJ bits 100A, 100B, and 100C of MTJ cell 200D may be separated from each other by a cap layer 25 and a seed layer 15. In some embodiments, cap layer 25 and seed layer 15 may at least partly magnetically isolate the stacked MTJ bits 100A, 100B, and 100C from one another. In some embodiments, only one of cap layer 25 or seed layer 15 may be provided between MTJ bits 100A, 100B, 100C. In some embodiments, as illustrated in FIG. 9C, electrodes (e.g., first electrode 10 and a second electrode 70) may be provided on either side of MTJ cell 200D to provide electrical connectivity to MTJ cell 200D. Although not a requirement, in some embodiments, a seed layer 15 (and/or a cap layer 25) may be provided between MTJ cell 200D and first electrode 10 and a cap layer 25 (and/or a seed layer 15) may be provided between MTJ cell 200D and first electrode 10.

As explained with reference to MTJ cell 200A of FIG. 5A, each MTJ bit of MTJ cell 200D (of FIGS. 9A-9C) may have a write current IW and a critical current IC in the up (direction of arrow) and down (opposite to the direction of the arrow) directions. FIG. 10 illustrates the relationship between the critical currents and write currents of MTJ bits 100A, 100B, 100C of MTJ cell 200D in an exemplary embodiment. In the discussion below, MTJ bits 100A, 100B, and 100C may be referred to as MTJ1, MTJ2, and MTJ3, respectively. As illustrated in FIG. 10, for each of MTJ1, MTJ2, and MTJ3, the write current in the up direction may be greater than the distribution of the critical current (in different bits in a device) in the up direction, respectively, and the magnitude of the write current in the down direction may be greater than the magnitude of the critical current distribution in the down direction, respectively. That is, for MTJ1, IW-1, U>IC-1, U, and |IW-1, D|>|IC-1, D|. For MTJ2, IW-2, U>IC-2, U, and |IW-2,D|>|IC-2, D|. And for MTJ3, IW-3, U>IC-3,U, and |IW-3,D|>|IC-3, D|. The individual MTJ bits of MTJ cell 200D may be configured such that the critical currents (IC, U and IC, D) of MTJ1, MTJ2, and MTJ2 are different. In some embodiments, as illustrated in FIG. 10, IC-3,U>IC-2,U>IC-1,U. Additionally or alternatively, in some embodiments, |IC-3, D|>|IC-2, D|>|IC-1, D|. Similarly, in some embodiments, IW-1, U(|IW-1, D|) is larger than the maximum of critical current IC-1, U(|IC-1, D|) in the distribution of IC-1, U(|IC-1, D|) and smaller than the minimum of critical current of IC-2, U(|IC-2, D|) in the distribution of IC-2, U(|IC-2, D|); and the IW-2, U(|IW-2, D|) is larger than the maximum of critical current IC-2, U(|IC-2, D|) in the distribution of IC-2, U(|IC-2, D|) and smaller than the minimum of critical current of IC-3, U(|IC-3, D|) in the distribution of IC-3, U(|IC-3, D|). This means that the MTJ2 and MTJ3 are not programmed while the MTJ1 is programmed by using write current IW-1, U(|IW-1, D|), and MTJ3 is not programmed while the MTJ2 is programmed by using write current IW-2, U(|IW-2, D|).

As explained with reference to MTJ cell 200A of FIG. 5A, MTJ1, MTJ2, and MTJ3 may each have two resistance states, RMin and RMax, corresponding to their P and AP magnetic states, respectively. When MTJ1 is in the P state, its resistance is R1, Min, and, when in the AP state, its resistance is R1, Max=R1, Min+ΔR1. Similarly, the resistance of MTJ2 in the P and AP states are R2, Min and R2, Max, where R2, Max=R2, Min+ΔR2, and the resistance of MTJ3 in the P and AP state are R3, Min and R3, Max, wherein R3, Max=R3, Min+ΔR3. In embodiments where MTJ1, MTJ2, and MTJ3 are electrically connected in series in MTJ cell 200D, the electrical resistance of MTJ cell 200D is the sum of the resistances of MTJ1, MTJ2, and MTJ3. Since each of these MTJ bits have two resistance states, MTJ cell 200D will have 2³ or eight total resistance states. In some embodiments, these 8 resistance states may be distinct and unique.

TABLE III

The resistance states of MTJ cell 200D of FIG. 9C.

| Resistance State | Magnetic state MTJ$_1$ | MTJ$_2$ | MTJ$_3$ | Resistance Value of MTJ cell 200D |
|---|---|---|---|---|
| State 1 | P | P | P | $R_{1,Min} + R_{2,Min} + R_{3,Min} = R_0$ |
| State 2 | AP | P | P | $R_{1,Max} + R_{2,Min} + R_{3,Min} = R_0 + \Delta R_1$ |
| State 3 | P | AP | P | $R_{1,Min} + R_{2,Max} + R_{3,Min} = R_0 + \Delta R_2$ (e.g. $2\Delta R_1$) |
| State 4 | P | P | AP | $R_{1,Min} + R_{2,Min} + R_{3,Max} = R_0 + \Delta R_3$ (e.g. $4\Delta R_1$) |
| State 5 | AP | AP | P | $R_{1,Max} + R_{2,Max} + R_{3,Min} = R_0 + \Delta R_1 + \Delta R_2$ (e.g. $3\Delta R_1$) |
| State 6 | P | AP | AP | $R_{1,Min} + R_{2,Max} + R_{3,Max} = R_0 + \Delta R_2 + \Delta R_3$ (e.g. $6\Delta R_1$) |
| State 7 | AP | P | AP | $R_{1,Max} + R_{2,Min} + R_{3,Max} = R_0 + \Delta R_1 + \Delta R_3$ (e.g. $5\Delta R_1$) |
| State 8 | AP | AP | AP | $R_{1,Max} + R_{2,Max} + R_{3,Max} = R_0 + \Delta R_1 + \Delta R_2 + \Delta R_3$ (e.g. $7\Delta R_1$) |

Table III above indicates the relationship between the magnetic states of MTJ1, MTJ2, and MTJ3, and the resistance state of MTJ cell 200D. With reference to Table III, when MTJ1, MTJ2, and MTJ3 (of MTJ cell 200D) have a magnetic state identified in columns 2-4 (of Table III), respectively, MTJ cell 200D will have the resistance state identified in column 1, and a resistance value identified in column 5. For example, when MTJ1, MTJ2, and MTJ3 are each in their P magnetic state, MTJ cell 200D will be in resistance state 1. When in this resistance state, a current passing through MTJ cell 200D will register a resistance of R1, Min+R2, Min+R3, Min (which is assumed to have a value R0). Similarly, when MTJ1 is in the AP state, and MTJ2 and MTJ3 are in their P magnetic states (which will be indicated hereinafter as AP, P, P), MTJ cell 200D will be in state 2 and have a resistance of R0+ΔR1. As compared to an MTJ cell having a single MTJ bit (e.g., MTJ bit 100 of FIG. 1) with two resistance states (RMin and RMax), MTJ cell 200D of FIG. 9C includes 8 distinct and unique resistance states, which will increase the amount of data that can be stored in MTJ device 1200.

Although not a requirement, in some embodiments, to make the different resistance states of MTJ cell 200D easily detectable, ΔR1, ΔR2, and ΔR3 will be different (i.e., not the same, or substantially the same, value). In some embodiments, the difference between ΔR1, ΔR2, and ΔR3 may be designed to be substantial. For example, in some embodiments, ΔR3 may be equal to about 1.5 to 2.5 times ΔR2 (e.g., 2×ΔR2), and ΔR3 may be equal to about 3.5 to 4.5 times ΔR1 (e.g., about 4×ΔR1). In embodiments where ΔR3=2×ΔR2=4×ΔR1, the resistance of MTJ cell 200D corresponding to states 1-8 of Table III will be R0, (R0+Δ R1), (R0+2ΔR1), (R0+4ΔR1), (R0+3ΔR1), (R0+6ΔR1), (R0+ 5ΔR1), and (R0+7ΔR1), respectively. However, in embodiments where the technique used to detect the resistance state of MTJ cell 200D does not require a substantial difference between the resistance values of the different states (e.g., self-reference read), the difference between ΔR1, ΔR2, and ΔR3 may not be significant.

As explained previously with reference to MTJ cell 200A of FIG. 5A, data is written in the MTJ device 1200 by selectively switching between the different magnetization states of MTJ cell 200D (e.g., to select one of the resistance states 1-8 of Table III). To switch MTJ1 to AP magnetic state, a current IW-1, U>IC-1, U is applied to MTJ cell 200D, and to switch MTJ1 to the P magnetic state, a current IW-1, D, where |IW-1, D|>|IC-1, D|, is applied to MTJ cell 200D. Since IW-1, U<IC-2, U and IC-3, U (and |IW-1, D|<|IC-2, D| and |IC-3, D|), the magnetic states of MTJ2 and MTJ3 are unaffected by these write currents IW-1, U and IW-1, D. Similarly, to switch MTJ2 to the AP magnetic state, a current IW-2, U>IC-2, U is applied to MTJ cell 200D, and to switch MTJ3 to AP, a current IW-3, U>IC-3, U is applied to MTJ cell 200D. And, to switch MTJ2 and MTJ3 to the P magnetic state, currents IW-2, D and IW-3, D (where |IW-2, D|>|IC-2, D|, and |IW-2, D|>|IC-2, D|) are applied to MTJ cell 200D. However, since IW-2, U>IC-2, U and IC-1, U (and |IW-2, D|>|IC-2, D| and |IC-1, D|), when a current IW-2, U (or IW-2, D) is applied to MTJ cell 200D to write to MTJ2, the states of both MTJ1 and MTJ2 are affected. Therefore, MTJ1 will need to be rewritten back to its initial state via the application of, e.g., IW-1, D. Similarly, when a current IW-3, U or IW-3, D is applied to MTJ cell 200D to write to MTJ3, since IW-3, U>IC-3, U, IC-2, U, and IC-1, U (and |IW-3, D|>|IC-3, D|, and |IC-2, D|, and |IC-1, D|), all MTJ1, MTJ2, and MTJ3 are affected. Therefore, MTJ1 and MTJ2 will need to be rewritten back to their initial states.

Similar to the current patterns or programs (FIGS. 7A-7L) used to switch MTJ cell 200A of FIG. 5A between its different states, current patterns may be used to switch between the eight different resistance states of MTJ cell 200D. In general, to switch MTJ cell 200D from one resistance state to another (for example, from state 1 (P, P, P) to state 3 (P, AP, P)), a write current to switch the magnetic state of the MTJ bit having the highest critical current that needs to be switched is first applied. In this example, the MTJ bit with the highest critical current that needs to be switched is MTJ2 (from P to AP). Therefore, the write current to switch MTJ2 from P to AP (i.e., IW-2, U) is first applied to MTJ cell 200D. This write current will change the state of MTJ2 to P from AP. If the write current also changes the magnetic state of the MTJ bit with a lower critical current than MTJ2 (e.g., MTJ1), and if the changed state is not the final desired state of that MTJ bit, a write current to change the state of that MTJ bit (i.e., MTJ1) to the desired state is then applied. In this example, when write current IW-2, U is applied to switch MTJ2 to AP, MTJ1 is also switched to AP (because IW-2, U>IC-1, U). Since the final desired state of MTJ1 (i.e., the state of MTJ1 in state 3 of MTJ cell 200D) is P, a write current IW-1, D is then applied to MTJ cell 200D to switch MTJ1 back to P. A program or algorithm may generate current patterns to switch between any two states of MTJ cell 200D in a similar manner.

TABLE IV

Exemplary current patterns to switch MTJ cell 200D to different states.

| | Current Pattern or Program | | |
|---|---|---|---|
| State | A | B | C |
| 1 | 1 X $I_{W-1,D}$ | 2 X $I_{W-2,D}$ | 4 X $I_{W-3,D}$ |
| 2 | 1 X $I_{W-1,U}$ | 2 X $(I_{W-2,D}, I_{W-1,U})$ | 4 X $(I_{W-3,D}, I_{W-1,U})$ |
| 3 | 1 X $I_{W-1,D}$ | 2 X $(I_{W-2,U}, I_{W-1,D})$ | 4 X $(I_{W-3,D}, I_{W-2,U}, I_{W-1,D})$ |
| 4 | 1 X $I_{W-1,D}$ | 2 X $I_{W-2,U}$ | 4 X $(I_{W-3,U}, I_{W-2,D})$ |
| 5 | 1 X $I_{W-1,U}$ | 2 X $I_{W-2,U}$ | 4 X $I_{W-3,U}$ |
| 6 | 1 X $I_{W-1,D}$ | 2 X $(I_{W-2,U}, I_{W-1,D})$ | 4 X $(I_{W-3,U}, I_{W-1,D})$ |
| 7 | 1 X $I_{W-1,U}$ | 2 X $(I_{W-2,D}, I_{W-1,U})$ | 4 X $(I_{W-3,U}, I_{W-2,D}, I_{W-1,U})$ |
| 8 | 1 X $I_{W-1,U}$ | 2 X $I_{W-2,U}$ | 4 X $I_{W-3,U}$ |

Table IV lists exemplary current patterns that may be used to switch MTJ cell 200D to its eight different resistance states (from other states). In Table IV, each row indicates the current patterns that may be used to switch MTJ bit 200D at an initial resistance state (not indicated in Table IV) to the resistance state indicated in column 1. The states in Table IV correspond to the states identified in Table III above. As can be seen from Table IV, fourteen different current patterns may be used for the 56 possible transitions (state 1 to state 2, state 2 to state 4, etc.) between the eight resistance states of MTJ cell 200D. Some of these current patterns are the same and may be combined. For example, with reference to row 1 of Table IV, depending upon the initial state of MTJ cell 200D, one of current patterns IW-1, D, IW-2, D, or IW-3, D may be used to switch MTJ cell 200D to state 1 (P, P, P). If MTJ cell 200D is initially in state 2 (AP, P, P), a current pattern of IW-1, D will switch MTJ cell 200D to state 1. If MTJ bit 200D is either in state 3 (P, AP, P) or state 5 (AP, AP, P), a current pattern of IW-2,D will switch MTJ cell 200D to state 1. And, if MTJ cell 200D is initially in one of states 4, 6, 7, or 8, a current pattern of IW-3, D will switch MTJ cell 200D to state 1. That is, among the seven different programs that may be used to switch MTJ cell 200D to state 1 (depending on its initial state), one program will have the current pattern represented by IW-1, D (identified in the column labeled A as 1×IW-1,D), two programs will have the current pattern represented by IW-2, D (identified in the column labeled B as 2×IW-2,D), and four programs will have the current pattern represented by IW-3, D (identified in the column labeled C as 4×IW-3,D).

The current pattern indicated in column C of Table IV will switch MTJ cell 200D to the state indicated in column 1 irrespective of the initial state of MTJ cell 200D. For example, a current pattern represented by IW-3, D (see column C of row 1) will switch MTJ cell 200D to state 1 from any of states 2-8 (i.e., irrespective of whether MTJ cell 200D is in any of states 2-8). Similarly, a current pattern represented by IW-3, D, IW-1, U (see column C of state 2) will switch MTJ cell 200D to state 2 (AP, P, P) irrespective of the initial state MTJ cell 200D. Therefore, to switch MTJ cell 200D to a desired state, the initial state of MTJ cell 200D may first be determined (e.g., by applying a read current), and a current pattern having a magnitude that is just sufficient to switch the MTJ bits of MTJ cell 200D from the determined initial state to the final desired state may be applied. Alternatively, a current pattern (see column C of Table IV) that will switch MTJ cell 200D to the final desired state irrespective of its initial state may be applied.

Figure 11A:
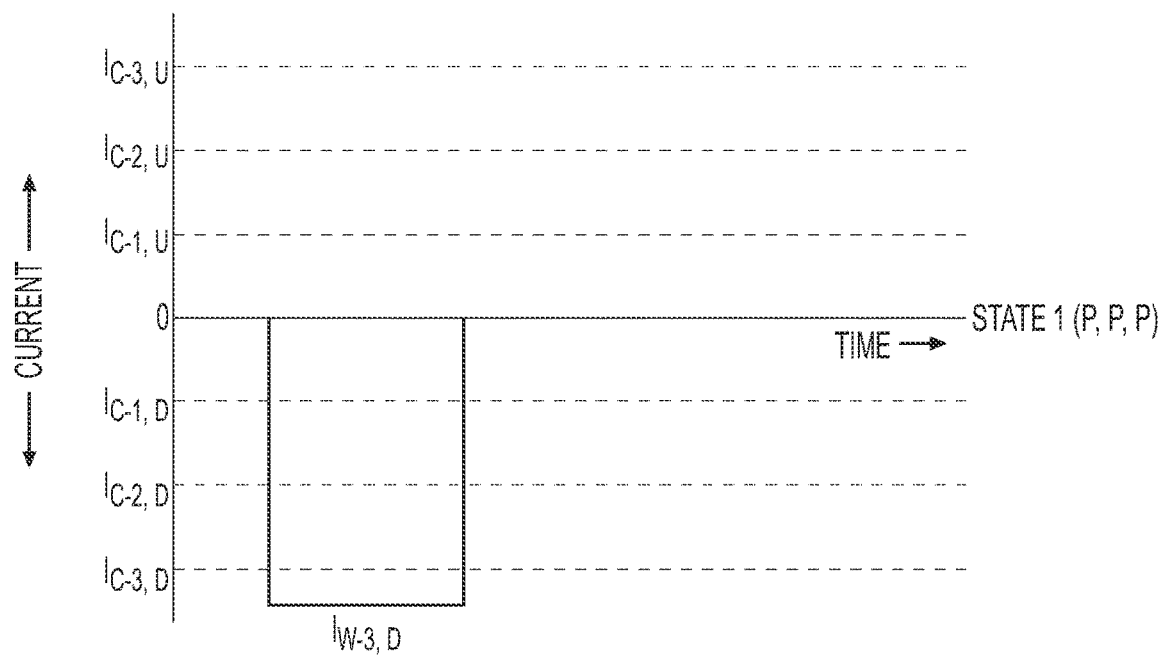
Figure 11B:
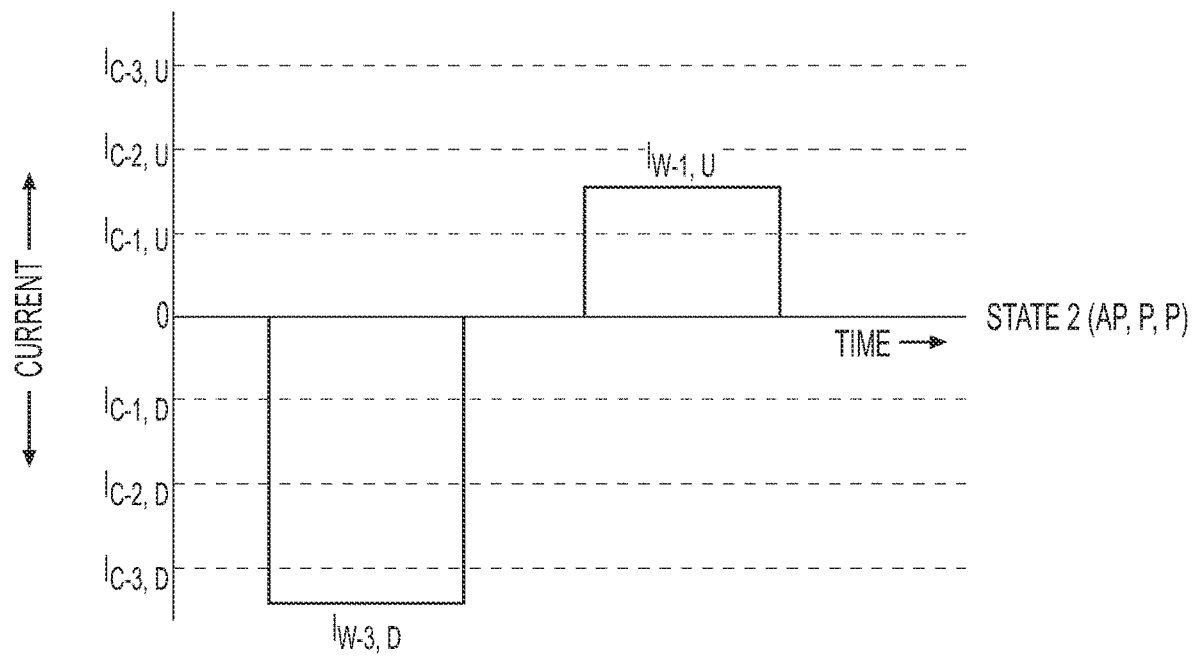
Figure 11C:
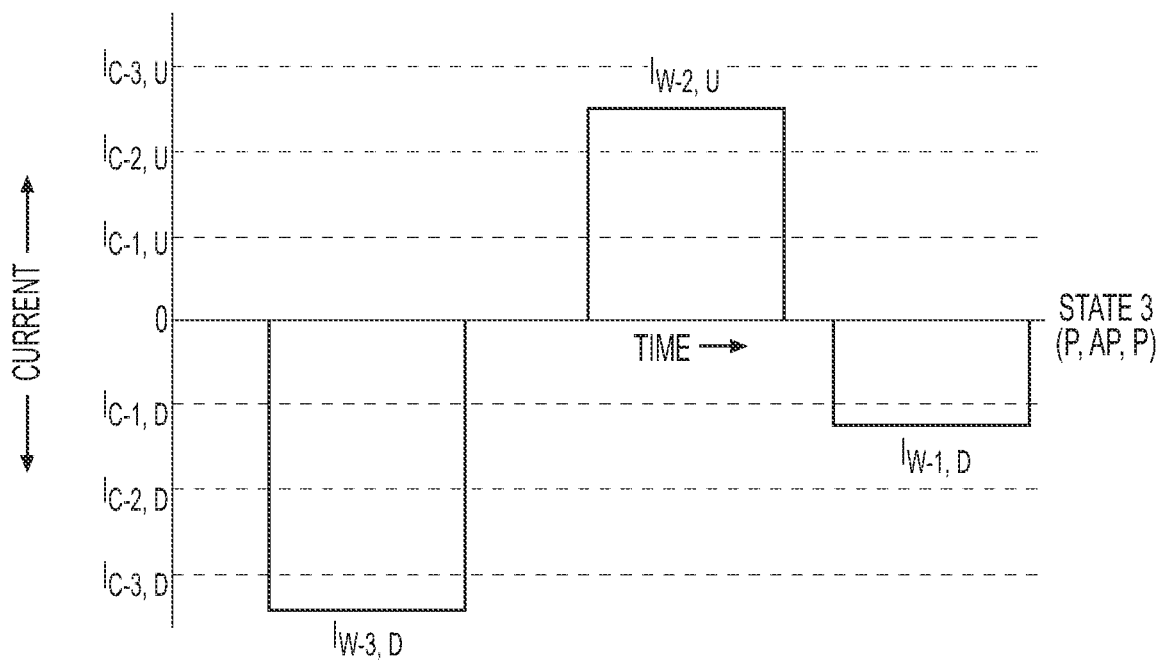
Figure 11D:
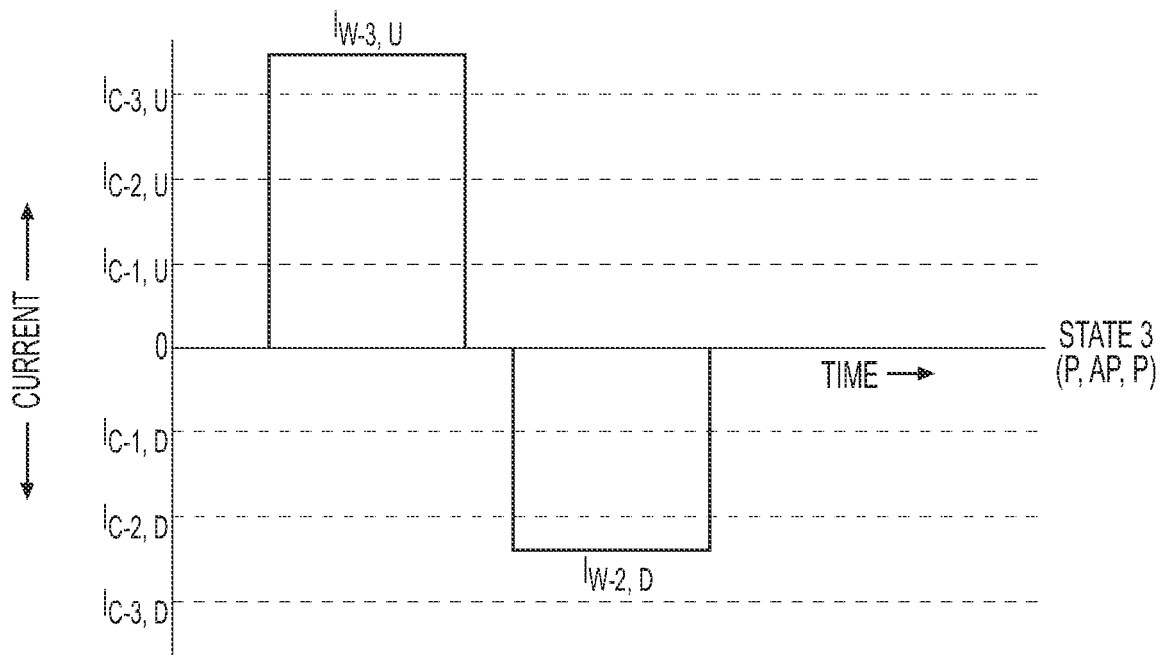
Figure 11E:
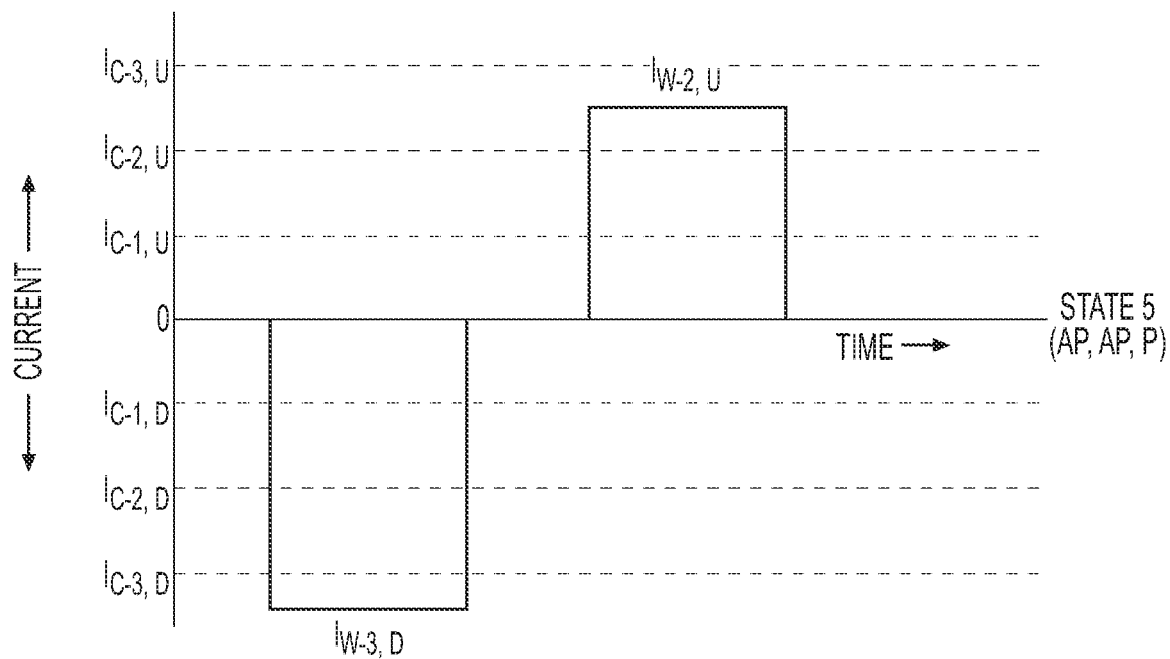
Figure 11F:
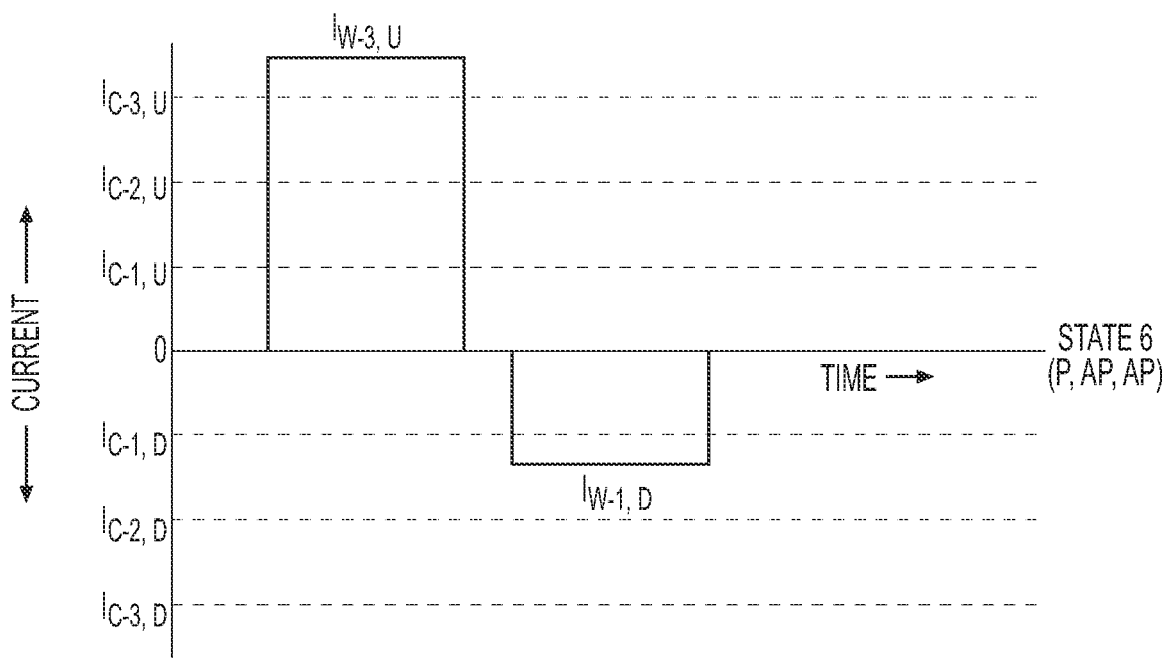
Figure 11G:
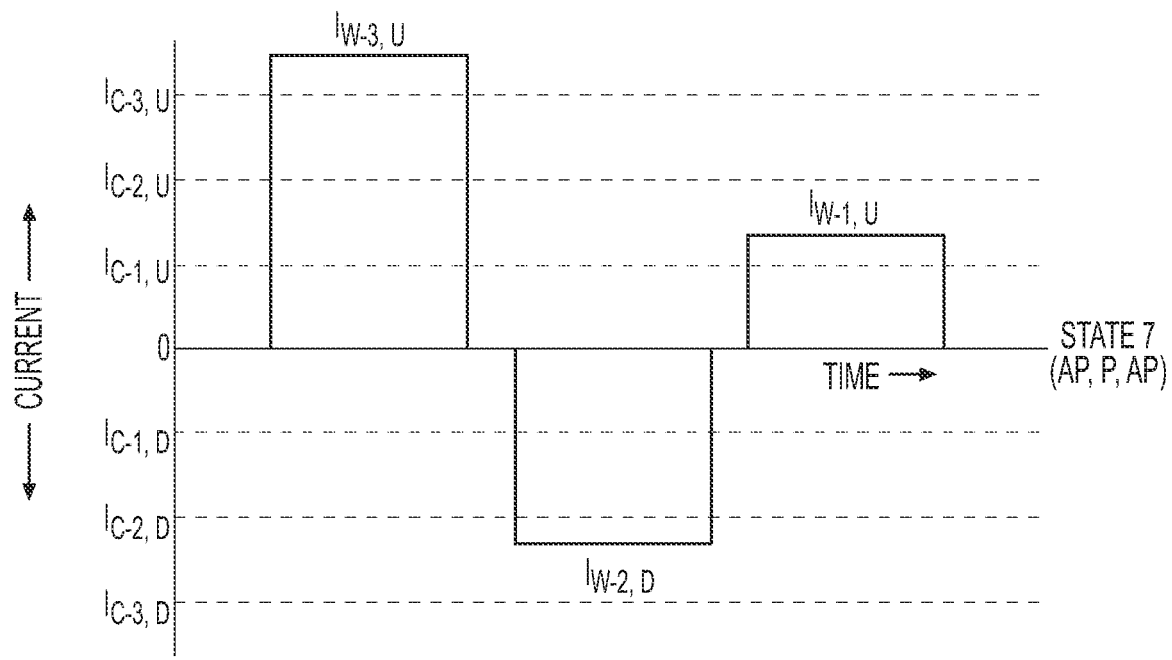
Figure 11H:
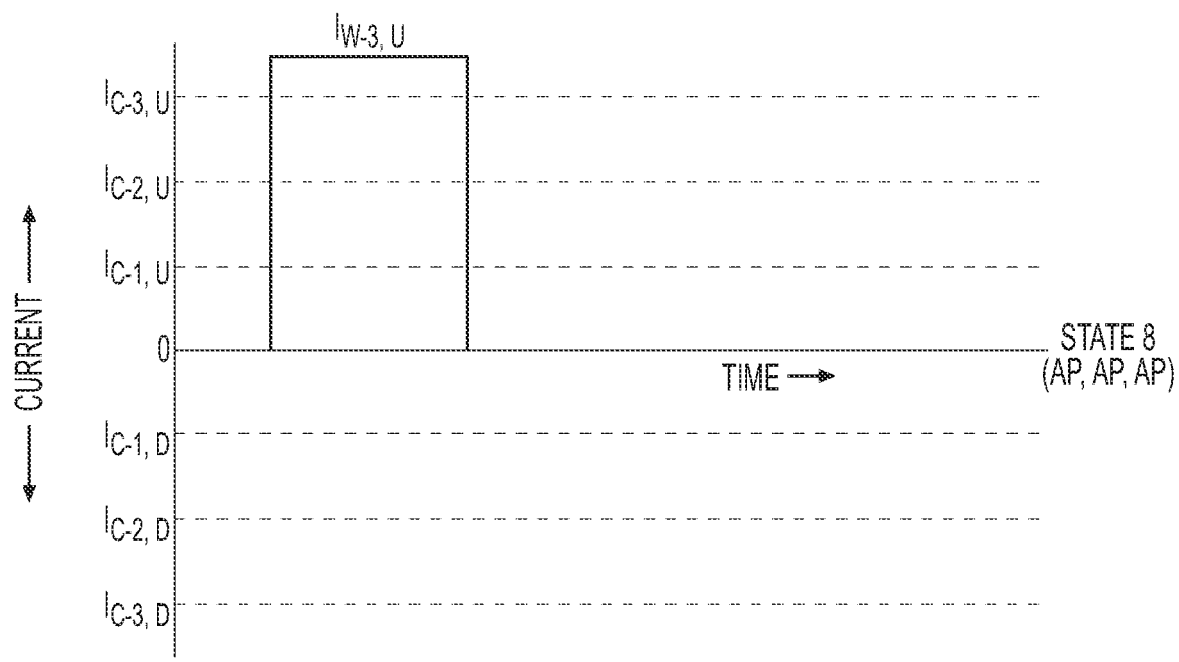

FIGS. 11A-11H are schematic illustrations of the current patterns corresponding to column C of Table IV. For example, FIG. 11A illustrates the current pattern IW-3, D that will switch MTJ 200D to state 1 (P, P, P) irrespective of the initial state of MTJ cell 200D. Since the magnitude of IW-3, D is greater than the magnitude of the critical currents IC-1,D, IC-2,D, and IC-3,D of MTJ1, MTJ2, and MTJ3, respectively, in the down direction, this write current will tend to switch all three MTJ bits to their P states. If any of these MTJ bits are already in the P state (see Table IV), they will be unaffected by this current and will remain the P state. However, if the magnetic state of any of MTJ1, MTJ2, and MTJ3 is AP, current IW-3,D will switch that MTJ bit to the P state. Similarly, FIGS. 11B-11H illustrate the current patterns: IW-3, D, IW-1, U; IW-3, D, IW-2, U, IW-1, D; IW-3, U, IW-2, D; IW-3, D, IW-2, U; IW-3, U, IW-1,D; IW-3, U, IW-2, D, IW-1, U; and IW-3, U that may be used to switch MTJ cell 200D to states 2, 3, 4, 5, 6, 7, and 8, respectively, irrespective of the initial resistance state of MTJ cell 200D.

Any number of MTJ bits (n) may be stacked one on top of another form an MTJ cell of an MTJ device. In some embodiments of the present disclosure, an MTJ cell having n stacked MTJ bits will have 2n total resistance states. In general, in such embodiments, the MTJ bits may be configured such that the 2n resistance states have unique resistance values. In other embodiments, as described in further detail below, an MTJ cell having n stacked MTJ bits will have n+1 total resistance states. FIG. 12A is a schematic illustration of an MTJ device 1300 with an MTJ cell 200E having four vertically stacked MTJ bits 100A, 100B, 100C, and 100D separated from each other by nonmagnetic regions 35 to at least partially magnetically shield or isolate the MTJ bits from each other. And, FIG. 12B is a schematic illustration of an MTJ device 1400 with an MTJ cell 200F having five vertically stacked MTJ bits 100A, 100B, 100C, 100D, and 100E separated from each other by nonmagnetic regions 35. As previously discussed, each vertically stacked MTJ bit of MTJ cell 200E and 200F may have any structure or configuration. Each of these MTJ bits may have two resistance states. For example, in MTJ cell 200E of FIG. 12A: MTJ1 may have resistance states of Rb, Min and R1, Max (=R1, Min+ΔR1); MTJ2 may have resistance states of R2, Min and R2, Max (=R2, Min+ΔR2); MTJ3 may have resistance states of R3, Min and R3, Max (=R3, Min+ΔR3); and MTJ4 may have resistance states of R4, Min and R4, Max (=R4, Min+ΔR4). Although not a requirement, in some embodiments, ΔR1, ΔR2, ΔR3, and ΔR4 may have different values. In some embodiments, the difference in their values may be significant. For example, in some embodiments, ΔR4=about 1.5-2.5 (or about 2) times ΔR3=about 3.5-4.5 (about 4) times ΔR2=about 7.5-8.5 (or about 8) times ΔR1. In embodiments where the stacked MTJ cell 200E is electrically connected in series, MTJ cell 200E may have a total of $2^4$ (=16) resistance states which may be written and read in a similar manner as discussed previously.

With reference to MTJ cell 200F of FIG. 12B, MTJ1 may have resistance states of R1, Min and R1, Max (=R1, Min+ΔR1); MTJ2 may have resistance states of R2, Min and R2, Max (=R2, Min+ΔR2); MTJ3 may have resistance states of R3, Min and R3, Max (=R3, Min+ΔR3); MTJ4 may have resistance states of R4, Min and R4, Max (=R4, Min+ΔR4); and MTJ5 may have resistance states of R5, Min and R5, Max (=R5, Min+ΔR5). In some embodiments, ΔR1, ΔR2, ΔR3, ΔR4, and ΔR5 may have different values. And, in some embodiments, embodiments, ΔR5=about 1.5-2.5 (or about 2) times ΔR4=about 3.5-4.5 (about 4) times ΔR3=about 7.5-8.5 (or about 8) times ΔR2=about 14-18 (or about 16) times ΔR1. MTJ cell 200F with five stacked MTJ bits may have a total of $2^5$ (=32) resistance states having unique resistance values, and which may be written and read as previously described.

Some exemplary methods of fabricating an exemplary MTJ device (e.g., MTJ device 1100) having an exemplary MTJ cell (e.g., MTJ cell 200A of FIG. 5A) will now be described. It should be appreciated that the described methods are merely exemplary. For the sake of brevity, conventional techniques related to semiconductor processing may not be described in detail. The exemplary embodiments may be fabricated using known lithographic processes. The fabrication of integrated circuits, microelectronic devices, micro electro mechanical devices, microfluidic devices, and photonic devices involves the creation of several layers or regions (i.e., comprising one or more layers) of materials that interact in some fashion. One or more of these regions may be patterned so various regions of the layer have different electrical or other characteristics, which may be interconnected within the region or to other regions to create electrical components and circuits. These regions may be created by selectively introducing or removing various materials. The patterns that define such regions are often created by lithographic processes. For example, a layer of photoresist is applied onto a layer overlying a wafer substrate. A photo mask (containing clear and opaque areas) is used to selectively expose the photoresist by a form of radiation, such as ultraviolet light, electrons, or x-rays. Either the photoresist exposed to the radiation, or not exposed to the radiation, is removed by the application of a developer. An etch may then be employed/applied whereby the layer (or material) not protected by the remaining resist is patterned. Alternatively, an additive process can be used in which a structure is built up using the photoresist as a template.

In some embodiments, the disclosed methods may include a number of additional or alternative steps, and in some embodiments, one or more of the described steps may be omitted. Any described step may be omitted or modified, or other steps added, as long as the intended functionality of the fabricated device remains substantially unaltered. Further, although a certain order is described or implied in the described methods, in general, the steps of the described methods need not be performed in the illustrated and described order. Further, the described methods may be incorporated into a more comprehensive procedure or process having additional functionality not described herein.

FIG. 13 depicts a flow chart of an exemplary method 500 of fabricating an exemplary MTJ device 1100, according to the present disclosure. In the discussion below, reference will be made to both FIGS. 5A and 13. A first electrode 10 may be formed on the backend (surface with circuitry) of a semiconductor substrate by any suitable process (step 510). Seed layer 15 may then be formed on or above first electrode 10 (step 520). A first MTJ bit (e.g., MTJ bit 100A) may then be formed on or above seed layer 15 (step 530). Forming the first MTJ bit may include sequentially forming (e.g., depositing, depositing and oxidizing, etc.) the different regions that form the MTJ bit (see FIG. 5B) one on top of another. A magnetic isolation region may be formed on or above the first MTJ bit (step 540). In some embodiments, forming the magnetic isolation region (i.e., step 540) may include depositing one or more electrically conductive materials that magnetically isolate the MTJ bits that are formed on either side of the magnetic isolation region. A second MTJ bit (e.g., MTJ bit 100B) may then be formed on or above the magnetic isolation region (step 550). Similar to step 530, forming the second MTJ bit may include sequentially forming the different regions that form the MTJ bit. Cap layer 25 may then be formed on or above the second MTJ bit (step 560), and second electrode 70 may be formed on or above the cap layer 25 (step 570). For embodiments including more than two MTJ bits, steps 540 and 550 may be repeated as desired.

Any suitable method may be used to form the different regions of the MTJ device 1100. Since suitable integrated circuit fabrication techniques (e.g., deposition, sputtering, evaporation, plating, oxidizing, etc.) that may be used to form the different regions are known to those of ordinary skill in the art, they are not described here in greater detail. In some embodiments, forming some of the regions may involve thin-film deposition processes, including, but not limited to, physical vapor deposition techniques such as ion beam sputtering and magnetron sputtering. And, forming thin insulating layers (e.g., intermediate regions of the MTJ bits) may involve physical vapor deposition from an oxide target, such as by radio-frequency (RF) sputtering, or by deposition of a thin metallic film followed by an oxidation step, such as oxygen plasma oxidation, oxygen radical oxidation, or natural oxidation by exposure to a low-pressure oxygen environment.

In some embodiments, one or more of the magnetic regions of the MTJ bit (e.g., fixed and/or free regions) may be deposited using a "heavy" inert gas (for example, xenon (Xe)), for example, at room temperature (for example, 15-40° C., and more preferably 20-30° C., and most preferably 25° C. (+/−10%)) or a conventional/typical elevated temperature. In some embodiments, formation of some or all of the regions of the MTJ device may also involve other known processing steps such as, for example, selective deposition, photolithography processing, etching, etc., in accordance with any of the various conventional techniques known in the semiconductor industry. In some embodiments, during deposition of the fixed and free regions of the first and second MTJ bits (see steps 530, 550), a magnetic field may be provided to set a preferred easy magnetic axis of the region (e.g., via induced anisotropy). Similarly, a strong magnetic field applied during the post-deposition high-temperature anneal step may be used to induce a preferred easy axis and a preferred pinning direction for any antiferromagnetically pinned materials.

FIG. 14 depicts a flow chart of an exemplary method 1600 that may be used to "read" an MTJ cell (e.g., MTJ cell 200A of FIG. 5A) of an exemplary MTJ device 1100 according to the present disclosure. As discussed previously, the MTJ cell may be "read" by detecting the resistance state (e.g., states 1-4 of Table I) of the MTJ cell. In the discussion below, reference will be made to both FIGS. 5A and 14. The resistance of MTJ cell 200A is detected (step 1610). In some embodiments, the resistance of MTJ cell 200A may be detected by passing a read current through the MTJ cell and detecting the electrical resistance to the flow of current. The resistance state of MTJ cell 200A may then be determined based on the detected resistance (step 1620). In general, any now-known or future-developed technique may be used to determine the resistance state of MTJ cell 200A based on the detected electrical resistance. In some embodiments, the state of MTJ cell 200A may be determined by comparing the detected resistance value of MTJ cell 200A to the resistance of reference MTJ bits at known resistance states. In some embodiments, techniques, such as, for example, self-reference read, mid-point reference read, etc., may be used to determine the resistance state of MTJ cell 200A in step 1620.

FIG. 15 depicts a flow chart of an exemplary method 700 that may be used to "write" to an MTJ cell (e.g., MTJ cell 200A of FIG. 5A) of an exemplary MTJ device 1100 according to the present disclosure. As discussed previously, an MTJ cell may be "written" to by switching the MTJ cell to a desired resistance state (e.g., any of states 1-4 of Table I). In the discussion below, reference will be made to both FIGS. 5A and 15. In some embodiments, the initial resistance state of MTJ cell 200A is first detected (step 710), for example, using method 1600 of FIG. 14. In some embodiments, where the initial resistance state of MTJ cell 200A is known, step 710 may be eliminated. A current pattern that is configured to switch MTJ cell 200A from the detected initial resistance state to the desired final resistance state is then directed through MTJ cell 200A (step 720). For example, if it is desired to switch MTJ cell 200A to state 4 (AP, AP), and the initial resistance state of MTJ cell 200A is state 3 (P, AP), a current pattern IW-1, U (see FIG. 7A) may be directed through MTJ cell 200A to switch MTJ cell 200A from state 3 to state 4. Alternatively, in some embodiments, step 710 may be eliminated, and step 720 may include directing a current pattern that is configured to switch MTJ cell 200A to the desired resistance state from any initial resistance state through MTJ cell 200A. For example, if it is desired to switch MTJ cell 200A to state 4 (AP, AP), a current pattern IW-2, U (see Table II, row 4) may be directed through MTJ cell 200A to switch MTJ cell 200A to state 4 from any initial resistance state.

In some embodiments, it may be preferable to reduce the current required to transition an MTJ cell from an initial state to a final state whenever possible. For example, to reduce exposure of an MTJ cell to high currents whenever possible, it may be preferable to read the initial state of the MTJ cell and then direct just enough current to switch the MTJ cell to the desired final state. For example, for the configuration of MTJ cell 200A illustrated in FIG. 5A, assume that:

$+I_1$=current needed to switch $MTJ_2$ to the AP state (e.g., $I_{W-2, U}=+I_1$);
$-I_1$=current needed to switch $MTJ_2$ to the P state (e.g., $I_{W-2, D}=-I_1$);
$+I_0$=current needed to switch $MTJ_1$ to the AP state (e.g., $I_{W-1, U}=+I_0$); and
$-I_0$=current needed to switch $MTJ_1$ to the P state (e.g., $I_{W-1, D}=-I_0$).

FIG. 16 is an illustration of minimum currents required to transition MTJ cell 200A (as described above) between some of its different states. Unless it is known, the initial state of MTJ cell 200A is first read (for example, using method 1600 of FIG. 14). If the initial state is state 1, and it is desired to switch MTJ cell 200A to state 4, then as illustrated in FIG. 16, a current of +I1 is directed through MTJ cell 200A. Similarly, if the initial state of MTJ cell 200A is state 2, and it is desired to switch MTJ cell 200A to state 1, a current of −I0 is directed through MTJ cell 200A. Table V lists the minimum switching currents (or current patterns) needed to switch MTJ cell 200A between its different states. As shown in Table V, a single current pulse may switch MTJ cell 200A between some of its states (e.g., from state 1 to state 2, state 2 to state 4, etc.). And, to switch between some other states of MTJ cell 200A, a current pattern (having multiple current pulses) may be required. For example, to switch from state 2 to state 3, a current pattern +I1, −I0 (i.e., a current of +I1 followed by a current of −I0) is passed through MTJ cell 200A, and to switch from state 4 to state 2, a current pattern −I1+I0 may be directed through MTJ cell 200A.

TABLE V

Exemplary switching currents to switch between states after pre-read.

| | | Desired final State of MTJ cell 200A | | | |
| --- | --- | --- | --- | --- | --- |
| | | State 1 | State 2 | State 3 | State 4 |
| Initial State of MTJ cell 200A (pre-read) | State 1 | — | $+I_0$ | $+I_1, -I_0$ | $+I_1$ |
| | State 2 | $-I_0$ | — | $+I_1, -I_0$ | $+I_1$ |
| | State 3 | $-I_1$ | $-I_1, +I_0$ | — | $+I_0$ |
| | State 4 | $-I_1$ | $-I_1, +I_0$ | $-I_0$ | — |

Reference will now be made to further embodiments of the present disclosure. Aspects of the embodiments previously described herein may be applicable to aspects of the embodiments described below, and vice versa (e.g., MTJ bit configurations, manufacturing methods, current switching methods, etc.).

FIGS. 17A-17D depict cross sectional, schematic views of further exemplary MTJ bits of the present disclosure. FIG. 17A depicts an MTJ bit 201 having a free region 202 stacked over a fixed region 204, and separated from fixed region 204 by an intermediate region 206. MTJ bit 201 also includes a top electrode 208 and a bottom electrode 210. FIG. 17B depicts a second MTJ bit 220, in which fixed region 204 is stacked above free region 202 with intermediate region 206 disposed therebetween. FIG. 17C depicts yet another MTJ bit 240, including a free region 202 sandwiched between two fixed regions 204, and separated from each of the two fixed regions 204 by an intermediate region 206. FIG. 17D depicts a further MTJ bit 260, in which multiple regions are stacked adjacent to one another to form fixed region 204, followed by an intermediate region 206 above fixed region 204, followed by multiple regions stacked adjacent to one another above intermediate region 206, to form free region 202. These MTJ bits may share characteristics with MTJ bits described elsewhere herein (e.g., FIGS. 1-3). It will be apparent to one of ordinary skill in the art that many more variations of MTJ bits may be suitable for use in the present disclosure without departing from the present disclosure's scope.

As mentioned, in some embodiments, one or both of electrodes 208, 210 of an MTJ bit may be eliminated and/or replaced with an interconnect configured to be in contact with the MTJ bit. In some embodiments, MTJ bits that are stacked adjacent to one another may share electrodes, as described further below.

FIGS. 18A and 18B depict cross sectional, schematic views of an exemplary magnetoresistive cell 300 according to the present disclosure. Cell 300 includes a number of MTJ bits 302, 304, 306, 308. Although the depicted magnetoresistive cell 300 includes four MTJ bits, those of ordinary skill in the art will readily recognize that cell 300 may include a greater or lesser number MTJ bits. For example, cell 300 may include more than two MTJ bits. In the illustrated embodiments, each MTJ bit is separated from the adjacent MTJ bit(s) in the stack by an electrode. In some embodiments, some or all of these electrodes may be eliminated. The bottom of magnetoresistive cell 300 is depicted as being connected to an access transistor 310 and to conductors 312, 314. In some embodiments, conductor 312 may be a word line conductor, and conductor 314 may be a source line conductor. Each electrode above MTJ bits 302, 304, 306 and 308 may be connected to a bit line (e.g., bit lines 303, 305, 307, 309, respectively) via a select device, such as, e.g., a diode (e.g., diodes 311, 313, 315, 317, respectively). The electrode at the top of magnetoresistive cell 300 (e.g., above MTJ bit 308) may be connected to an additional bit line via a select device, such as diode 301. Diode 301 may assist in preventing write disturbance and reducing or eliminating "sneaky" current through the electrode at the tope of magnetoresistive cell 300.

Although cell 300 is depicted as including four MTJ bits 302, 304, 306, 308, cell 300 may include between two and any larger number of MTJ bits. In some embodiments, each MTJ bit is separated from the neighboring MTJ bit(s) by an electrode, to which a bit line may be connected via a diode. In some embodiments, the MTJ bits in cell 300 are identical or approximately identical. While cell 300 is depicted as being made from MTJ bits having the configuration of MTJ bit 201, it is contemplated that a variety of MTJ bit configurations (e.g., MTJ bits 220, 240, 260, MTJ bits 100, 100') may be suitable for use in cell 300. Moreover, each MTJ bit 302, 304, 306, 308 may have the same or different configuration. Diodes 301, 311, 313, 315, 317 (and any additional diodes) may be any suitable type of diode known in the art. For example, diodes according to the current disclosure may be Metal-Insulator-Metal (MIM) diodes.

As depicted in FIG. 18B, a signal 350 may be passed through cell 300 from the topmost electrode, via diode 301, through the bottom-most electrode. In some embodiments, the signal may be a current, such as a read current. In such embodiments, the signal may read or otherwise detect the magnetic state of cell 300. In some embodiments, when a read signal is passed through cell 300, each diode except for a topmost diode (e.g., diode 301) may be set to a high resistance state, to ensure that the read cell passes through every MTJ bit in cell 300. As will be described in further detail below, the magnetic state of cell 300 may be changed using a further signal (e.g., a write current) and setting the diodes 311, 313 315, 317 on bit lines 303, 305, 307, 309, respectively, to either high bias or low bias states.

A single MTJ bit of cell 300 may have two magnetic states. A first, or relatively "high resistance" magnetic state may result when the magnetization vectors of the "fixed" and "free" regions in an MTJ bit are in opposite directions. This relatively "high resistance" state may correspond to a digital "1" when the cell 300 is implemented in a memory configuration or application. A second, or relatively "low resistance" magnetic state may result when the magnetization vectors of the "fixed" and "free" regions in an MTJ bit are in the same direction. This relatively "low resistance" state may correspond to a digital "0" when the stack is implemented in a memory configuration or application. The multi-MTJ bit configuration of magnetoresistive cell 300, where each MTJ bit has the same two resistance states as each other MTJ bit, allows for cell 300 to have n+1 resistance states, where n is the number of MTJ bits in cell 300. As depicted in FIGS. 18A and 18B, cell 300 includes four MTJ bits, and thus has five potential resistance states. (See Table VI of the current disclosure.)

FIGS. 19A-19D depict exemplary cross-sectional schematic views of a magnetoresistive cell 400 according to aspects of the present disclosure. Cell 400 includes three perpendicular MTJ bits 402, 404, 406, each having a fixed layer (e.g., fixed layers 420, 424, 428) and a free layer (e.g., free layers 422, 426, 430). Each MTJ bit is separated from the adjacent MTJ bit(s) in in the stack by an electrode. Magnetoresistive cell 400 is depicted as being connected to an access transistor. Each electrode above MTJ bits 402, 404, 406 is connected to a bit line (e.g., bit lines 403, 405, 407) via a diode (e.g., diodes 411, 413, 415) or other suitable select device.

The magnetic states of each MTJ bit 402, 404, 406 may be programmed by floating or grounding bit lines 403, 405, 407 (or setting them to high bias or low bias states using diodes 411, 413, 415), and running a write signal (e.g., a write current) through magnetoresistive cell 400. As depicted by FIG. 19A, for example, all MTJ bits in cell 400 may be programmed to low resistance states by setting diodes 411, 413, 415 to a high bias state and by running write signal 450 through cell 400 via diode 401. Write signal 450 may be, for example, a write current.

As depicted in FIGS. 19B, 19C, and 19D, MTJ bits 402, 404, 406 may be selectively programmed to low or high resistance states. This may be done, for example, by first programming all MTJ bits in cell 400 to low resistance states, as described with respect to FIG. 19A, and then setting a diode of a selected bit line to a low bias state, setting the diodes of the other bit lines to a high bias state, and running a write signal (e.g., a write current) through cell 400. For example, in FIG. 19B, MTJ bit 402 is programmed to a high resistance state by setting diode 411 to a low bias state, setting diodes 413, 415 to high bias states, and running a write signal 455 through cell 400, e.g., from bit line 403 through the source line. Write signal 455, which may be, e.g., a current, passes through diode 411 and MTJ bit 402, changing the magnetization vector of free region 422. In FIG. 19C, MTJ bits 402 and 404 are programmed to high resistance states by setting diode 413 to a low bias state, setting diodes 411, 415 to high bias states, and running a write signal 460 through cell 400, e.g., from bit line 405 to the source line. Write signal 460, which may be, e.g., a current, passes through diode 413 and MTJ bits 402, 404, changing the magnetization vectors of free regions 422, 426. In FIG. 19D, MTJ bits 402, 404, 406 are programmed to high resistance states by setting diode 415 to a low bias state, setting diodes 411, 413 to high bias states, and running a write signal 465 through cell 400. Write signal 465, which may be, e.g., a current, passes through diode 415 and MTJ bits 402, 404, 406, changing the magnetization vectors of free regions 422, 426, 430.

In some embodiments of the current disclosure, a magnetization stack having n MTJ bits may have n+1 possible resistance states, as depicted by the following table:

TABLE VI

Magnetization stack resistance states

| Number of MTJ bits | Possible Resistance State Combinations (H = high; L = low) | Resistance state count |
| --- | --- | --- |
| 1 | H L | 2 |
| 2 | HH HL LL | 3 |
| 3 | HHH HHL HLL LLL | 4 |
| n | ... | n + 1 |

When implemented in, and/or manufactured as a part of, memory storage devices, such as STT MRAM devices, magnetoresistive stacks according to the present disclosure may advantageously have increased areal storage density with minimal process changes.

FIG. 20 is a flow chart of a method 1500 of fabricating an exemplary magnetoresistive device 600 according to the present disclosure. FIGS. 21A-21J are schematic illustrations of the magnetoresistive device 600 at various stages of the fabrication process. In the description below, reference will be made to FIGS. 20 and 21A-21J. For the sake of brevity, conventional manufacturing techniques related to semiconductor processing may not be described in detail herein.

According to step 1502, layers of materials may be deposited to form regions of the stacked MTJ bits. Any suitable currently-known or future-developed method may be used to form the different regions of the stacked MTJ bits, including methods previously described herein. Since suitable integrated circuit fabrication techniques (e.g., deposition, sputtering, evaporation, plating, etc.) that may be used to form the different regions are known to those of ordinary skill in the art, they are not described here in great detail. In some embodiments, forming some of the regions may involve thin-film deposition processes, including, but not limited to, physical vapor deposition techniques such as ion beam sputtering and magnetron sputtering. Forming thin insulating layers may involve physical vapor deposition from an oxide target, such as by radio-frequency (RF) sputtering, or by deposition of a thin metallic film followed by an oxidation step, such as oxygen plasma oxidation, oxygen radical oxidation, or natural oxidation by exposure to a low-pressure oxygen environment. In some embodiments, formation of some or all of the regions of the stacked MTJ bits may also involve known processing steps such as, for example, selective deposition, photolithography processing, etching, etc., in accordance with any of the various conventional techniques known in the semiconductor industry. In some embodiments, during deposition of the disclosed "fixed" and "free" regions, a magnetic field may be provided to set a preferred easy magnetic axis of the region (e.g., via induced anisotropy). Similarly, a strong magnetic field applied during the post-deposition high-temperature anneal step may be used to induce a preferred easy axis and a preferred pinning direction for any antiferromagnetically pinned materials.

As depicted in FIG. 21A, magnetoresistive regions 602, 604, 606 for MTJ bits may be interspersed with electrode layers 610, 612, 614, 616, over a substrate 601. Substrate 601 may be, for example, an integrated circuit (IC). MTJ bits 602, 604, 606 may have any suitable configuration, e.g., as described with regards to FIG. 1, 3, or 17A-17D of the present disclosure. In some embodiments, substrate 601 may include, for example, interconnects onto which materials for regions may be layered.

According to step 1504, an array of vias may then be formed by etching through the deposited magnetoresistive regions 602, 604, 606 to expose substrate 601. Doing so may pattern the magnetoresistive cells of the present disclosure. FIG. 21B illustrates exemplary vias 620, 622, 624 formed through the deposited layers of magnetoresistive regions 602, 604, 606 and electrodes 610, 612, 614, and 616 to expose the substrate 601. Any suitable etching process may be used to etch the vias 620, 622, 624. For example, in some embodiments, reactive ion etching (RIE) or ion beam etching (IBE) may be used to etch the vias 620, 622, 624. As known to those of ordinary skill in the art, IBE and RIE use beams of charged ions (comprising one or more of Argon, Krypton, Xenon, etc.) (reactive charged ions in the case or RIE) to etch through the multiple layered regions to form the vias 620, 622, 624. As known to those of ordinary skill in the art, in some cases, etching vias may include multiple steps (e.g., photolithography, deposition of a photoresist layer or mask, etc.) that are not described herein. During RIE or IBE, the impact of ions ablade portions of regions (e.g., regions for MTJ bits 602, 604, 606 and electrode layers 610, 612, 614, 616) to form vias 620, 622, 624. During this process, some of the abladed material may redeposit on the sidewalls of vias 620, 622, 624. In some cases, this redeposited layer may affect the electrical and/or magnetic performance of the eventually formed magnetoresistive device (e.g., by forming a conductive path between the various conductive regions in MTJ bits and/or the electrodes). Therefore, in some embodiments, during or after the etching process, any redeposited material may be cleaned or otherwise removed from the sidewalls of vias 620, 622, 624, by using processes, such as, for example, angled etch, isotropic etch, etc. In some embodiments, this cleaning step may be eliminated or performed on only select portions of sidewalls of vias 620, 622, 624. Moreover, in some embodiments, the formation of vias 620, 622, 624 may include multiple alternating etching and cleaning steps to form a complete via and expose substrate 601.

According to step 1506, some portions, but not all, of the sides of the patterned magnetoresistive cells may be etched. For example, only the magnetoresistive portions of each cell may be etched by any now-known (e.g., angled etch) or future-developed process, such that the magnetoresistive portions of each cell are recessed, as depicted in FIG. 21C. According to step 1508, an encapsulant may be deposited over the etched magnetoresistive cells to form a conformal coating over the magnetoresistive bits, as depicted in FIG. 21D. The encapsulant may serve as a dielectric material, and may, in general, include any electrically nonconductive material (such as, for example, silicon nitride, silicon oxide, a low-k ILD material (e.g., carbon doped SiO2, carbon doped oxide, organo silicate glass, spin-on organics, etc.), or combinations thereof). Any suitable process may be used to deposit an encapsulant.

According to step 1510, each stacked MTJ bit may be etched to re-expose the conductive portions of each MTJ bit. Such etching may be achieved by any now-known (e.g., angled etch) or future-developed technique. Non-conductive regions of each MTJ bit may remain coated by an encapsulant, as depicted in FIG. 21E.

According to step 1512, one or more layers of diode materials 627 may be deposited on the exposed conductive regions, as depicted in FIG. 21F. Diode materials 627 may include materials to form, e.g., a MIM diode on each exposed area of the conductive regions. Additionally or alternately, the exposed conductive regions may be oxidized, to form an insulator for a diode (e.g., a MIM diode). Since this step is known to those of ordinary skill in the art, it is not described herein for the sake of brevity.

According to step 1514, alternating conductive and dielectric regions may be deposited in the vias 620, 622, and 624, where each conductive region makes electrical contact with one end (e.g., an electrode at a top end or bottom end) of a stacked MTJ bit via a diode material. FIG. 21G is an illustration of alternating conductive regions 631, 633, 635, 637 and dielectric regions 630, 632, 634 deposited in the vias that were formed according to step 1504. The alternating conductive and dielectric regions may be deposited by any means known in the art, such as, for example, PVD, CVD (e.g., ALD, etc.), plating, or any of the means described with respect to step 1502, or any now-known or future-developed means. In some embodiments, a chemical mechanical polishing step (CMP) may be performed after filling the vias to planarize the top surface of the structure and produce a level surface for subsequent processing (e.g., deposition of additional layers, etc.). The polishing step (or another technique) may serve to remove diode materials 627a deposited on the top surfaces of the conductive regions of the magnetoresistive cells.

The dielectric regions 630, 632, 634 may be made from any now-known or future-developed electrically insulating material (oxide, nitride, carbonitride, etc.). In some embodiments, the electrically insulating material of dielectric regions 630, 632, 634 may include one or more of Silicon Nitride (e.g., Si3N4, SiN, etc.), Silicon Oxide (e.g., SiO2, SiOx, etc.), a low-k ILD material (e.g., carbon doped SiO2 (SiOC), Carbon Doped Oxide (CDO), Organo Silicate Glass (OSG) spin-on organics, etc.), aluminum oxide (such as Al2O3), magnesium oxide (such as MgO), tetraethoxysilane (TEOS), and/or one or more combinations thereof. In some embodiments, each of dielectric regions 630, 632, 634 (and/or other dielectric regions in the device) may include the same or similar material. In other embodiments, at least one of dielectric regions 630, 632, 634 may include a material that is different (e.g., a material that includes a different property or characteristic) from the material of the other dielectric regions. However, this is not a requirement. In some embodiments, one or more of regions 630, 632, 634 may include multiple materials (e.g., deposited one atop another, deposited in different regions, or deposited as a composition etc.). In some embodiments, dielectric regions 630, 632, 634 may be formed of the same material (or material set). That is, dielectric regions 630, 632, 634 may all include, for example, one or more of SiO2, SiN, SiOC, TEOS, etc.

Conductive regions 631, 633, 635, 637 may also be made from any now-known or future-developed conductive material. In some embodiments, one or more of Copper (Cu), Tantalum (Ta), Tantalum Nitride (TaN), Aluminum (Al), Titanium (Ti), Tungsten (W), etc. may be used to form conductive regions 631, 633, 635, 637. In some embodiments, conductive regions 631, 633, 635, 637 may include the same material or material set. For example, each of conductive regions 631, 633, 635, 637 may be formed of one of more of Cu, Ta, TaN, Al, Ti, etc.

According to step 1516, an insulator may be deposited over the top surface of the magnetoresistive structure, followed by a metallic (or other conductive) material, to form a diode structure (e.g., a metal-insulator-metal diode structure) over the top surface of each magnetoresistive stack. FIG. 21H depicts insulator material 629 and metal material 639 deposited over the top surface of device 600. Again, since this step is known to those of ordinary skill in the art, it is not described herein for the sake of brevity.

According to step 1518, an etching process (e.g., a selective etching process) may then be performed to selectively etch the conductive and dielectric regions to expose the conductive regions 612, 614, 616 making electrical contact with one end of each stacked MTJ bit via the diode materials. FIG. 21I is an illustration of a part 650 of magnetoresistive device 600 after selective etching of the conductive and dielectric regions. In some embodiments, these etching steps may include multiple lithographic steps (where, for example, selected areas of the structure are covered and selected areas are exposed) to create a patterned structure, and subjecting this patterned structure to an etching operation (e.g., dry etching (such as, for example, RIE, IBE, etc.), wet etching, etc.) to remove material from the exposed areas. In some embodiments, as illustrated in FIG. 21I, the etching may result in a staircase-like structure (via, e.g., "staircase etching") with selected portions of the individual conductive regions 612, 614, 616 exposed. These exposed areas of conductive regions 612, 614, 616 may then be used as electrical contacts to access the individual MTJ bits via diode materials.

According to step 1520, an electrical connection may be formed between a bit line and each stacked MTJ bit through the diode materials. FIG. 21J is an illustration of part 650 of device 600 after bit contact structures 654, 656, 658, 660 have been formed to make electrical contact with individual MTJ bits in the magnetoresistive stack. Since this step is known to those of ordinary skill in the art, it is not described herein for the sake of brevity.

The fabrication method described above with reference to FIGS. 20 and 21A-21J is only exemplary. Many modifications are possible. For example, some of the above-described steps may be modified, eliminated, or otherwise combined with other steps, whether described or not described herein. It should also be noted that, although not described, the described method(s) may include a number of additional or alternative steps. Any described step may be omitted or modified, or other steps added, as long as the intended functionality of the magnetoresistive device remains substantially unaltered.

Although a certain order is described or implied in the described method(s), in general, the steps of the described method(s) need not be performed in the illustrated and described order. Further, the described method(s) may be incorporated into a process of fabricating a magnetoresistive (e.g., MTJ) device. Since the additional steps needed to form an MTJ device are known to those of ordinary skill in the art, they are not described herein. Additionally, the described method(s) may be incorporated into a more comprehensive procedure or process having additional functionality not described herein.

As alluded to above, the MTJ devices, cells, and stacks of the current disclosure may be implemented in a sensor architecture or a memory architecture (among other architectures). For example, in a memory configuration, the above described MTJ cells with multiple stacked MTJ bits may be electrically connected to an access transistor and configured to couple or connect to various conductors, which may carry one or more control signals, as shown in FIG. 22. The MTJ devices of the current disclosure may be used in any suitable application, including, e.g., in a memory configuration. In such instances, the described MTJ devices may be formed as an integrated circuit comprising a discrete memory device (e.g., as shown in FIG. 23A) or an embedded memory device having a logic therein (e.g., as shown in FIG. 23B), each including MRAM, which, in one embodiment is representative of one or more arrays of MRAM having a plurality of MTJ cells, according to certain aspects of certain embodiments disclosed herein.

Although various embodiments of the present disclosure have been illustrated and described in detail, it will be readily apparent to those skilled in the art that various modifications may be made without departing from the present disclosure or from the scope of the appended claims.

What is claimed is:

1. A magnetic tunnel junction (MTJ) stack, comprising:
a first MTJ bit comprising:
  a first fixed magnetic layer;
  a first free magnetic layer disposed above the first fixed magnetic layer;
  a first ferromagnetic layer disposed above the first free magnetic layer;
  a first intermediate region disposed between the first fixed magnetic layer and the first free magnetic layer; and
  a second intermediate region disposed between the first free magnetic layer and the first ferromagnetic layer; and
a second MTJ bit stacked above the first MTJ bit,
wherein the second MTJ bit comprises:
  the first ferromagnetic layer;
  a second free magnetic layer disposed above the first ferromagnetic layer;
  a third intermediate region disposed between the second free magnetic layer and the first ferromagnetic layer; and
  a fourth intermediate region disposed above the second free magnetic layer, and
wherein a resistance state of the MTJ stack is configured to be read by passing a single read current through both the first MTJ bit and the second MTJ bit.

2. The MTJ stack of claim 1, wherein the first MTJ bit has a critical current different from a critical current of the second MTJ bit.

3. The MTJ stack of claim 1, further comprising:
a third MTJ bit stacked above the second MTJ bit,
wherein the third MTJ bit has a critical current different from a critical current of the second MTJ bit and a critical current of the first MTJ bit.

4. The MTJ stack of claim 1,
wherein the first MTJ bit has a dual spin filter configuration, and
wherein the first MTJ bit has a lower critical current than a critical current of the second MTJ bit.

5. The MTJ stack of claim 3, further comprising:
a nonmagnetic region disposed between the third MTJ bit and the second MTJ bit.

6. The MTJ stack of claim 1, wherein a write current of the second MTJ bit is lower than a critical current of the first MTJ bit.

7. The MTJ stack of claim 1, wherein each of the intermediate regions comprise one or more oxide layers.

8. A magnetic tunnel junction (MTJ) stack, comprising:
a plurality of vertically stacked MTJ bits configured to be read by a single read current, wherein the plurality of vertically stacked MTJ bits includes n MTJ bits, and the MTJ stack has n+1 resistance states;
wherein the plurality of vertically stacked MTJ bits includes a first MTJ bit and a second MTJ bit, and the first MTJ bit comprises:
  a first fixed magnetic layer;
  a first free magnetic layer disposed above the first fixed magnetic layer; and
  a first ferromagnetic layer disposed above the first free magnetic layer;
  a first intermediate region disposed between the first fixed magnetic layer and the first free magnetic layer; and
  a second intermediate region disposed between the first free magnetic layer and the first ferromagnetic layer; and
wherein the second MTJ bit comprises:
  the first ferromagnetic layer;
  a second free magnetic layer, the second free magnetic layer being disposed above the first ferromagnetic layer;
  a third intermediate region disposed between the second free magnetic layer and the first ferromagnetic layer; and
  a fourth intermediate region disposed above the second free magnetic layer.

9. The MTJ stack of claim 8, wherein a write current for each MTJ bit is approximately equal to a write current for each other MTJ bit.

10. The MTJ stack of claim 8, wherein the plurality of vertically stacked MTJ bits comprises at least three MTJ bits.

11. The MTJ stack of claim 8, wherein during a write operation, a write current is configured to pass through a diode in a low bias state and at least one MTJ bit.

12. A method of writing a resistance state to a magnetic tunnel junction (MTJ) stack including a plurality of stacked MTJ bits, the method comprising:
directing a current pattern through every MTJ bit of the plurality of stacked MTJ bits;
detecting a first resistance state of the MTJ stack by applying a read current to the MTJ stack;
switching, using the current pattern, the MTJ stack from the first resistance state to a desired resistance state.

13. The method of claim 12, wherein a write current for each MTJ bit has a magnitude different from a write current for each other MTJ bit, and the switching the MTJ stack comprises switching a resistance state of one MTJ bit without switching all resistance states of all MTJ bits.

14. The method of claim 12, wherein the switching the MTJ stack comprises switching a resistance state of one MTJ bit from antiparallel to parallel, and then from parallel to antiparallel.

15. The method of claim 12, wherein a first MTJ bit of the plurality of stacked MTJ bits has a lower write current than a second MTJ bit of the plurality of stacked MTJ bits, and wherein the switching the MTJ stack comprises switching a resistance state of the first MTJ bit after switching a resistance state of the second MTJ bit.

16. The method of claim 12, wherein the MTJ stack includes at least three MTJ bits and the read current is a second read current, and the method further comprises:

detecting an initial resistance state of the MTJ stack by applying a first read current to the MTJ stack; and
selecting the current pattern based on the detected initial resistance state.

* * * * *